United States Patent
Iwakuma et al.

(10) Patent No.: US 7,939,183 B2
(45) Date of Patent: May 10, 2011

(54) MATERIAL FOR ORGANIC ELECTROLUMINESCENT DEVICE AND ORGANIC ELECTROLUMINESCENT DEVICE USING SAME

(75) Inventors: Toshihiro Iwakuma, Sodegaura (JP); Hisayuki Kawamura, Sodegaura (JP); Hidetsugu Ikeda, Sodegaura (JP); Chishio Hosokawa, Sodegaura (JP); Takashi Arakane, Sodegaura (JP); Hiroaki Nakamura, Sodegaura (JP)

(73) Assignee: Idemitsu Kosan Co., Ltd., Tokyo (JP)

( * ) Notice: Subject to any disclaimer, the term of this patent is extended or adjusted under 35 U.S.C. 154(b) by 1043 days.

(21) Appl. No.: 10/584,262

(22) PCT Filed: Dec. 24, 2004

(86) PCT No.: PCT/JP2004/019727
§ 371 (c)(1),
(2), (4) Date: Jun. 26, 2006

(87) PCT Pub. No.: WO2005/063920
PCT Pub. Date: Jul. 14, 2005

(65) Prior Publication Data
US 2007/0128467 A1    Jun. 7, 2007

(30) Foreign Application Priority Data
Dec. 26, 2003 (JP) .................. 2003-432759

(51) Int. Cl.
    *H01L 51/54* (2006.01)
(52) U.S. Cl. ........ 428/690; 428/917; 313/504; 313/506; 252/301.16; 257/40; 257/103; 257/E51.051; 540/588; 548/440
(58) Field of Classification Search .................. 556/407
    See application file for complete search history.

(56) References Cited

U.S. PATENT DOCUMENTS

| 6,660,410 | B2 * | 12/2003 | Hosokawa ............ 428/690 |
| 2002/0045061 | A1 | 4/2002 | Hosokawa |
| 2002/0048687 | A1 * | 4/2002 | Hosokawa et al. ........ 428/690 |
| 2005/0158578 | A1 * | 7/2005 | Iwakuma et al. ........ 428/690 |

FOREIGN PATENT DOCUMENTS

| JP | 2000 021572 | 1/2000 |
| JP | 2000 186066 | 7/2000 |
| JP | 2001 313179 | 11/2001 |
| JP | 2002 308837 | 10/2002 |
| WO | 01 41512 | 6/2001 |
| WO | 01 72927 | 10/2001 |
| WO | WO 03/080761 A1 * | 10/2003 |

OTHER PUBLICATIONS

Machine translation of JP 2002-308837 A.*
Baldo et al. "Very high-efficiency green organic light-emitting devices based on electrophosphorescence." Applied Physics Letters. 1999. vol. 75, No. 1, pp. 4-6.*
Dieter Hellwinkel, et al., "Zur Frage Des Pentakoordinierten Stickstoffs: Reaktionen von (Spiro)Cyclischen Tetraarylammonium-Salzen Mit Nucleophilen", Liebigs Ann. Chem., vol. 762, 1972, XP-002520921, pp. 29-53.

* cited by examiner

*Primary Examiner* — D. Lawrence Tarazano
*Assistant Examiner* — Michael H Wilson
(74) *Attorney, Agent, or Firm* — Oblon, Spivak, McClelland, Maier & Neustadt, L.L.P.

(57) ABSTRACT

Provided is a material for an organic electroluminescence device, which is composed of a compound having a specific structure; and is capable of providing an organic electroluminescence device having a high luminous efficiency, excellent heat resistance, and a long lifetime while having no pixel defects, and an organic electroluminescence device using the same. The organic electroluminescence device comprises an organic thin film layer composed of one or more layers including at least a light-emitting layer and sandwiched between a cathode and an anode. In the organic electroluminescence device, at least one layer of the organic thin film layer comprises the material for an organic electroluminescence device.

13 Claims, No Drawings

MATERIAL FOR ORGANIC ELECTROLUMINESCENT DEVICE AND ORGANIC ELECTROLUMINESCENT DEVICE USING SAME

TECHNICAL FIELD

The present invention relates to a material for an organic electroluminescence device and an organic electroluminescence device (organic EL device) using the same. More specifically, the present invention relates to a material for an organic EL device and an organic EL device each having a high luminous efficiency, excellent heat resistance, and a long lifetime while having no pixel defects.

BACKGROUND ART

An organic EL device is a spontaneous light-emitting device which utilizes the principle that a fluorescent substance emits light by energy of recombination of holes injected from an anode and electrons injected from a cathode when an electric field is applied.

Since an organic EL device of the laminate type driven under a low electric voltage was reported by C. W. Tang of Eastman Kodak Company (C. W. Tang and S. A. Vanslyke, Applied Physics Letters, Volume 51, Pages 913, 1987), many studies have been conducted on the organic EL device using organic materials as the constituting materials.

Tang et al. used tris(8-hydroxyquinolinol)aluminum for the light-emitting layer and a triphenyldiamine derivative for the hole transporting layer.

Advantages of the laminate structure include that the efficiency of hole injection into the light-emitting layer can be increased, that the efficiency of forming excitons which are formed by blocking and recombining electrons injected from the cathode can be increased, and that excitons formed among the light-emitting layer can be enclosed.

As the device structure of the organic EL device, a two-layered structure having a hole transporting (injecting) layer and an electron transporting and light-emitting layer and a three-layered structure having a hole transporting (injecting) layer, a light-emitting layer and an electron transporting (injecting) layer are well known.

To increase the efficiency of recombination of injected holes and electrons in the device of the laminate type, the structures of the device and the process for forming the device have been devised.

As the light-emitting material of the organic EL device, chelate complexes such as tris(8-quinolinolato)aluminum complexes, coumarine derivatives, tetraphenylbutadiene derivatives, bisstyrylarylene derivatives and oxadiazole derivatives are known. It is reported that light in the visible region ranging from blue light to red light can be obtained by using these light-emitting materials, and development of a device exhibiting color images is expected (see, for example, Patent Document 1 and Patent Document 2).

It is recently proposed that a phosphorescent material is used in the light-emitting layer of an organic EL device other than a fluorescent material (see, for example, Non-Patent Document 1 and Non-Patent Document 2).

As described above, a great efficiency of light emission is achieved by utilizing an organic phosphorescent material excited to the singlet state and the triplet state in the light-emitting layer of an organic EL device.

It is considered that singlet excimers and triplet excimers are formed in relative amounts of 1:3 due to the difference in the multiplicity of spin when electrons and holes are recombined in an organic EL device. Therefore, it is expected that an efficiency of light emission 3 to 4 times as great as that of a device utilizing fluorescence alone can be achieved by utilizing a phosphorescent light-emitting material.

Such organic EL device has used a constitution in which layers such as an anode, a hole-transporting layer, an organic light-emitting layer, an electron-transporting layer (hole-blocking layer), an electron-injecting layer, and a cathode are sequentially laminated in such a manner that an excited state of a triplet or an exciton of the triplet does not quench. Each of a host compound and a phosphorescent compound has been used in the organic light-emitting layer (see, for example, Patent Document 3 and Patent Document 4).

In those patent documents, 4,4-N,Ndicarbazole biphenyl has been used as a host compound. However, the compound has a glass transition temperature of 110° C. or lower. Furthermore, the compound has so good symmetry that the compound is apt to crystallize. In addition, the compound has a problem in that a short circuit or a pixel defect occurs when a device is subjected to a heat test.

Furthermore, the following has been found: upon vapor deposition of the compound, crystal growth occurs at, for example, a site where foreign matter or a projection of an electrode is present, so a larger number of defects occur than the number in an initial state before the heat test starts, and the number increases with time.

Patent Document 1: JP 08-239655 A
Patent Document 2: JP 07-138561 A
Patent Document 3: U.S. Pat. No. 6,097,147
Patent Document 4: WO 01/41512
Non-Patent Document 1: D. F. O'Brien and M. A. Baldo et al., "Improved energy transfer in electrophosphorescent devices", Applied Physics letters, Vol. 74, No. 3, pp 442 to 444, Jan. 18, 1999
Non-Patent Document 2: M. A. Baldo et al., "Very high-efficiency green organic light-emitting devices based on electrophosphorescence", Applied Physics Letters, Vol. 75, No. 1, pp 4 to 6, Jul. 5, 1999

DISCLOSURE OF THE INVENTION

The present invention has been made with a view to solving the above problems, and an object of the present invention is to provide a material for an organic EL device having a high luminous efficiency, excellent heat resistance, and a long lifetime while having no pixel defects and an organic EL device using the same.

The inventors of the present invention have made extensive studies with a view to solving the above problems. As a result, they have found that the use of a compound having a large molecular weight and low symmetry as a host material achieves the above object, thereby completing the present invention.

That is, the present invention provides a material for an organic EL device, which is composed of a compound, represented by the following general formula (1).

1. A material for an organic EL device comprising a compound represented by the following general formula (1)

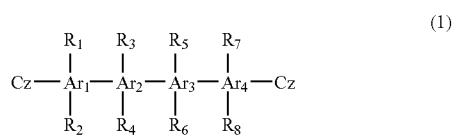

wherein Ar₁ to Ar₄ each represent a benzene residue, $R_1$ to $R_8$ each independently represent a hydrogen atom, a substituted or unsubstituted alkyl group having 1 to 40 carbon atoms, a substituted or unsubstituted aromatic heterocyclic group having 5 to 40 ring atoms, a substituted or unsubstituted alkoxy group having 1 to 40 carbon atoms, a substituted or unsubstituted aromatic hydrocarbon group having 6 to 40 ring carbon atoms, a substituted or unsubstituted aryloxy group having 6 to 40 carbon atoms, a substituted or unsubstituted aralkyl group having 7 to 40 carbon atoms, a substituted or unsubstituted alkenyl group having 2 to 40 carbon atoms, a substituted or unsubstituted alkylamino group having 1 to 40 carbon atoms, a substituted or unsubstituted arylamino group having 6 to 40 carbon atoms, a substituted or unsubstituted aralkylamino group having 7 to 40 carbon atoms, or a group represented by Cz below, and when each of $R_1$ to $R_8$ bond to its adjacent carbon atom, each of $R_1$ to $R_8$ and its adjacent carbon atom may bond to each other to form a saturated or unsaturated cyclic structure;

Cz represents a group expressed by the following general formula (2a) or (2b)

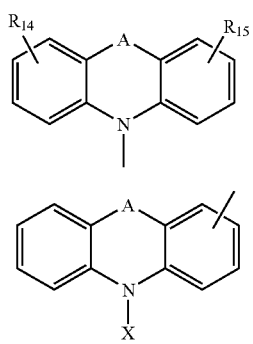

wherein A represents a single bond, —(CR₉R₁₀)ₙ—, —(SiR₁₁R₁₂)ₙ—, —NR₁₃—, —O—, or —S—, n represents an integer of 1 to 3, $R_9$ to $R_{15}$ each independently represent a hydrogen atom, a substituted or unsubstituted alkyl group having 1 to 40 carbon atoms, a substituted or unsubstituted heterocyclic group having 3 to 40 ring atoms, a substituted or unsubstituted alkoxy group having 1 to 40 carbon atoms, a substituted or unsubstituted aromatic hydrocarbon group having 6 to 40 ring carbon atoms, a substituted or unsubstituted aryloxy group having 6 to 40 carbon atoms, a substituted or unsubstituted aralkyl group having 7 to 40 carbon atoms, a substituted or unsubstituted alkenyl group having 2 to 40 carbon atoms, a substituted or unsubstituted alkylamino group having 1 to 40 carbon atoms, a substituted or unsubstituted arylamino group having 6 to 40 carbon atoms, or a substituted or unsubstituted aralkylamino group having 7 to 40 carbon atoms; and a couple of $R_9$ and $R_{10}$ or a couple of $R_{11}$ and $R_{12}$ may bond each other to form a saturated or unsaturated cyclic structure;

X represents a substituted or unsubstituted alkyl group having 1 to 40 carbon atoms, a substituted or unsubstituted aromatic heterocyclic group having 5 to 40 ring atoms, a substituted or unsubstituted alkoxy group having 1 to 40 carbon atoms, a substituted or unsubstituted aromatic hydrocarbon group having 6 to 40 ring carbon atoms, a substituted or unsubstituted aryloxy group having 6 to 40 carbon atoms, a substituted or unsubstituted aralkyl group having 7 to 40 carbon atoms, a substituted or unsubstituted alkenyl group having 2 to 40 carbon atoms, a substituted or unsubstituted alkylamino group having 1 to 40 carbon atoms, a substituted or unsubstituted arylamino group having 6 to 40 carbon atoms, or a substituted or unsubstituted aralkylamino group having 7 to 40 carbon atoms;

provided that, when at least one of Ar₁ to Ar₄ represents m-phenylene or o-phenylene, or when all of Ar₁ to Ar₄ each represent p-phenylene in the general formula (1), at least one of $R_1$ to $R_8$ represents a substituted or unsubstituted aromatic hydrocarbon group having 6 to 40 ring carbon atoms, or the above group represented by Cz;

2. A material for an organic EL device according to the above item 1, in which Ar₂ and Ar₃ each independently represent m-phenylene or o-phenylene, and Ar₁ and Ar₄ each represent p-phenylene in the general formula (1);

3. A material for an organic EL device according to the above item 1, in which Ar₁ and Ar₄ each independently represent m-phenylene or o-phenylene, and Ar₂ and Ar₃ each represent p-phenylene in the general formula (1);

4. A material for an organic EL device according to the above item 1, in which Ar₁ and Ar₄ each independently represent m-phenylene, and $R_1$ or $R_7$ represents a substituted or unsubstituted aromatic hydrocarbon group having 6 to 40 ring carbon atoms, or the group represented by Cz in the general formula (1);

5. A material for an organic EL device according to the above item 1, in which the group represented by Cz in the general formula (1) is a substituted or unsubstituted carbazolyl group, or a substituted or unsubstituted 9-phenylcarbazolyl group;

6. A material for an organic EL device according to the above item 1, in which the compound represented by the general formula (1) is a host material for an organic EL device;

7. An organic EL device comprising an organic thin film layer composed of one or more layers including at least a light-emitting layer being sandwiched between a cathode and an anode, in which at least one layer of the organic thin film layer comprises the material for an organic EL device according to any one of the above items 1 to 6;

8. An organic EL device according to the above item 7, in which the light-emitting layer comprises the material for an organic EL device as a host material;

9. An organic EL device according to the above item 8, in which the light-emitting layer is composed of the host material and a phosphorescent metal complex;

10. An organic EL device according to the above item 7, in which a reducing dopant is added to an interfacial region between the cathode and the organic thin film layer; and 11. An organic EL device according to the above item 7, further comprising an electron-injecting layer between the light-emitting layer and the cathode, wherein the electron-injecting layer has a nitrogen-containing derivative as an essential component.

INDUSTRIAL APPLICABILITY

The use of the material for an organic EL device of the present invention which is composed of the compound represented by the general formula (1) provides an organic EL device having a high luminous efficiency, excellent heat resistance, and a long lifetime while having no pixel defects. Accordingly, the organic EL device of the present invention is extremely useful as, for example, a light source for any one of various electronic instruments.

BEST MODE FOR CARRYING OUT THE INVENTION

A material for an organic EL device of the present invention is composed of a compound represented by the following general formula (1):

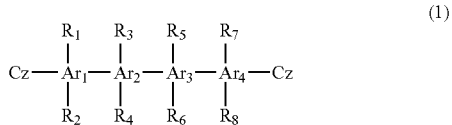

wherein $Ar_1$ to $Ar_4$ each represent a benzene residue;

$R_1$ to $R_8$ each independently represent a hydrogen atom, a substituted or unsubstituted alkyl group having 1 to 40 carbon atoms, a substituted or unsubstituted aromatic heterocyclic group having 5 to 40 ring atoms, a substituted or unsubstituted alkoxy group having 1 to 40 carbon atoms, a substituted or unsubstituted aromatic hydrocarbon group having 6 to 40 ring carbon atoms, a substituted or unsubstituted aryloxy group having 6 to 40 carbon atoms, a substituted or unsubstituted aralkyl group having 7 to 40 carbon atoms, a substituted or unsubstituted alkenyl group having 2 to 40 carbon atoms, a substituted or unsubstituted alkylamino group having 1 to 40 carbon atoms, a substituted or unsubstituted arylamino group having 6 to 40 carbon atoms, a substituted or unsubstituted aralkylamino group having 7 to 40 carbon atoms, or a group represented by Cz below, and when each of $R_1$ to $R_8$ bond to its adjacent carbon atom, each of $R_1$ to $R_8$ and its adjacent carbon atom may bond each other to form a saturated or unsaturated cyclic structure;

Cz represents a group expressed by the following general formula (2a) or (2b):

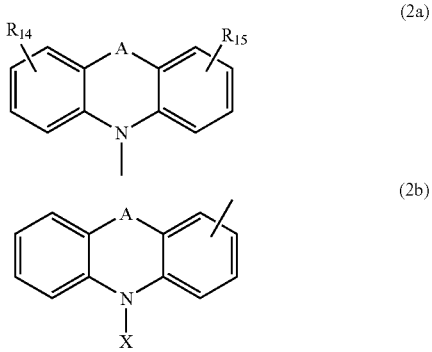

wherein A represents a single bond, $-(CR_9R_{10})_n-$, $-(SiR_{11}R_{12})_n-$, $-NR_{13}-$, $-O-$, or $-S-$, and n represents an integer of 1 to 3. $R_9$ to $R_{15}$ each independently represent a hydrogen atom, a substituted or unsubstituted alkyl group having 1 to 40 carbon atoms, a substituted or unsubstituted heterocyclic group having 3 to 40 ring atoms, a substituted or unsubstituted alkoxy group having 1 to 40 carbon atoms, a substituted or unsubstituted aromatic hydrocarbon group having 6 to 40 ring carbon atoms, a substituted or unsubstituted aryloxy group having 6 to 40 carbon atoms, a substituted or unsubstituted aralkyl group having 7 to 40 carbon atoms, a substituted or unsubstituted alkenyl group having 2 to 40 carbon atoms, a substituted or unsubstituted alkylamino group having 1 to 40 carbon atoms, a substituted or unsubstituted arylamino group having 6 to 40 carbon atoms, or a substituted or unsubstituted aralkylamino group having 7 to 40 carbon atoms; and a couple of $R_9$ and $R_{10}$ or a couple of $R_{11}$ and $R_{12}$ may bond each other to form a saturated or unsaturated cyclic structure;

X represents a substituted or unsubstituted alkyl group having 1 to 40 carbon atoms, a substituted or unsubstituted aromatic heterocyclic group having 5 to 40 ring atoms, a substituted or unsubstituted alkoxy group having 1 to 40 carbon atoms, a substituted or unsubstituted aromatic hydrocarbon group having 6 to 40 ring carbon atoms, a substituted or unsubstituted aryloxy group having 6 to 40 carbon atoms, a substituted or unsubstituted aralkyl group having 7 to 40 carbon atoms, a substituted or unsubstituted alkenyl group having 2 to 40 carbon atoms, a substituted or unsubstituted alkylamino group having 1 to 40 carbon atoms, a substituted or unsubstituted arylamino group having 6 to 40 carbon atoms, or a substituted or unsubstituted aralkylamino group having 7 to 40 carbon atoms;

provided that, when at least one of $Ar_1$ to $Ar_4$ represents m-phenylene or o-phenylene, or all of $Ar_1$ to $Ar_4$ each represent p-phenylene in the general formula (1), at least one of $R_1$ to $R_8$ represents a substituted or unsubstituted aromatic hydrocarbon group having 6 to 40 ring carbon atoms, or the above group represented by Cz.

The substituted or unsubstituted alkoxy group having 1 to 40 carbon atoms which is represented by each of $R_1$ to $R_8$ in the general formula (1), $R_9$ to $R_{15}$ and X in the general formulae (2a) and (2b) is preferably a substituted or unsubstituted alkyl group having 1 to 30 carbon atoms.

Examples of the alkyl group include a methyl group, ethyl group, propyl group, isopropyl group, n-butyl group, s-butyl group, isobutyl group, t-butyl group, n-pentyl group, n-hexyl group, n-heptyl group, n-octyl group, n-nonyl group, n-decyl group, n-undecyl group, n-dodecyl group, n-tridecyl group, n-tetradecyl group, n-pentadecyl group, n-hexdecyl group, n-heptadecyl group, n-octadecyl group, neopentyl group, 1-methylpentyl group, 2-methylpentyl group, 1-pentylhexyl group, 1-butylpentyl group, 1-heptyloctyl group, 3-methylpentyl group, hydroxymethyl group, 1-hydroxyethyl group, 2-hydroxyethyl group, 2-hydroxyisobutyl group, 1,2-dihydroxyethyl group, 1,3-dihydroxyisopropyl group, 2,3-dihydroxy-t-butyl group, 1,2,3-trihydroxypropyl group, chloromethyl group, 1-chloroethyl group, 2-chloroethyl group, 2-chloroisobutyl group, 1,2-dichloroethyl group, 1,3-dichloroisopropyl group, 2,3-dichloro-t-butyl group, 1,2,3-trichloropropyl group, bromomethyl group, 1-bromoethyl group, 2-bromoethyl group, 2-bromoisobutyl group, 1,2-dibromoethyl group, 1,3-dibromoisopropyl group, 2,3-dibromo-t-butyl group, 1,2,3-tribromopropyl group, iodomethyl group, 1-iodoethyl group, 2-iodoethyl group, 2-iodoisobutyl group, 1,2-diiodoethyl group, 1,3-diiodoisopropyl group, 2,3-diiodo-t-butyl group, 1,2,3-triiodopropyl group, aminomethyl group, 1-aminoethyl group, 2-aminoethyl group, 2-aminoisobutyl group, 1,2-diaminoethyl group, 1,3-diaminoisopropyl group, 2,3-diamino-t-butyl group, 1,2,3-triaminopropyl group, cyanomethyl group, 1-cyanoethyl group, 2-cyanoethyl group, 2-cyanoisobutyl group, 1,2-dicyanoethyl group, 1,3-dicyanoisopropyl group, 2,3-dicyano-t-butyl group, 1,2,3-tricyanopropyl group, nitromethyl group, 1-nitroethyl group, 2-nitroethyl group, 1,2-dinitroethyl group, 2,3-dinitro-t-butyl group, 1,2,3-trinitropropyl group, cyclopentyl group, cyclohexyl group, cyclooctyl group, and 3,5-tetramethylcyclohexyl group.

Of those, a methyl group, ethyl group, propyl group, isopropyl group, n-butyl group, s-butyl group, isobutyl group, t-butyl group, n-pentyl group, n-hexyl group, n-heptyl group, n-octyl group, n-nonyl group, n-decyl group, n-undecyl group, n-dodecyl group, n-tridecyl group, n-tetradecyl group, n-pentadecyl group, n-hexadecyl group, n-heptadecyl group, n-octadecyl group, neopentyl group, 1-methylpentyl group, 1-pentylhexyl group, 1-butylpentyl group, 1-heptyloctyl group, cyclohexyl group, cyclooctyl group, 3,5-tetramethyl-cyclohexyl group, and the like are preferable.

The substituted or unsubstituted heterocyclic group having 3 to 40 ring atoms which is represented by each of $R_1$ to $R_8$ in the general formula (1), $R_9$ to $R_{15}$ and X in the general formulae (2a) and (2b) is preferably a substituted or unsubstituted heterocyclic group having 5 to 20 ring atoms.

Examples of the heterocyclic group include 1-pyrrolyl group, 2-pyrrolyl group, 3-pyrrolyl group, pyrazinyl group, 2-pyridinyl group, 1-imidazolyl group, 2-imidazolyl group, 1-pyrazolyl group, 1-indolidinyl group, 2-indolidinyl group, 3-indolidinyl group, 5-indolidinyl group, 6-indolidinyl group, 7-indolidinyl group, 8-indolidinyl group, 2-imidazopyridinyl group, 3-imidazopyridinyl group, 5-imidazopyridinyl group, 6-imidazopyridinyl group, 7-imidazopyridinyl group, 8-imidazopyridinyl group, 3-pyridinyl group, 4-pyridinyl group, 1-indolyl group, 2-indolyl group, 3-indolyl group, 4-indolyl group, 5-indolyl group, 6-indolyl group, 7-indolyl group, 1-isoindolyl group, 2-isoindolyl group, 3-isoindolyl group, 4-isoindolyl group, 5-isoindolyl group, 6-isoindolyl group, 7-isoindolyl group, 2-furyl group, 3-furyl group, 2-benzofuranyl group, 3-benzofuranyl group, 4-benzofuranyl group, 5-benzofuranyl group, 6-benzofuranyl group, 7-benzofuranyl group, 1-isobenzofuranyl group, 3-isobenzofuranyl group, 4-isobenzofuranyl group, 5-isobenzofuranyl group, 6-isobenzofuranyl group, 7-isobenzofuranyl group, 2-quinolyl group, 3-quinolyl group, 4-quinolyl group, 5-quinolyl group, 6-quinolyl group, 7-quinolyl group, 8-quinolyl group, 1-isoquinolyl group, 3-isoquinolyl group, 4-isoquinolyl group, 5-isoquinolyl group, 6-isoquinolyl group, 7-isoquinolyl group, 8-isoquinolyl group, 2-quinoxalinyl group, 5-quinoxalinyl group, 6-quinoxalinyl group, 1-carbazolyl group, 2-carbazolyl group, 3-carbazolyl group, 4-carbazolyl group, 9-carbazolyl group, β-carbolin-1-yl group, β-carbolin-3-yl group, β-carbolin-4-yl group, β-carbolin-5-yl group, β-carbolin-6-yl group, β-carbolin-7-yl group, β-carbolin-6-yl group, β-carbolin-9-yl group, 1-phenanthridinyl group, 2-phenanthridinyl group, 3-phenanthridinyl group, 4-phenanthridinyl group, 6-phenanthridinyl group, 7-phenanthridinyl group, 8-phenanthridinyl group, 9-phenanthridinyl group, 10-phenanthridinyl group, 1-acridinyl group, 2-acridinyl group, 3-acridinyl group, 4-acridinyl group, 9-acridinyl group, 1,7-phenanthrolin-2-yl group, 1,7-phenanthrolin-3-yl group, 1,7-phenanthrolin-4-yl group, 1,7-phenanthrolin-5-yl group, 1,7-phenanthrolin-6-yl group, 1,7-phenanthrolin-8-yl group, 1,7-phenanthrolin-9-yl group, 1,7-phenanthrolin-10-yl group, 1,8-phenanthrolin-2-yl group, 1,8-phenanthrolin-3-yl group, 1,8-phenanthrolin-4-yl group, 1,8-phenanthrolin-5-yl group, 1,8-phenanthrolin-6-yl group, 1,8-phenanthrolin-7-yl group, 1,8-phenanthrolin-9-yl group, 1,8-phenanthrolin-10-yl group, 1,9-phenanthrolin-2-yl group, 1,9-phenanthrolin-3-yl group, 1,9-phenanthrolin-4-yl group, 1,9-phenanthrolin-5-yl group, 1,9-phenanthrolin-6-yl group, 1,9-phenanthrolin-7-yl group, 1,9-phenanthrolin-8-yl group, 1,9-phenanthrolin-10-yl group, 1,10-phenanthrolin-2-yl group, 1,10-phenanthrolin-3-yl group, 1,10-phenanthrolin-4-yl group, 1,10-phenanthrolin-5-yl group, 2,9-phenanthrolin-1-yl group, 2,9-phenanthrolin-3-yl group, 2,9-phenanthrolin-4-yl group, 2,9-phenanthrolin-5-yl group, 2,9-phenanthrolin-6-yl group, 2,9-phenanthrolin-7-yl group, 2,9-phenanthrolin-8-yl group, 2,9-phenanthrolin-10-yl group, 2,8-phenanthrolin-1-yl group, 2,8-phenanthrolin-3-yl group, 2,8-phenanthrolin-4-yl group, 2,8-phenanthrolin-5-yl group, 2,8-phenanthrolin-6-yl group, 2,8-phenanthrolin-7-yl group, 2,8-phenanthrolin-9-yl group, 2,8-phenanthrolin-10-yl group, 2,7-phenanthrolin-1-yl group, 2,7-phenanthrolin-3-yl group, 2,7-phenanthrolin-4-yl group, 2,7-phenanthrolin-5-yl group, 2,7-phenanthrolin-6-yl group, 2,7-phenanthrolin-8-yl group, 2,7-phenanthrolin-9-yl group, 2,7-phenanthrolin-10-yl group, 1-phenazinyl group, 2-phenazinyl group, 1-phenothiazinyl group, 2-phenothiazinyl group, 3-phenothiazinyl group, 4-phenothiazinyl group, 10-phenothiazinyl group, 1-phenoxazinyl group, 2-phenoxazinyl group, 3-phenoxazinyl group, 4-phenoxazinyl group, 10-phenoxazinyl group, 2-oxazolyl group, 4-oxazolyl group, 5-oxazolyl group, 2-oxadiazolyl group, 5-oxadiazolyl group, 3-furazanyl group, 2-thienyl group, 3-thienyl group, 2-methylpyrrol-1-yl group, 2-methylpyrrol-3-yl group, 2-methylpyrrol-4-yl group, 2-methylpyrrol-5-yl group, 3-methylpyrrol-1-yl group, 3-methylpyrrol-2-yl group, 3-methylpyrrol-4-yl group, 3-methylpyrrol-5-yl group, 2-t-butylpyrrol-4-yl group, 3-(2-phenylpropyl)pyrrol-1-yl group, 2-methyl-1-indolyl group, 4-methyl-1-indolyl group, 2-methyl-3-indolyl group, 4-methyl-3-indolyl group, 2-t-butyl-1-indolyl group, 4-t-butyl-1-indolyl group, 2-t-butyl-3-indolyl group, and 4-t-butyl-3-indolyl group.

Of those, a 2-pyridinyl group, 1-indolidinyl group, 2-indolidinyl group, 3-indolidinyl group, 5-indolidinyl group, 6-indolidinyl group, 7-indolidinyl group, 8-indolidinyl group, 2-imidazopyridinyl group, 3-imidazopyridinyl group, 5-imidazopyridinyl group, 6-imidazopyridinyl group, 7-imidazopyridinyl group, 8-imidazopyridinyl group, 3-pyridinyl group, 4-pyridinyl group, 1-indolyl group, 2-indolyl group, 3-indolyl group, 4-indolyl group, 5-indolyl group, 6-indolyl group, 7-indolyl group, 1-isoindolyl group, 2-isoindolyl group, 3-isoindolyl group, 4-isoindolyl group, 5-isoindolyl group, 6-isoindolyl group, 7-isoindolyl group, 1-carbazolyl group, 2-carbazolyl group, 3-carbazolyl group, 4-carbazolyl group, 9-carbazolyl group, and the like are preferable.

The substituted or unsubstituted alkoxy group having 1 to 40 carbon atoms which is represented by each of $R_1$ to $R_8$ in the general formula (1), $R_9$ to $R_{15}$ and X in the general formulae (2a) and (2b) is preferably a substituted or unsubstituted alkoxy group having 1 to 30 carbon atoms, and is expressed by —OY.

Examples of Y include specific examples of the foregoing substituted or unsubstituted alkyl group having 1 to 40 carbon atoms.

The substituted or unsubstituted aromatic hydrocarbon group having 6 to 40 ring carbon atoms which is represented by each of $R_1$ to $R_8$ in the general formula (1), $R_9$ to $R_{15}$ and X in the general formulae (2a) and (2b) is preferably a substituted or unsubstituted aromatic hydrocarbon group having 6 to 18 ring carbon atoms.

Examples of the aromatic hydrocarbon group include phenyl group, 1-naphthyl group, 2-naphthyl group, 1-anthryl group, 2-anthryl group, 9-anthryl group, 1-phenanthryl group, 2-phenanthryl group, 3-phenanthryl group, 4-phenanthryl group, 9-phenanthryl group, 1-naphthacenyl group, 2-naphthacenyl group, 9-naphthacenyl group, 1-pyrenyl group, 2-pyrenyl group, 4-pyrenyl group, 2-biphenylyl group, 3-biphenylyl group, 4-biphenylyl group, p-terphenyl-4-yl group, p-terphenyl-3-yl group, p-terphenyl-2-yl group, m-terphenyl-4-yl group, m-terphenyl-3-yl group, m-terphenyl-2-yl group, o-tolyl group, m-tolyl group, p-tolyl group, p-t-butylphenyl group, p-(2-phenylpropyl)phenyl group, 3-methyl-2-naphthyl group, 4-methyl-1-naphthyl group, 4-methyl-1-anthryl group, 4'-methylbiphenylyl group, 4"-t- butyl-p-terphenyl-4-yl group, o-cumenyl group, m-cumenyl group, p-cumenyl group, 2,3-xylyl group, 3,4-xylyl group, 2,5-xylyl group, and mesityl group.

Of those, phenyl group, 1-naphthyl group, 2-naphthyl group, 9-phenanthryl group, 1-biphenylyl group, 3-biphenylyl group, 4-biphenylyl group, p-tolyl group, 3,4-xylyl group, and the like are preferable.

The substituted or unsubstituted aryloxy group having 6 to 40 carbon atoms which is represented by each of $R_1$ to $R_8$ in the general formula (1), $R_9$ to $R_{15}$ and X in the general formulae (2a) and (2b) is preferably a substituted or unsubstituted aryloxy group having 6 to 30 carbon atoms, and is expressed by —OAr.

Examples of Ar include specific examples of the above substituted or unsubstituted aromatic hydrocarbon group having 6 to 40 ring carbon atoms.

Each of $R_1$ to $R_8$ in the general formula (1), $R_9$ to $R_{15}$ and X in the general formulae (2a) and (2b) is preferably a substituted or unsubstituted aralkyl group having 7 to 40 carbon atoms.

Examples of the aralkyl group include benzyl group, 1-phenylethyl group, 2-phenylethyl group, 1-phenylisopropyl group, 2-phenylisopropyl group, phenyl-t-butyl group, α-naphthylmethyl group, 1-α-naphthylethyl group, 2-α-naphthylethyl group, 1-α-naphthylisopropyl group, 2-α-naphthylisopropyl group, β-naphthylmethyl group, 1-β-naphthylethyl group, 2-β-naphthylethyl group, 1-β-naphthylisopropyl group, 2-β-naphthylisopropyl group, 1-pyrrolylmethyl group, 2-(1-pyrrolyl)ethyl group, p-methylbenzyl group, m-methylbenzyl group, o-methylbenzyl group, p-chlorobenzyl group, m-chlorobenzyl group, o-chlorobenzyl group, p-bromobenzyl group, m-bromobenzyl group, o-bromobenzyl group, p-iodobenzyl group, m-iodobenzyl group, o-iodobenzyl group, p-hydroxybenzyl group, m-hydroxybenzyl group, o-hydroxybenzyl group, p-aminobenzyl group, m-aminobenzyl group, o-aminobenzyl group, p-nitrobenzyl group, m-nitrobenzyl group, o-nitrobenzyl group, p-cyanobenzyl group, m-cyanobenzyl group, o-cyanobenzyl group, 1-hydroxy-2-phenylisopropyl group, and 1-chloro-2-phenylisopropyl group.

Of those, benzyl group, p-cyanobenzyl group, m-cyanobenzyl group, o-cyanobenzyl group, 1-phenylethyl group, 2-phenylethyl group, 1-phenylisopropyl group, 2-phenylisopropyl group, and the like are preferable.

The substituted or unsubstituted alkenyl group having 2 to 40 carbon atoms which is represented by each of $R_1$ to $R_8$ in the general formula (1), $R_9$ to $R_{15}$ and X in the general formulae (2a) and (2b) is preferably a substituted or unsubstituted alkenyl group having 2 to 30 carbon atoms.

Examples of the alkenyl group include vinyl group, allyl group, 1-butenyl group, 2-butenyl group, 3-butenyl group, 1,3-butadienyl group, 1-methylvinyl group, styryl group, 2,2-diphenylvinyl group, 1,2-diphenylvinyl group, 1-methylallyl group, 1,1-dimethylallyl group, 2-methylallyl group, 1-phenylallyl group, 2-phenylallyl group, 3-phenylallyl group, 3,3-diphenylallyl group, 1,2-dimethylallyl group, 1-phenyl-1-butenyl group, and 3-phenyl-1-butenyl group.

Of those, styryl group, 2,2-diphenylvinyl group, 1,2-diphenylvinyl group, and the like are preferable.

The substituted or unsubstituted alkylamino group having 1 to 40 carbon atoms, the substituted or unsubstituted arylamino group having 6 to 40 carbon atoms or the substituted or unsubstituted aralkylamino group having 7 to 40 carbon atoms which is represented by each of $R_1$ to $R_8$ in the general formula (1), $R_9$ to $R_{15}$ and X in the general formulae (2a) and (2b), is preferably a substituted or unsubstituted alkylamino group having 1 to 20 carbon atoms, a substituted or unsubstituted arylamino group having 6 to 20 carbon atoms or a substituted or unsubstituted aralkylamino group having 7 to 20 carbon atoms.

Each of the alkylamino group, the arylamino group and the aralkylamino group can be expressed by —$NQ_1Q_2$. $Q_1$ and $Q_2$ each independently include, for example, a methyl group, ethyl group, propyl group, isopropyl group, n-butyl group, s-butyl group, isobutyl group, t-butyl group, n-pentyl group, n-hexyl group, n-heptyl group, n-octyl group, hydroxymethyl group, 1-hydroxyethyl group, 2-hydroxyethyl group, 2-hydroxyisobutyl group, 1,2-dihydroxyethyl group, 1,3-dihydroxyisopropyl group, 2,3-dihydroxy-t-butyl group, 1,2,3-trihydroxypropyl group, chloromethyl group, 1-chloroethyl group, 2-chloroethyl group, 2-chloroisobutyl group, 1,2-dichloroethyl group, 1,3-dichloroisopropyl group, 2,3-dichloro-t-butyl group, 1,2,3-trichloropropyl group, bromomethyl group, 1-bromoethyl group, 2-bromoethyl group, 2-bromoisobutyl group, 1,2-dibromoethyl group, 1,3-dibromoisopropyl group, 2,3-dibromo-t-butyl group, 1,2,3-tribromopropyl group, iodomethyl group, 1-iodoethyl group, 2-iodoethyl group, 2-iodoisobutyl group, 1,2-diiodoethyl group, 1,3-diiodoisopropyl group, 2,3-diiodo-t-butyl group, 1,2,3-triiodopropyl group, aminomethyl group, 1-aminoethyl group, 2-aminoethyl group, 2-aminoisobutyl group, 1,2-diaminoethyl group, 1,3-diaminoisopropyl group, 2,3-diamino-t-butyl group, 1,2,3-triaminopropyl group, cyanomethyl group, 1-cyanoethyl group, 2-cyanoethyl group, 2-cyanoisobutyl group, 1,2-dicyanoethyl group, 1,3-dicyanoisopropyl group, 2,3-dicyano-t-butyl group, 1,2,3-tricyanopropyl group, nitromethyl group, 1-nitroethyl group, 2-nitroethyl group, 2-nitroisobutyl group, 1,2-dinitroethyl group, 1,3-dinitroisopropyl group, 2,3-dinitro-t-butyl group, 1,2,3-trinitropropyl group, phenyl group, 1-naphthyl group, 2-naphthyl group, 1-anthryl group, 2-anthryl group, 9-anthryl group, 1-phenanthryl group, 2-phenanthryl group, 3-phenanthryl group, 4-phenanthryl group, 9-phenanthryl group, 1-naphthacenyl group, 2-naphthacenyl group, 9-naphthacenyl group, 4-styrylphenyl group, 1-pyrenyl group, 2-pyrenyl group, 4-pyrenyl group, 2-diphenylyl group, 3-biphenylyl group, 4-biphenylyl group, p-terphenyl-4-yl group, p-terphenyl-3-yl group, p-terphenyl-2-yl group, m-terphenyl-4-yl group, m-terphenyl-3-yl group, m-terphenyl-2-yl group, o-tolyl group, m-tolyl group, p-tolyl group, p-t-butylphenyl group, p-(2-phenylpropyl)phenyl group, 3-methyl-2-naphthyl group, 4-methyl-1-naphthyl group, 4-methyl-1-anthryl group, 4-methylbiphenylyl group, 4"-t-butyl-p-terphenyl-4-yl group, 2-pyrrolyl group, 3-pyrrolyl group, pyradinyl group, 2-pyridinyl group, 3-pyridinyl group, 4-pyridinyl group, 2-indolyl group, 3-indolyl group, 4-indolyl group, 5-indolyl group, 6-indolyl group, 7-indolyl group, 1-isoindolyl group, 3-isoindolyl group, 4-isoindolyl group, 5-isoindolyl group, 6-isoindolyl group, 7-isoindolyl group, 2-furyl group, 3-furyl group, 2-benzofuranyl group, 3-benzofuranyl group, 4-benzofuranyl group, 5-benzofuranyl group, 6-benzofuranyl group, 7-benzofuranyl group, 1-isobenzofuranyl group, 3-isobenzofuranyl group, 4-isobenzofuranyl group, 5-isobenzofuranyl group, 6-isobenzofuranyl group, 7-isobenzofuranyl group, 2-quinolyl group, 3-quinolyl group, 4-quinolyl group, 5-quinolyl group, 6-quinolyl group, 7-quinolyl group, 8-quinolyl group, 1-isoquinolyl group, 3-isoquinolyl group, 4-isoquinolyl group, 5-isoquinolyl group, 6-isoquinolyl group, 7-isoquinolyl group, 8-isoquinolyl group, 2-quinoxalinyl group, 5-quinoxalinyl group, 6-quinoxalinyl group, 1-carbazolyl group, 2-carbazolyl group, 3-carbazolyl group, 4-carbazolyl group, 1-phenanthridinyl group, 2-phenanthridinyl group, 3-phenanthridinyl group, 4-phenanthridinyl group, 6-phenanthridinyl group, 7-phenanthridinyl group, 8-phenanthridinyl group, 9-phenanthridinyl group, 10-phenanthridinyl group, 1-acridinyl group, 2-acridinyl group, 3-acridinyl group, 4-acridinyl group, 9-acridinyl group, 1,7-phenanthrolin-2-yl group, 1,7-phenanthrolin-3-yl group, 1,7-phenanthrolin-4-yl group, 1,7-phenanthrolin-5-yl group, 1,7-phenanthrolin-6-yl group, 1,7-phenanthrolin-8-yl group, 1,7-phenanthrolin-9-yl group, 1,7-phenanthrolin-10-yl group, 1,8-phenanthrolin-2-yl group, 1,8-phenanthrolin-3-yl group, 1,8-phenanthrolin-4-yl group, 1,8-phenanthrolin-5-yl group, 1,8-phenanthrolin-6-yl group, 1,8-phenanthrolin-7-yl group, 1,8-phenanthrolin-9-yl group, 1,8-phenanthrolin-10-yl group, 1,9-phenanthrolin-2-yl group, 1,9-phenanthrolin-3-yl group, 1,9-phenanthrolin-4-yl group, 1,9-phenanthrolin-5-yl group, 1,9-phenanthrolin-6-yl group, 1,9-phenanthrolin-7-yl group, 1,9-phenanthrolin-8-yl group, 1,9-phenanthrolin-10-yl group, 1,10-phenanthrolin-2-yl group, 1,10-phenanthrolin-3-yl group, 1,10-phenanthrolin-4-yl group, 1,10-phenanthrolin-5-yl group, 2,9-phenanthrolin-1-yl group, 2,9-phenanthrolin-3-yl group, 2,9-phenanthrolin-4-yl group, 2,9-phenanthrolin-5-yl group, 2,9-phenanthrolin-6-yl group, 2,9-phenanthrolin-7-yl group, 2,9-phenanthrolin-8-yl group, 2,9-phenanthrolin-10-yl group, 2,8-phenanthrolin-1-yl group, 2,8-phenanthrolin-3-yl group, 2,8-phenanthrolin-4-yl group, 2,8-phenanthrolin-5-yl group, 2,8-phenanthrolin-6-yl group, 2,8-phenanthrolin-7-yl group, 2,8-phenanthrolin-9-yl group, 2,8-phenanthrolin-10-yl group, 2,7-phenanthrolin-1-yl group, 2,7-phenanthrolin-3-yl group, 2,7-phenanthrolin-4-yl group, 2,7-phenanthrolin-5-yl group, 2,7-phenanthrolin-6-yl group, 2,7-phenanthrolin-8-yl group, 2,7-phenanthrolin-9-yl group, 2,7-phenanthrolin-10-yl group, 1-phenazinyl group, 2-phenazinyl group, 1-phenothiazinyl group, 2-phenothiazinyl group, 3-phenothiazinyl group, 4-phenothiazinyl group, 1-phenoxazinyl group, 2-phenoxazinyl group, 3-phenoxazinyl group, 4-phenoxazinyl group, 2-oxazolyl group, 4-oxazolyl group, 5-oxazolyl group, 2-oxadiazolyl group, 5-oxadiazolyl group, 3-furazanyl group, 2-thienyl group, 3-thienyl group, 2-methylpyrrol-1-yl group, 2-methylpyrrol-3-yl group, 2-methylpyrrol-4-yl group, 2-methylpyrrol-5-yl group, 3-methylpyrrol-1-yl group, 3-methylpyrrol-2-yl group, 3-methylpyrrol-4-yl group, 3-methylpyrrol-5-yl group, 2-t-butylpyrrol-4-yl group, 3-(2-phenylpropyl)pyrrol-1-yl group, 2-methyl-1-indolyl group, 4-methyl-1-indolyl group, 2-methyl-3-indolyl group, 4-methyl-3-indolyl group, 2-t-butyl-1-indolyl group, 4-t-butyl-1-indolyl group, 2-t-butyl-3-indolyl group, and 4-t-butyl-3-indolyl group.

Of those, methyl group, ethyl group, propyl group, isopropyl group, n-butyl group, s-butyl group, isobutyl group, t-butyl group, n-pentyl group, n-hexyl group, n-heptyl group, n-octyl group, phenyl group, 1-naphthyl group, 2-naphthyl group, p-tolyl group, 4-biphenylyl group, and the like are preferable.

In addition, when each of $R_1$ to $R_8$ bond to its adjacent carbon atom and bond to each other to form a saturated or unsaturated cyclic structure, or when a couple of $R_9$ and $R_{10}$ or a couple of $R_{11}$ and $R_{12}$ bond to each other to form a saturated or unsaturated cyclic structure in the general formula (1), (2a), or (2b), examples of structures for $R_1$ to $R_8$, $R_9$, $R_{10}$, $R_{11}$ and $R_{12}$ include —$R_1$—$R_2$—, —$R_3$—$R_4$—, —$R_5$—$R_6$—, —$R_7$—$R_8$—, —$R_9$—$R_{10}$—, and —$R_{11}$—$R_{12}$—. Furthermore, examples of specific structures for them include —(CH$_2$)$_4$—, —(CH$_2$)$_5$—, —CH=CH—CH=CH—, and —CH$_2$—CH=CH—CH$_2$—.

The group represented by Cz in the general formula (1) is a group expressed by the general formula (2a) or (2b).

Examples of the group represented by Cz include the following groups.

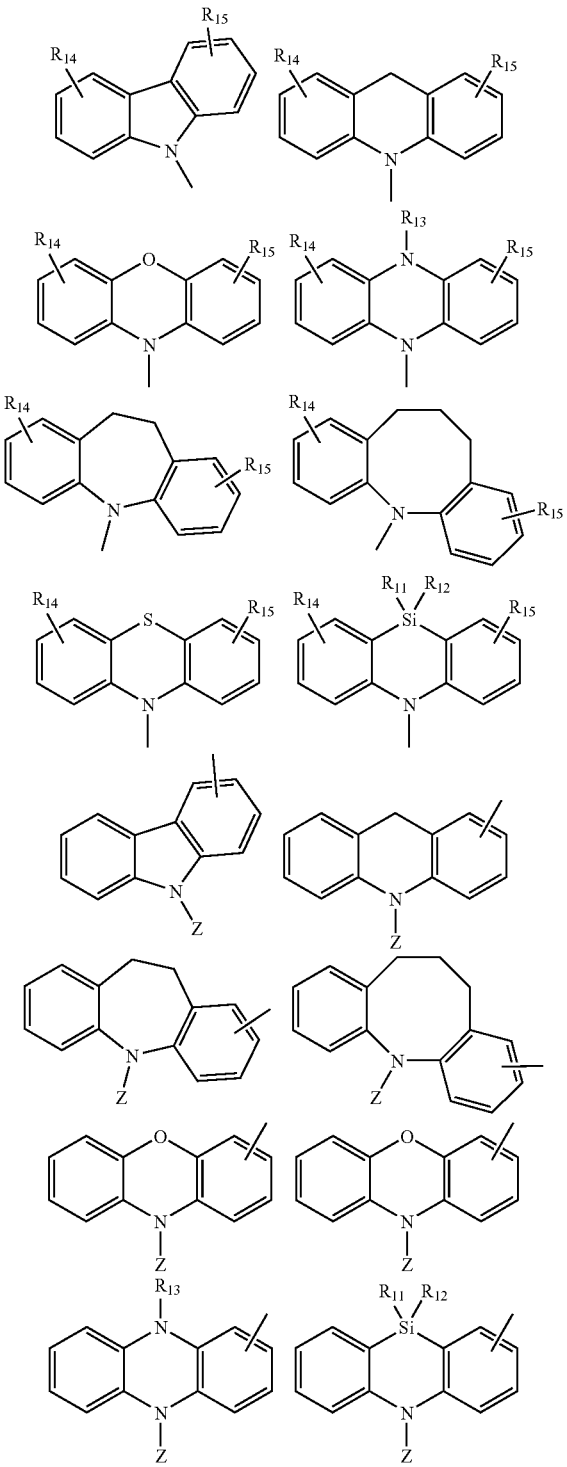

In the above formulae, $R_{14}$ and $R_{15}$ each represent the foregoing substituent.

In addition, Z represents a substituted or unsubstituted aromatic hydrocarbon group having 6 to 18 ring carbon atoms, a substituted or unsubstituted alkyl group having 1 to 20 carbon atoms, or a substituted or unsubstituted aralkyl group having 7 to 20 carbon atoms.

Preferable examples of the aromatic hydrocarbon group include a phenyl group, naphthyl group, tolyl group, biphenyl group, and terphenyl group. Of those, a phenyl group, biphenyl group, tolyl group, and the like are more preferable.

In addition, preferable examples of the alkyl group include a methyl group, ethyl group, propyl group, isopropyl group, n-butyl group, s-butyl group, isobutyl group, t-butyl group, n-pentyl group, n-hexyl group, n-heptyl group, n-octyl group, n-nonyl group, n-decyl group, n-undecyl group, n-dodecyl group, n-tridecyl group, n-tetradecyl group, n-pentadecyl group, n-hexadecyl group, n-heptadecyl group, n-octadecyl group, neopentyl group, 1-methylpentyl group, 2-methylpentyl group, 1-pentylhexyl group, 1-butylpentyl group, 1-heptyloctyl group, and 3-methylpentyl group. Of those, a methyl group, ethyl group, propyl group, n-hexyl group, n-heptyl group, and the like are more preferable.

Preferable examples of the aralkyl group include an α-naphthylmethyl group, 1-α-naphthylethyl group, 2-α-naphthylethyl group, 1-α-naphthylisoproopyl group, 2-α-naphthylisoproopyl group, β-naphthylmethyl group, 1-β-naphthylethyl group, 2-β-naphthylethyl group, 1-β-naphthylisopropyl group, 2-β-naphthylisopropyl group, benzyl group, p-cyanobenzyl group, m-cyanobenzyl group, o-cyanobenzyl group, 1-phenylethyl group, 2-phenylethyl group, 1-phenylisopropyl group, and 2-phenylisopropyl group. Of those, a benzyl group, p-cyanobenzyl group, and the like are more preferable.

In addition, examples of the preferable group represented by Cz include the following groups.

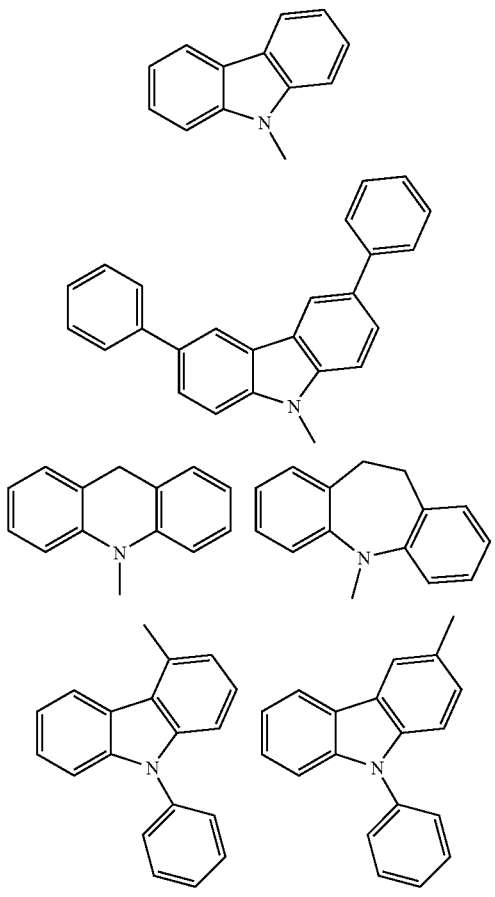

-continued

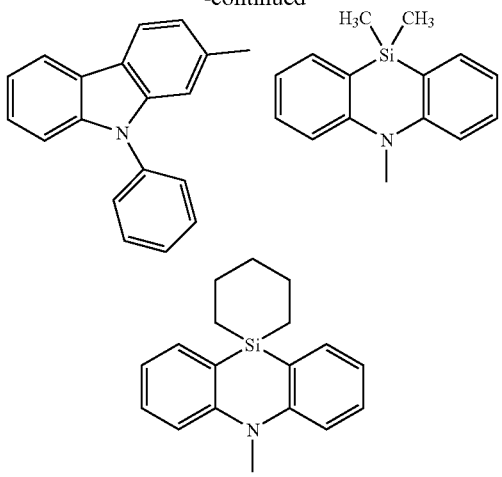

A substituted or unsubstituted carbazolyl group or a substituted or unsubstituted 9-phenylcarbazolyl group is particularly preferable as the group represented by Cz.

Examples of the specific structure of the material for an organic EL device of the present invention, which is composed of the compound represented by the general formula (1) include the following structures. However, the specific structure is not limited to the following structures.

In each of the following structural formulae, at least one benzene residue is selected from $R_1$ to $R_8$, and each of four benzene residues can have a maximum of two substituents.

Typical examples of the case where at least one of $Ar_1$ to $Ar_4$ represents m-phenylene or o-phenylene in the general formula (1) include the following compounds.

Typical examples of the case where none of the four benzene residues is substituted include Compounds (A-1) to (A-23) below.

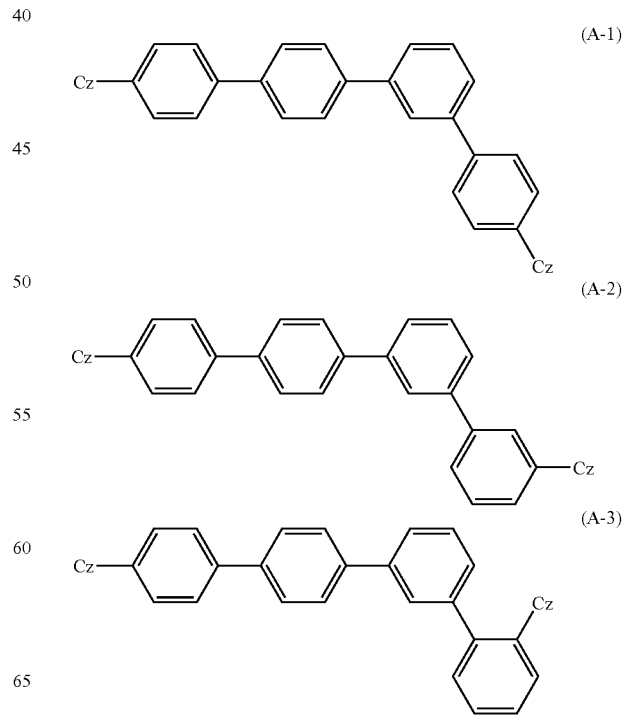

(A-4)
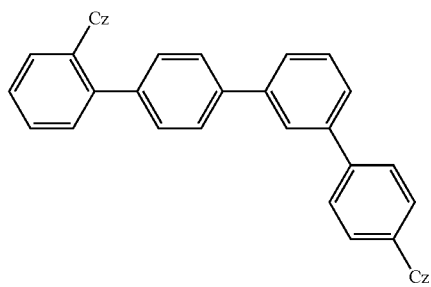
(A-5)
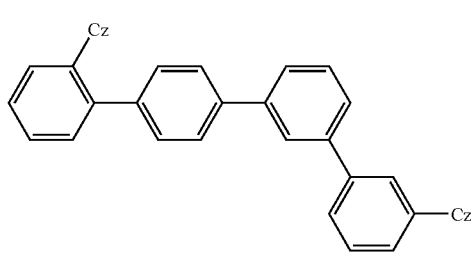
(A-6)
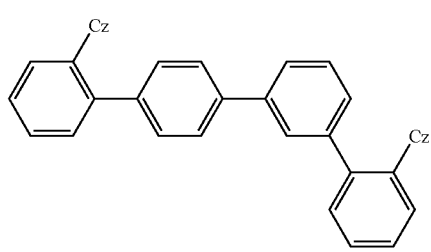
(A-7)
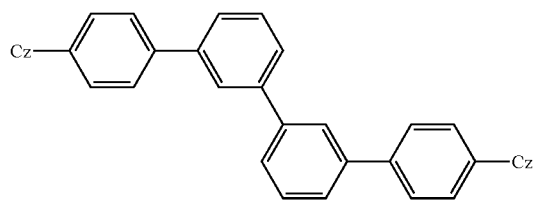
(A-8)
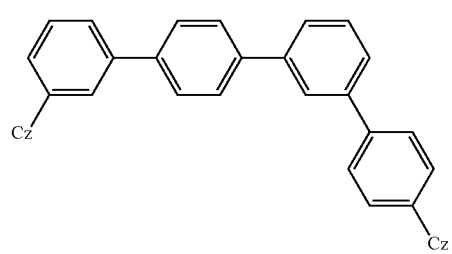
(A-9)
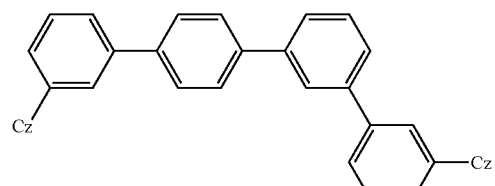
(A-10)
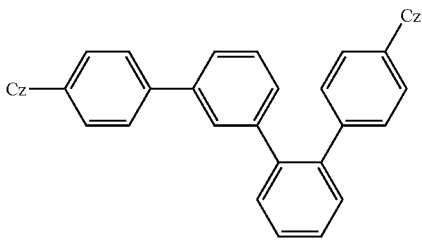
(A-11)
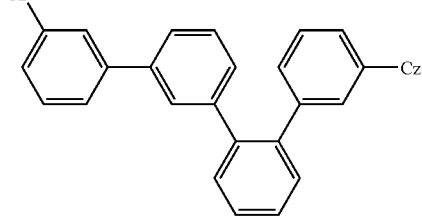
(A-12)
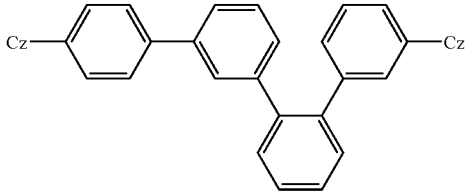
(A-13)
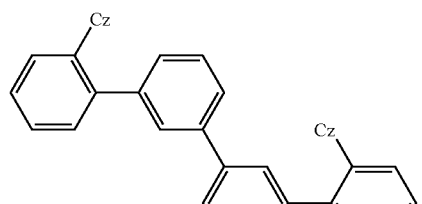
(A-14)
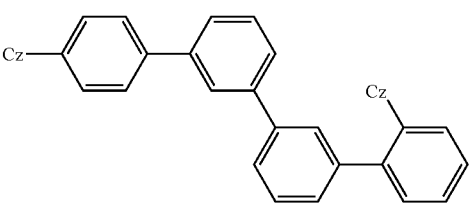
(A-15)
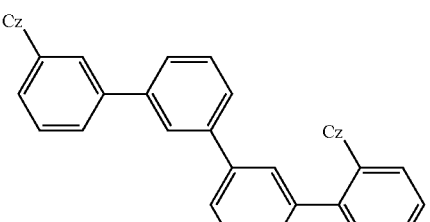
(A-16)
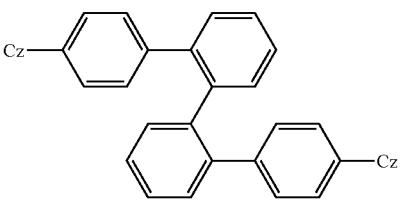

(A-17) 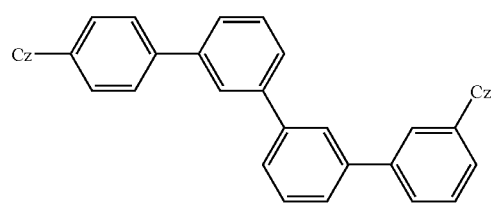
(A-18) 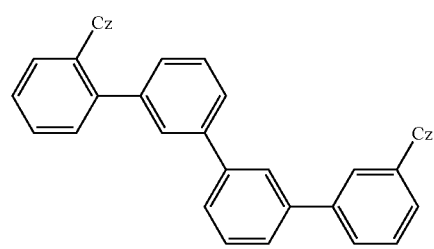
(A-19) 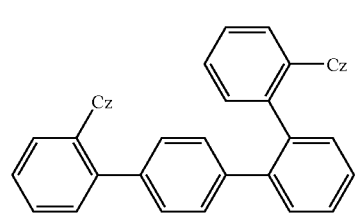
(A-20) 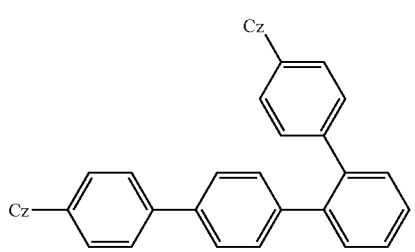
(A-21) 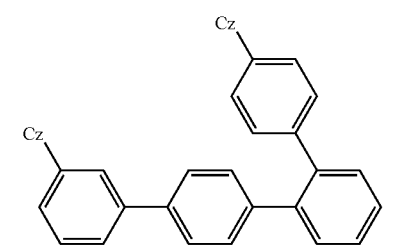
(A-22) 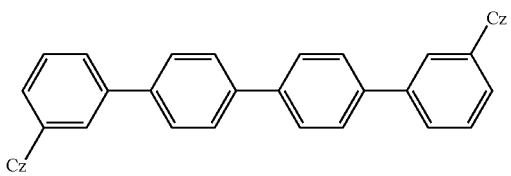
(A-23) 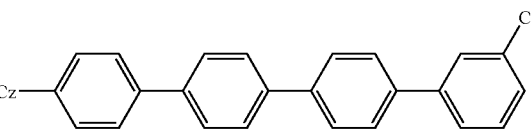
Typical examples of the case where at least one of the four benzene residues has a substituent include Compounds (B-1) to (B-65) below.
(B-1) 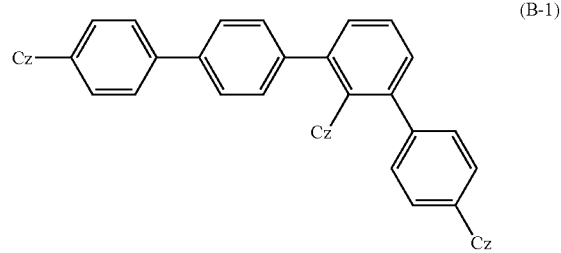
(B-2) 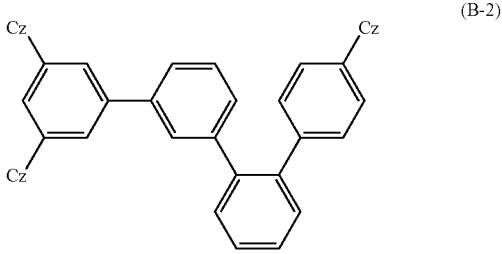
(B-3) 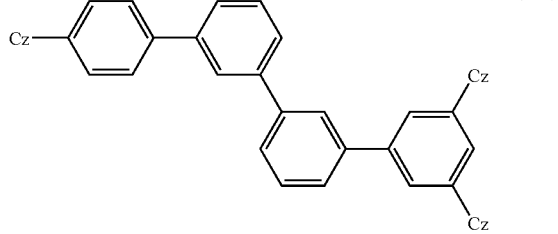
(B-4) 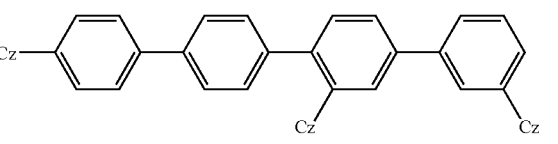
(B-5) 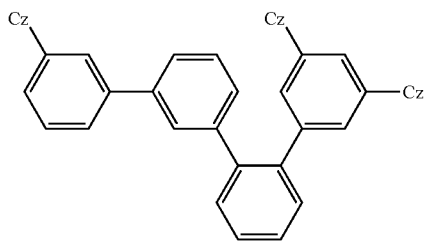
(B-6) 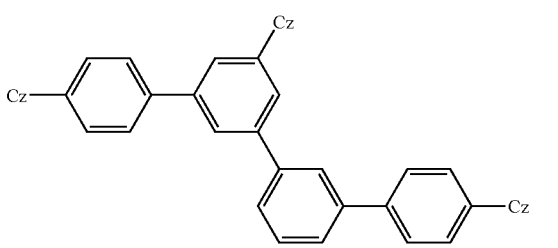
(B-7) 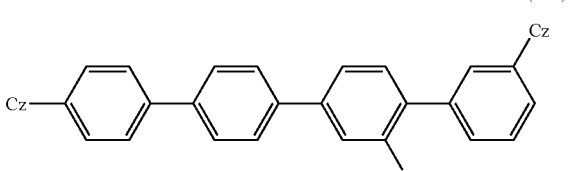

-continued
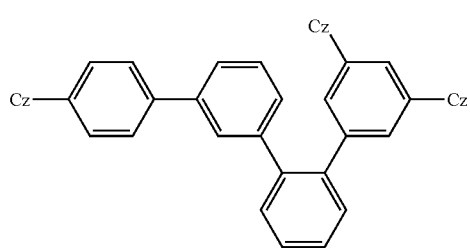
(B-8)
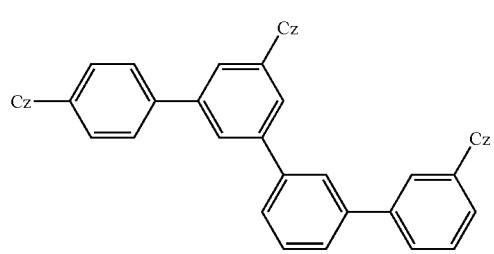
(B-9)
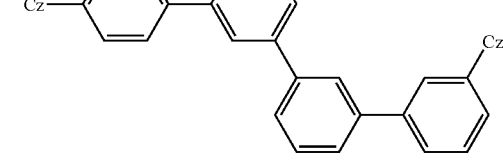
(B-10)
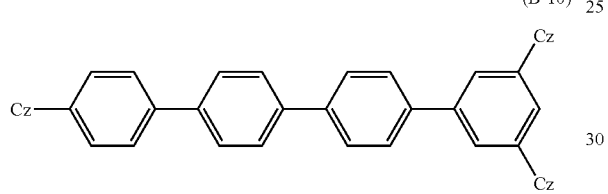
(B-11)
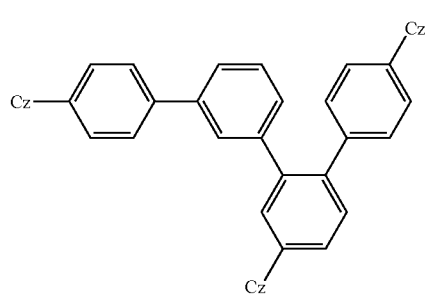
(B-12)
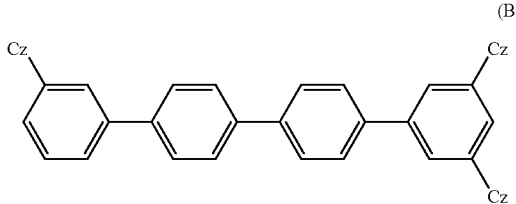
(B-13)
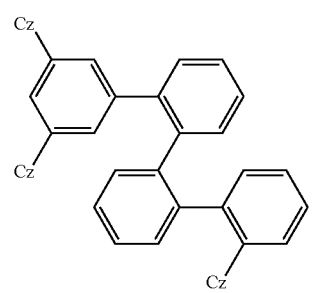
(B-14)
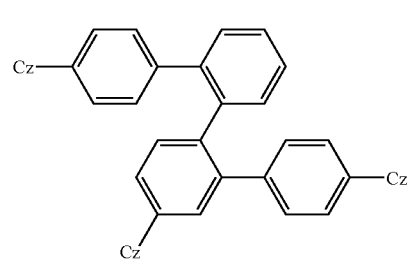
(B-15)
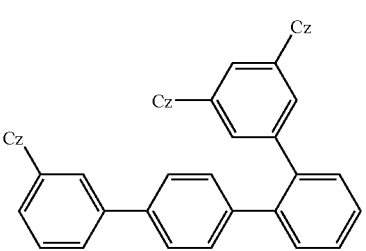
(B-16)
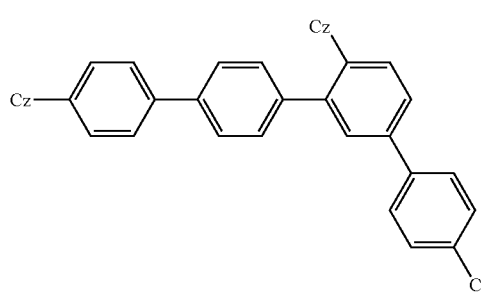
(B-17)
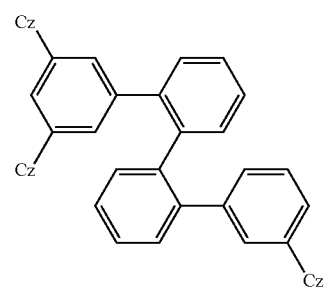
(B-18)
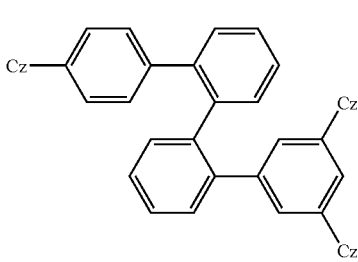
(B-19)

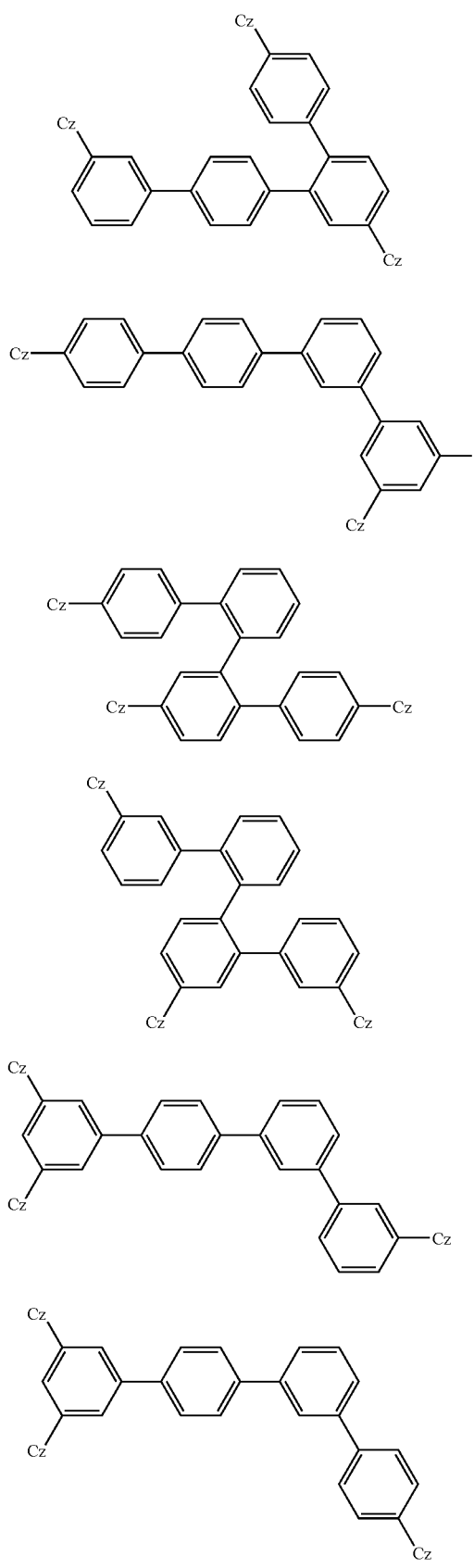

(B-32) 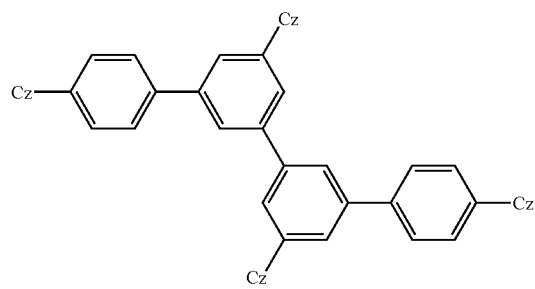
(B-33) 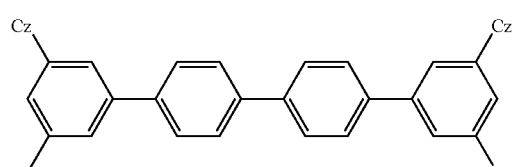
(B-34) 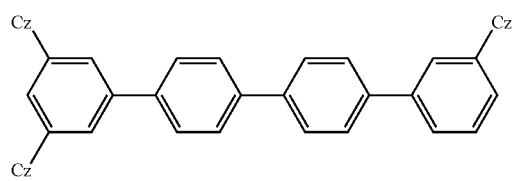
(B-35) 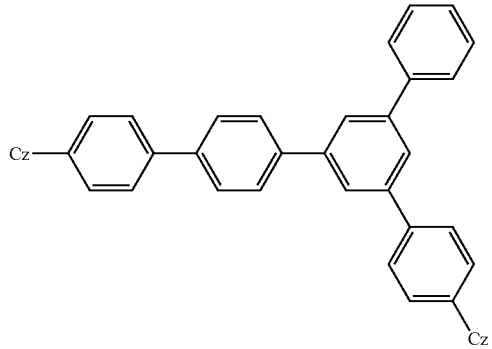
(B-36) 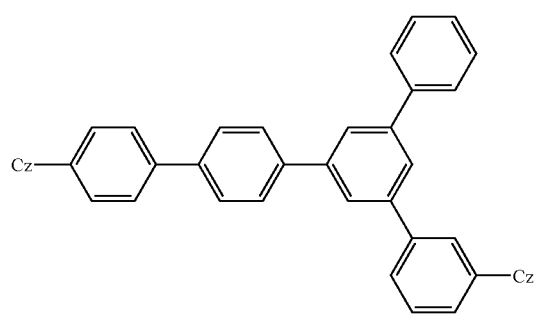
(B-37) 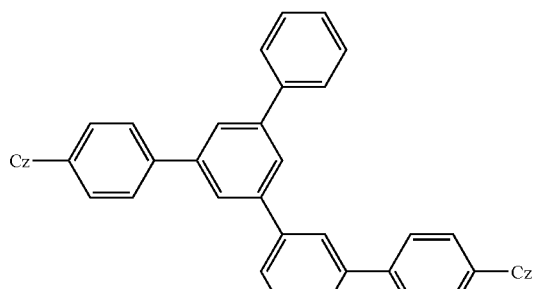
(B-38) 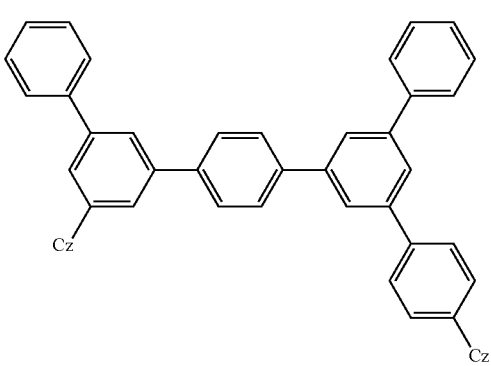
(B-39) 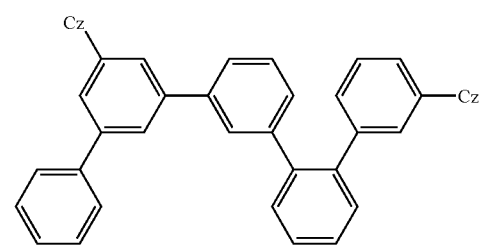
(B-40) 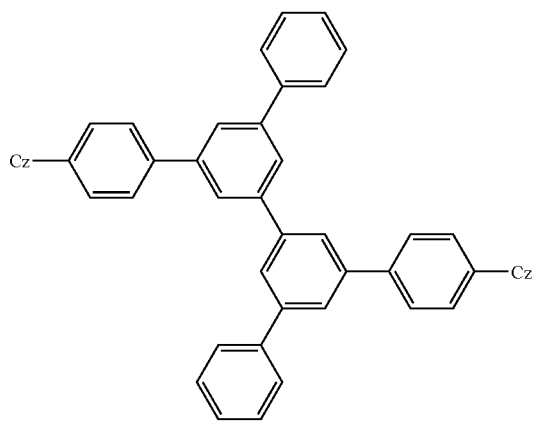

(B-41)
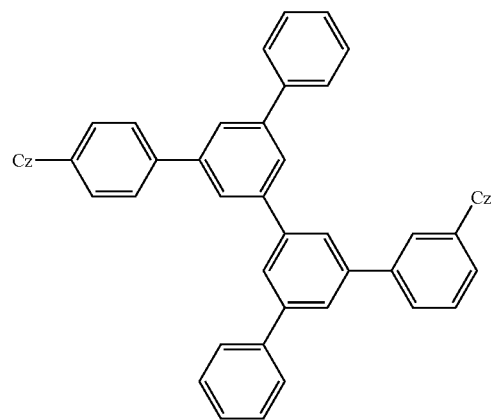
(B-42)
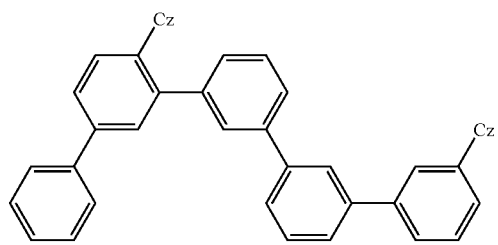
(B-43)
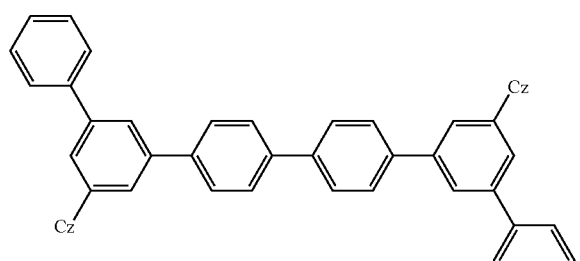
(B-44)
(B-45)
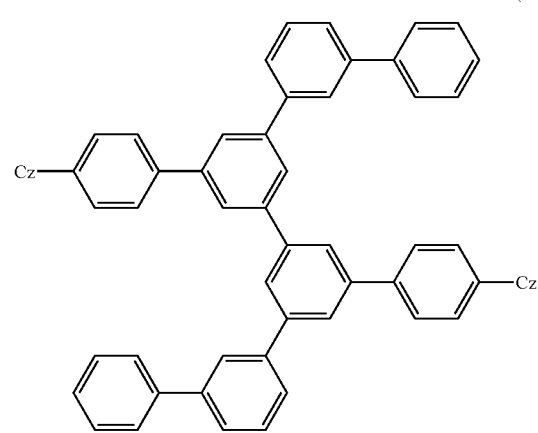
(B-46)
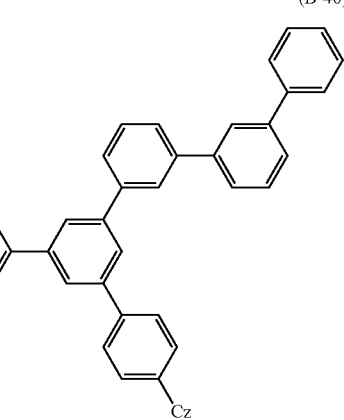
(B-47)
(B-48)
(B-49)
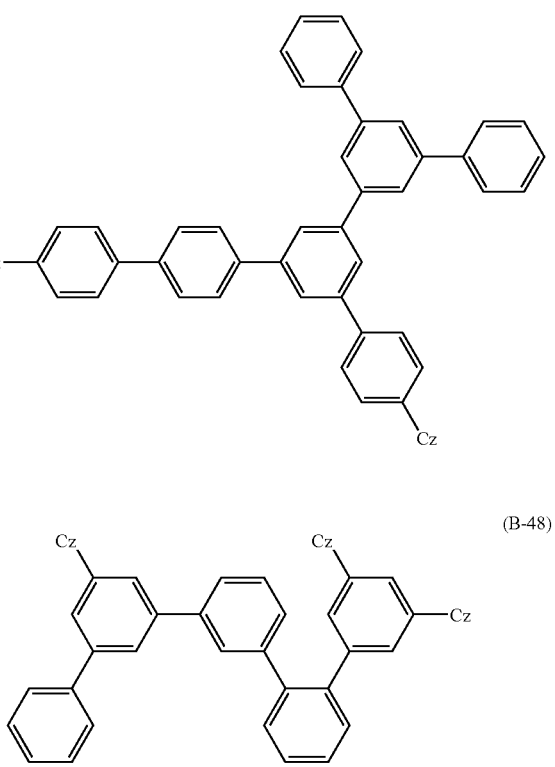

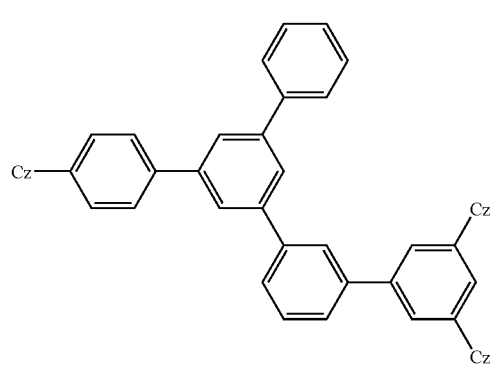
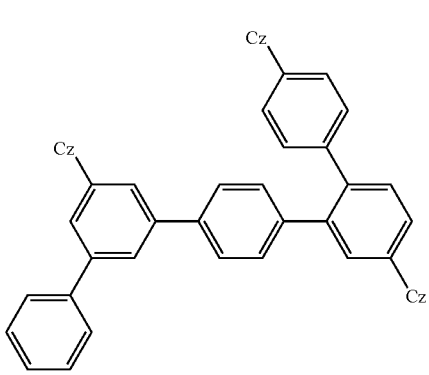
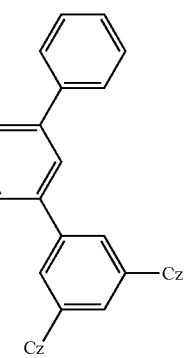

(B-58)
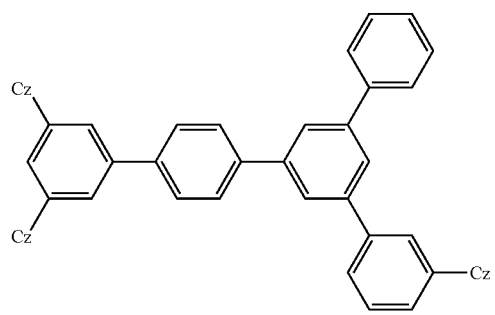
(B-59)
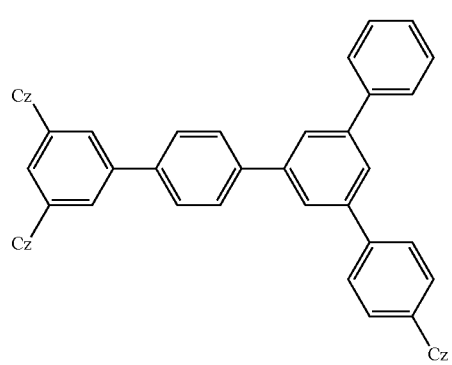
(B-60)
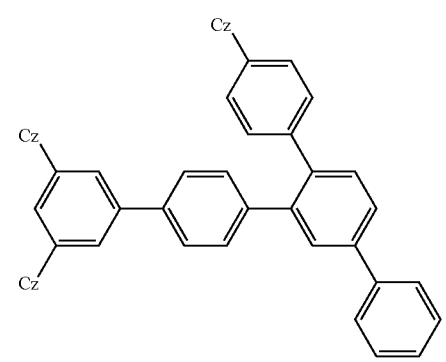
(B-61)
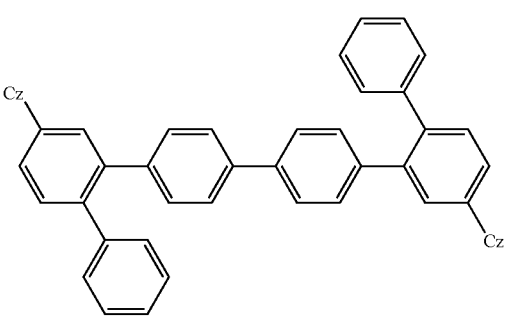
(B-62)
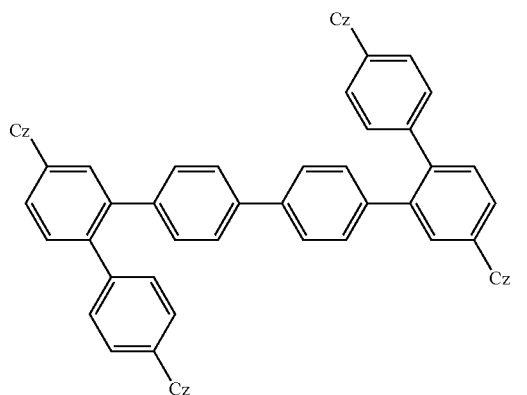
(B-63)
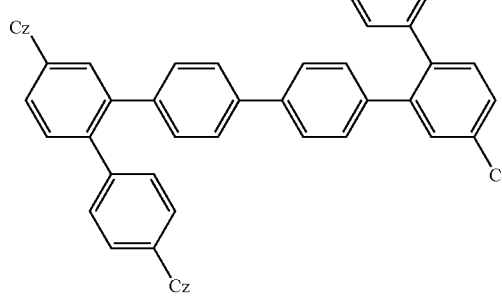
(B-64)
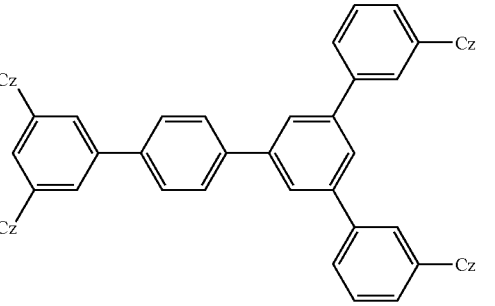
(B-65)
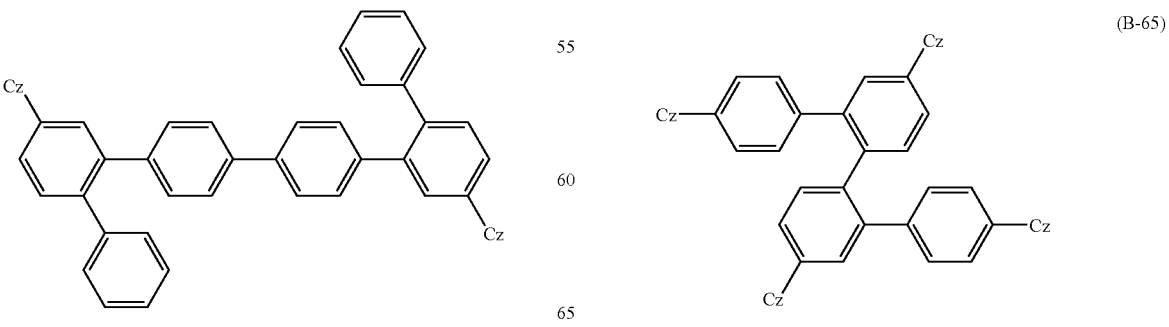

In addition, specific examples of the case where all of $Ar_1$ to $Ar_4$ each represent p-phenylene in the general formula (1) include Compounds (C-1) to (C-9) below.
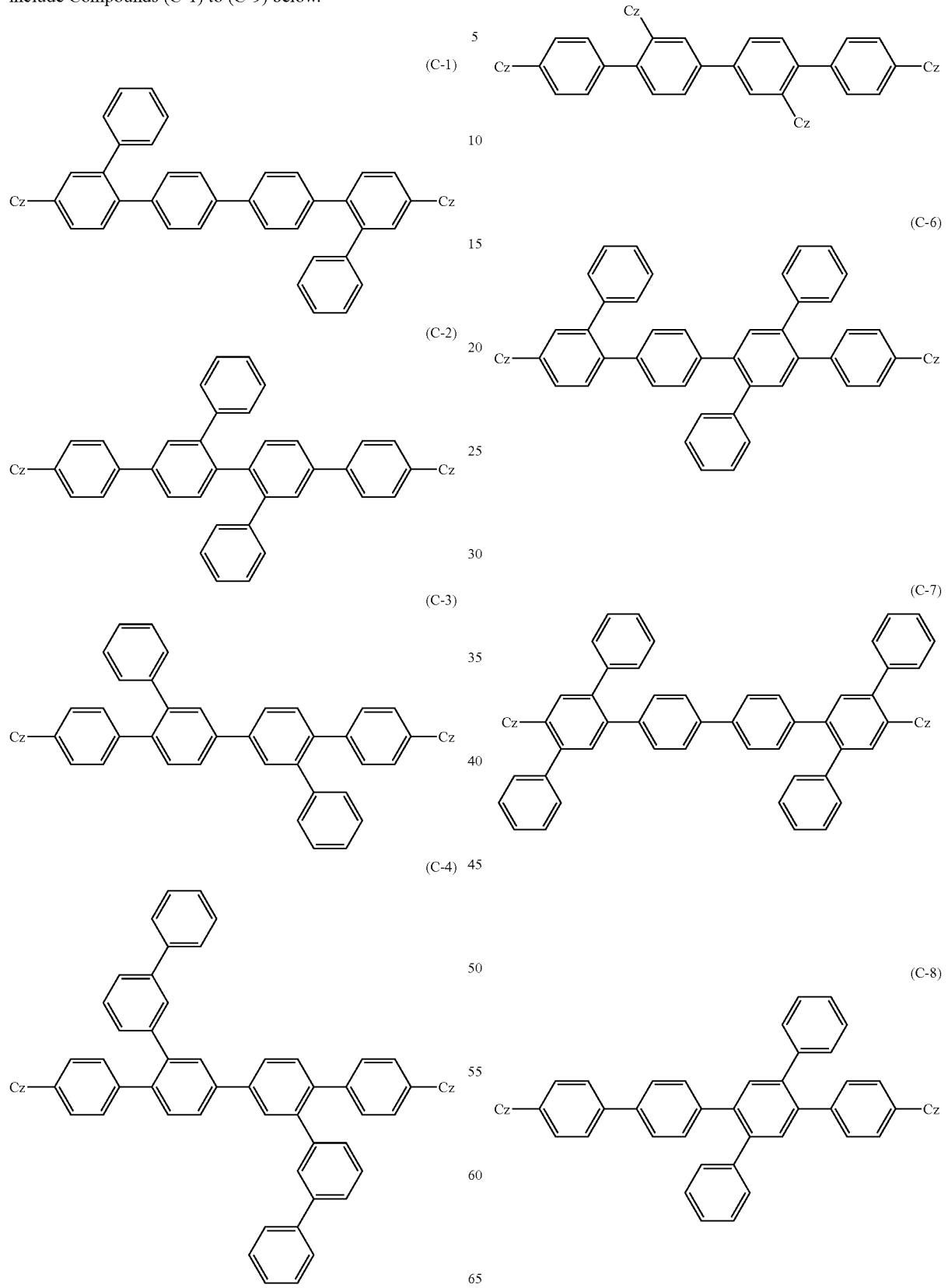

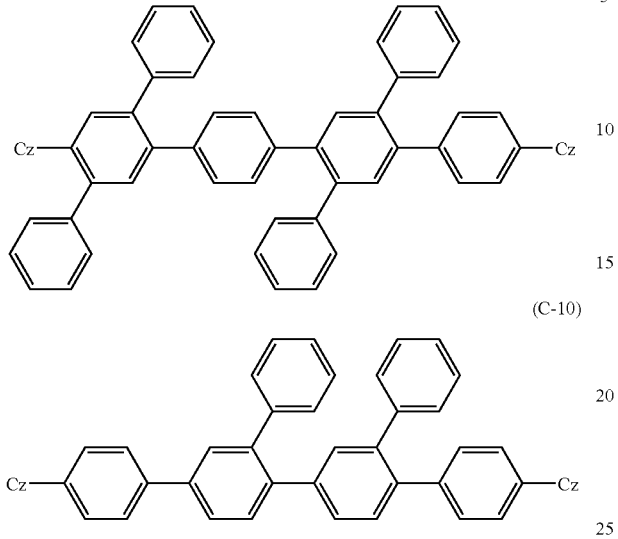

(C-9)

(C-10)

In the material for an organic EL device which is composed of the compound represented by the general formula (1), the case where $Ar_2$ and $Ar_3$ each independently represent m-phenylene or o-phenylene, and $Ar_1$ and $Ar_4$ each represent p-phenylene, the case where $Ar_1$ and $Ar_4$ each independently represent m-phenylene or o-phenylene, and $Ar_2$ and $Ar_3$ each represent p-phenylene, or the case where $Ar_1$ and $Ar_4$ each independently represent m-phenylene, and $R_1$ or $R_7$ represents a substituted or unsubstituted aromatic hydrocarbon group having 6 to 40 ring carbon atoms, or the group represented by Cz is preferable.

Next, an organic EL device of the present invention will be explained.

The organic EL device of the present invention comprise a cathode, an anode and an organic thin film layer composed of one or more layers including at least a light-emitting layer, the organic thin film layer being sandwiched between the cathode and the anode. In the organic EL device, at least one layer of the organic thin film layer comprises the material for an organic EL device of the present invention.

Examples of the constitution of the multilayer-type organic EL device include laminates each having a multilayer construction such as an anode/a hole transporting layer (a hole injecting layer)/a light-emitting layer/a cathode, an anode/a light-emitting layer/an electron transporting layer (an electron-injecting layer)/a cathode, an anode/a hole transporting layer (a hole injecting layer)/a light-emitting layer/an electron transporting layer (an electron-injecting layer)/a cathode, or an anode/a hole transporting layer (a hole injecting layer)/a light-emitting layer/a hole barrier layer/an electron transporting layer (an electron-injecting layer)/a cathode.

It is preferable that the light-emitting layer is composed of a host material and a phosphorescent material; and the host material is composed of the material for an organic EL device.

A metal complex such as an iridium complex, an osmium complex, or a platinum complex is preferable as the phosphorescent material because of its high phosphorescence quantum yield and its ability to improve the external quantum efficiency of a light-emitting device additionally. An iridium complex and a platinum complex are more preferable, and an ortho-metalated iridium complex is most preferable.

A more preferable form of an ortho-metalated metal complex is a compound represented by any one of the following general formulae (2) to (4), and a compound represented by the general formula (2) or (3) is particularly preferable.

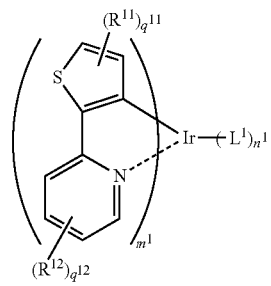

(2)

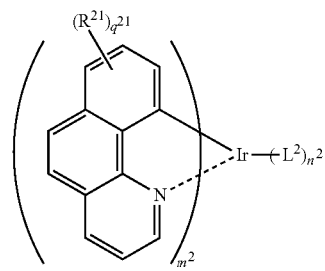

(3)

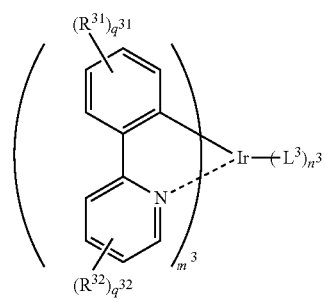

(4)

In the general formula (2), $R^{11}$ and $R^{12}$ each represent an alkyl group, aryl group, fluorinated alkyl group, and fluorinated aryl group. Of those, an alkyl group, fluorinated alkyl group, and aryl group are preferable, and an alkyl group and fluorinated alkyl group are more preferable.

$q^{11}$ represents an integer of 0 to 2, and is preferably 0 or 1, and more preferably 0.

$q^{12}$ represents an integer of 0 to 4, and is preferably 0 or 1, and more preferably 0.

When $q^{11}$ or $q^{12}$ is 2 or more, multiple $R^{11}$s, or multiple $R^{12}$s, may be identical to or different from each other, and may be coupled with each other to form a condensed ring.

$L^1$ represents a ligand, and examples of the ligand include ligands each needed for forming the ortho-metalated iridium complex. Preferable examples of the ligand include a ligand needed for forming the ortho-metalated iridium complex, a nitrogen-containing heterocyclic ligand, a diketone ligand, a halogen ligand, and a bipyridyl ligand. More preferable examples of the ligand include a ligand needed for forming the ortho-metalated iridium complex and a bipyridyl ligand.

$n^1$ represents an integer of 0 to 5, and is preferably 0.

$m^1$ represents 1, 2, or 3, and is preferably 3.

Numbers represented by $n^1$ and $m^1$ are preferably combined in such a manner that the metal complex represented by the general formula (2) becomes a neutral complex.

In the general formula (3), $R^{21}$, $n^2$, $m^2$, and $L^2$ each have the same meaning as that of each of $R^1$, $n^1$, $m^1$, and $L^1$ described above. $q^{21}$ represents an integer of 0 to 8, and is preferably 0.

When $q^{21}$ is 2 or more, multiple $R^{21}$s may be identical to or different from each other, and may be coupled with each other to form a condensed ring.

In the general formula (4), $R^{31}$, $R^{32}$, $q^{31}$, $q^{32}$, $n^3$, $m^3$, and $L^3$ each have the same meaning as that of each of $R^{11}$, $R^{12}$, $q^{11}$, $q^{12}$, $n^1$, $m^1$, and $L^1$ described above.

Preferable examples of the phosphorescent material include the following iridium complexes.

(I-1)

(I-2)

(I-3)

(I-4)

(I-5)

(I-6) 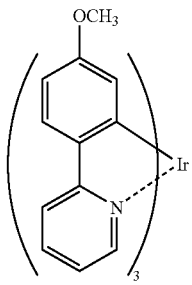

(I-7) 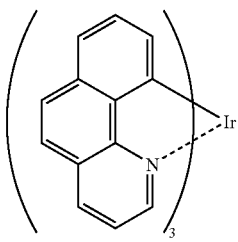

(I-8) 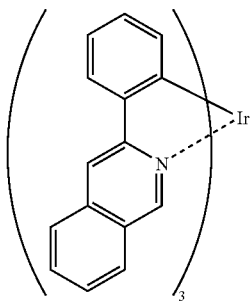

(I-9) 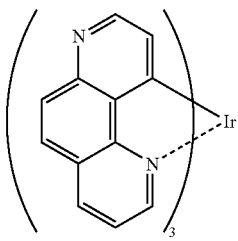

(I-10) 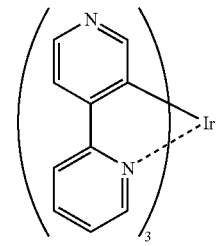

(I-11) 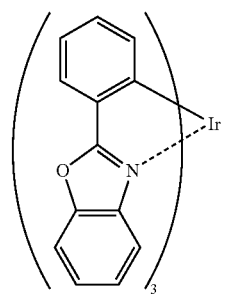

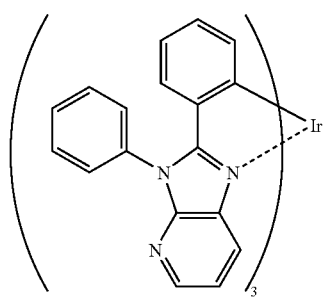
(I-12)
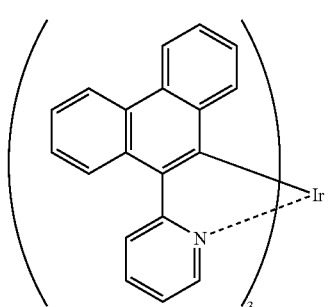
(I-13)
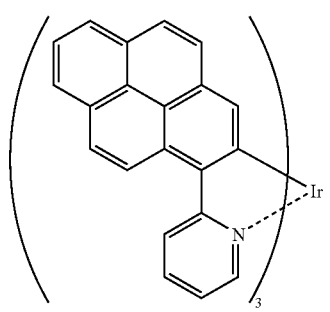
(I-14)
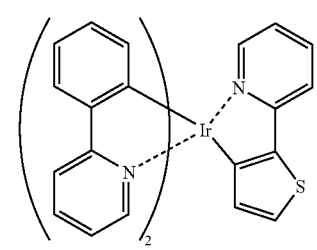
(I-15)
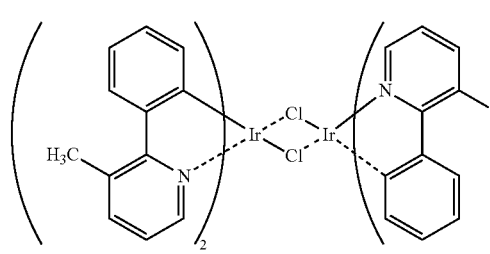
(I-16)
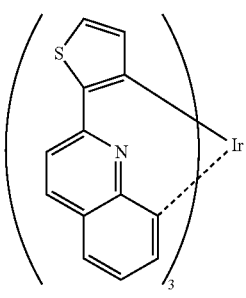
(I-17)
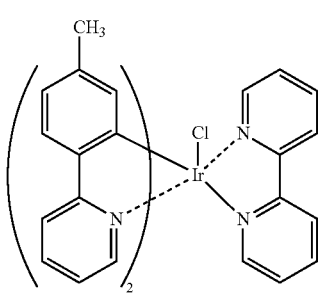
(I-18)
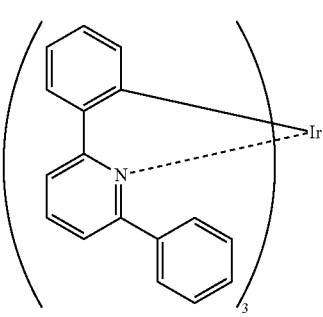
(I-19)
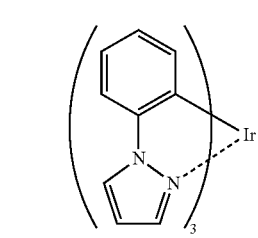
(I-20)
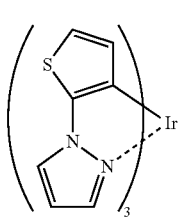
(I-21)
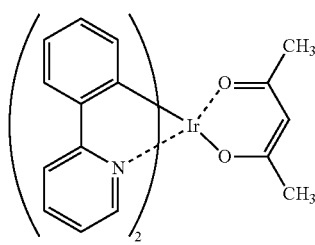
(I-22)

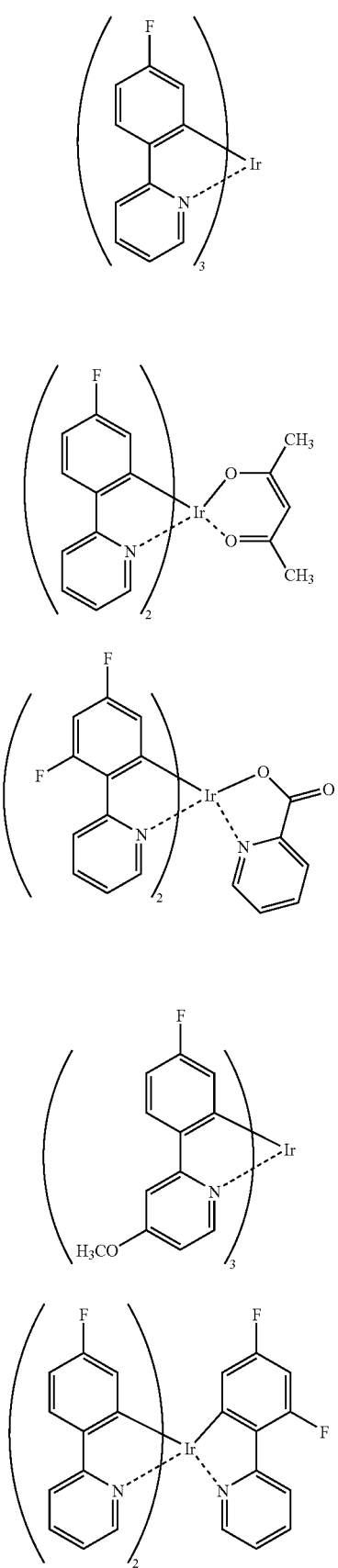

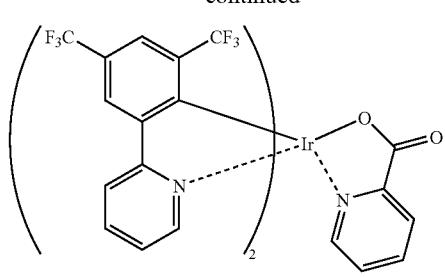

(I-33)

(I-34)

The organic EL device of the present invention is preferably obtained by adding a reducing dopant to an interfacial region between the cathode and the organic thin film layer.

An example of the reducing dopant is at least one kind selected from an alkali metal, an alkali metal complex, an alkali metal compound, an alkali earth metal, an alkali earth metal complex, an alkali earth metal compound, a rare earth metal, a rare earth metal complex, a rare earth metal compound, and the like.

Examples of the alkali metal include Na (the work function: 2.36 eV), K (the work function: 2.28 eV), Rb (the work function: 2.16 eV) and Cs (the work function: 1.95 eV). Alkali metals having a work function of 2.9 eV or smaller are preferable.

Of those alkali metals, K, Rb and Cs are preferable, Rb and Cs are more preferable, and Cs is the most preferable.

Examples of the alkaline earth metal include Ca (the work function: 2.9 eV), Sr (the work function: 2.0 to 2.5 eV) and Ba (the work function: 2.52 eV). Alkaline earth metals with a work function of 2.9 eV or smaller are preferable.

Examples of the rare earth metal include Sc, Y, Ce, Tb and Yb. Rare earth metals with a work function of 2.9 eV or smaller are preferable.

The preferable metals among the above metals have high reducing ability in particular, so that the luminance of the emitted light and the lifetime of the organic EL device can be increased by addition of the metals into the electron-injecting layer in a relatively small amount.

Examples of the alkali metal compound include alkali oxides such as $Li_2O$, $Cs_2O$ and $K_2O$ and alkali halides such as LiF, NaF, CsF and KF. Of those compounds, alkali oxides or alkali fluorides such as LiF, $Li_2O$ and NaF is preferable.

Examples of the alkaline earth metal compound include BaO, SrO, CaO and mixtures thereof such as $Ba_xSr_{1-x}O$ ($0<x<1$) and $Ba_xCa_{1-x}O$ ($0<x<1$). Of those compounds, BaO, SrO and CaO are preferable.

Examples of the rare earth metal compound include $YbF_3$, $ScF_3$, $ScO_3$, $Y_2O_3$, $Ce_2O_3$, $GdF_3$ and $TbF_3$. Of those compounds, $YbF_3$, $ScF_3$ and $TbF_3$ are preferable.

The alkali metal complex, the alkaline earth metal complex and the rare earth metal complex are not particularly limited as long as the complexes contain at least one of the alkali metal ions, the alkaline earth metal ions and rare earth metal ions, respectively, as the metal ion.

As the ligand, quinolinol, benzoquinolinol, acridinol, phenanthridinol, hydroxyphenyloxazole, hydroxyphenylthiazole, hydroxydiaryloxadiazoles, hydroxydiarylthiadiazoles, hydroxyphenylpyridine, hydroxyphenylbenzimidazole, hydroxybenzotriazole, hydroxyflavone, bipyridyl, phenanthroline, phthalocyanine, porphyrin, cyclopentadiene, β-diketones, azomethines and derivatives of those compounds are preferable. However, the ligand is not limited to the ligands described above.

As for the addition form of the reducing dopant, it is preferable that the reducing dopant be added in a manner such that a layer or islands are formed in the interfacial region described above.

As the process for adding the reducing dopant, it is preferable that an organic substance which is the light-emitting material or the electron-injecting material forming the interfacial region be vaporized while the reducing dopant is simultaneously vapor deposited in accordance with the resistance heating deposition method so that the reducing dopant is dispersed in the organic material.

The concentration of the dispersion expressed as the ratio of the amounts by mole of the organic substance to the reducing dopant is in the range of 100:1 to 1:100 and preferably in the range of 5:1 to 1:5.

When the reducing dopant is added to form a layer, the reducing dopant alone is vapor deposited in accordance with the resistance heating deposition method to form a layer preferably having a thickness of 0.1 to 15 nm after a layer of the organic material such as the light-emitting material and the electron-injecting material is formed as the interfacial region.

When the reducing dopant is added to form islands, the reducing dopant alone is vapor deposited in accordance with the resistance heating deposition method to form islands preferably having a thickness of 0.1 to 15 nm after islands of the organic material such as the light-emitting material and the electron-injecting material were formed as the interfacial region.

It is preferable that the relative amounts by mole of the main component and the reducing dopant of the organic EL device of the present invention be in the range of 5:1 to 1:5 and more preferably in the range of 2:1 to 1:2.

It is preferable that the organic EL device of the present invention comprises an electron-injecting layer between the light-emitting layer and the cathode, and the electron-injecting layer has a nitrogen-containing ring derivative as an essential component.

An aromatic heterocyclic compound having one or more hetero atoms in a molecule of the compound is preferably used as an electron-transporting material for use in the electron-injecting layer, and a nitrogen-containing ring derivative is particularly preferable.

A preferable example of the nitrogen-containing ring derivative is one represented by a following general formula (A):

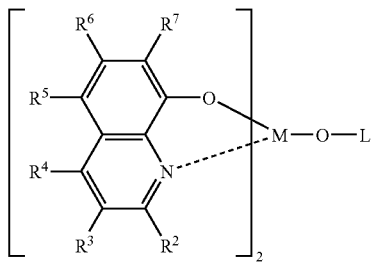
(A)

In the general formula (A), $R^2$ to $R^7$ each independently represent a hydrogen atom, a halogen atom, an oxy group, an amino group, or a hydrocarbon group having 1 to 40 carbon atoms, and each of them may be substituted.

Examples of the halogen atom include the same examples as the foregoing description about the halogen atom. In addition, examples of an amino group which may be substituted include the same groups as the foregoing description about the alkylamino group, the arylamino group and the aralkylamino group.

Examples of the hydrocarbon group having 1 to 40 carbon atoms include a substituted or unsubstituted alkyl group, alkenyl group, cycloalkyl group, alkoxy group, aryl group, heterocyclic group, aralkyl group, aryloxy group, and alkoxycarbonyl group. Examples of the alkyl group, alkenyl group, cycloalkyl group, alkoxy group, aryl group, heterocyclic group, aralkyl group, or aryloxy group include the same groups as those described above. The alkoxycarbonyl group is represented by —COOY', and examples of Y' include the same examples as those of the alkyl group.

M represents aluminum (Al), gallium (Ga) or indium (In), and preferably represents In.

In the general formula (A), L represents a group expressed by the following general formula (A') or (A"):

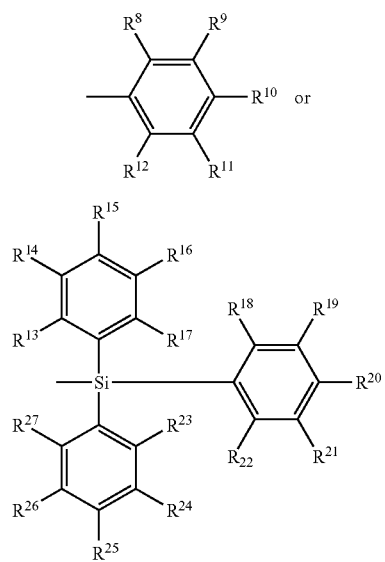

(A')

or (A")

wherein $R^8$ to $R^{12}$ each independently represent a hydrogen atom or a substituted or unsubstituted hydrocarbon group having 1 to 40 carbon atoms, adjacent groups represented by $R^8$ to $R^{12}$ may bond each other to form a cyclic structure, $R^{13}$ to $R^{27}$ each independently represent a hydrogen atom or a substituted or unsubstituted hydrocarbon group having 1 to 40 carbon atoms, and adjacent groups represented by $R^{13}$ to $R^{27}$ may bond to each other to form a cyclic structure.

Examples of the hydrocarbon group having 1 to 40 carbon atoms which is represented by $R^8$ to $R^{12}$, and $R^{13}$ to $R^{27}$ each in the general formulae (A') and (A") respectively include the groups described above as the specific examples of the group represented by $R^2$ to $R^7$ in the general formula (A).

Examples of a divalent group in the cyclic structure formed by bonding of the adjacent groups represented by $R^8$ to $R^{12}$, or groups represented by $R^{13}$ to $R^{27}$ include a tetramethylene group, pentamethylene group, hexamethylene group, diphenylmethan-2,2'-diyl group, diphenylethan-3,3'-diyl group, and diphenylpropan-4,4'-yl group.

Specific examples of the metal chelate complex of the nitrogen-containing ring atom which is represented by the general formula (A) are shown in the following. However, the metal chelate complex is not limited to the compounds shown as the examples.

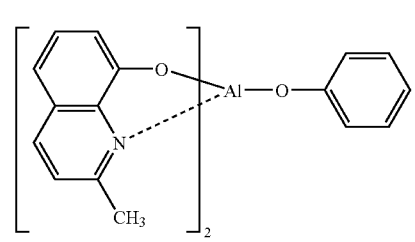
(A-1)

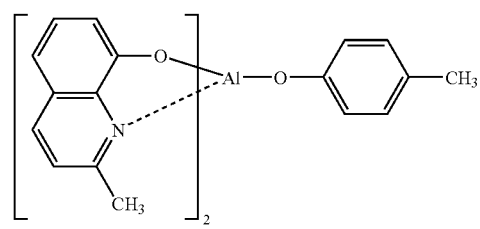
(A-2)

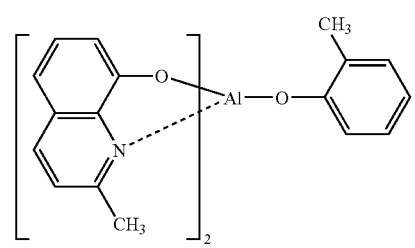
(A-3)

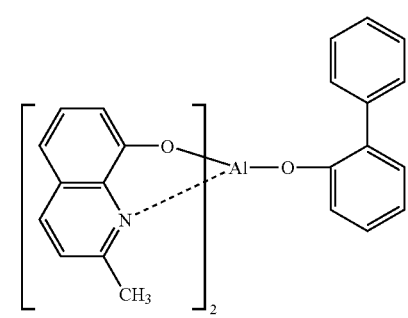
(A-4)

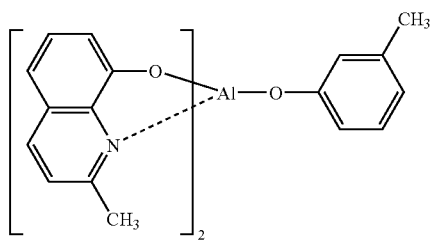
(A-5)
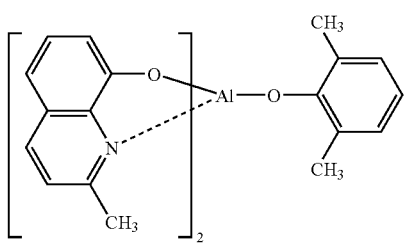
(A-11)
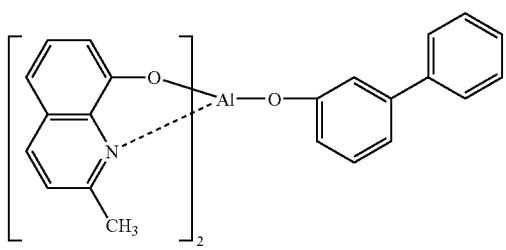
(A-6)
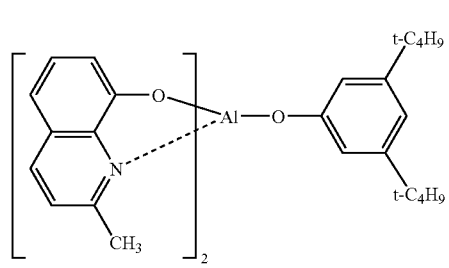
(A-12)
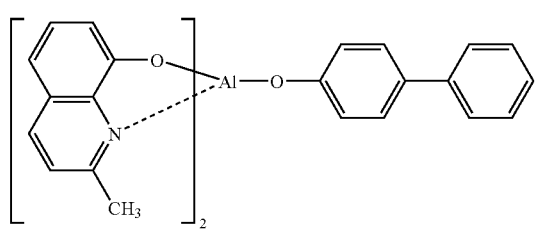
(A-7)
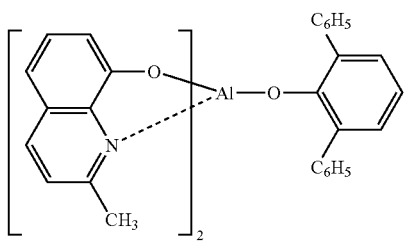
(A-13)
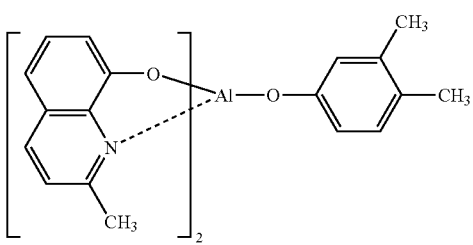
(A-8)
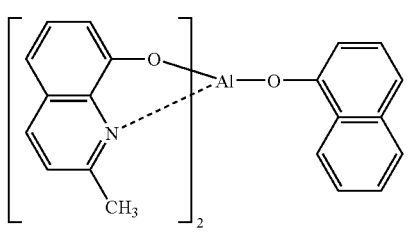
(A-14)
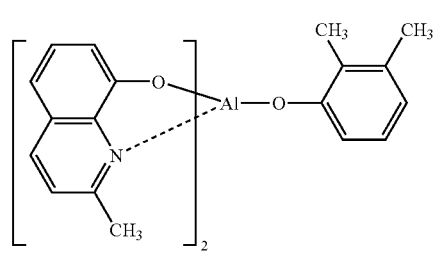
(A-9)
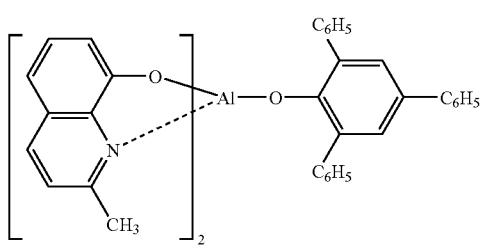
(A-15)
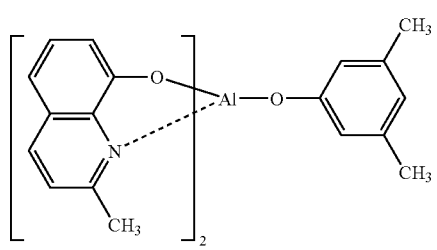
(A-10)
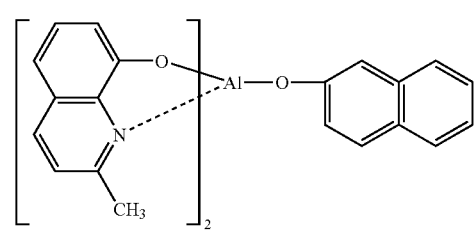
(A-16)

(A-17) 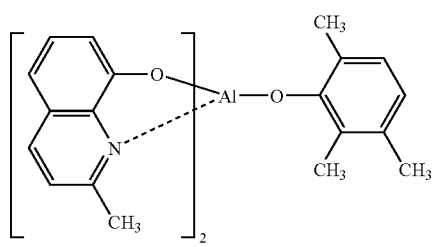
(A-18) 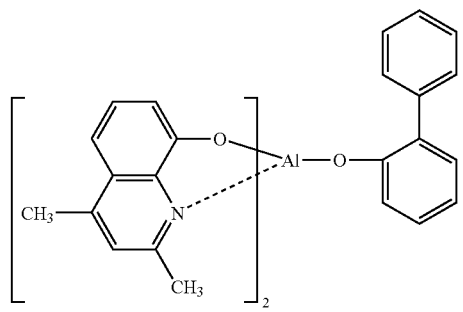
(A-19) 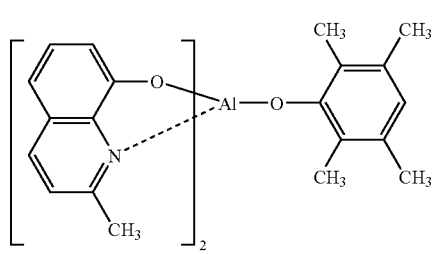
(A-20) 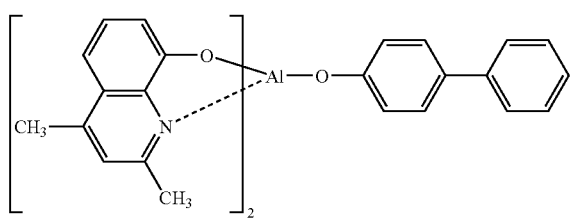
(A-21) 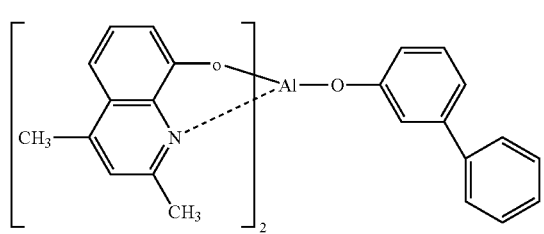
(A-22) 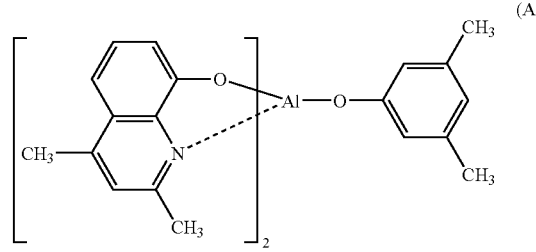
(A-23) 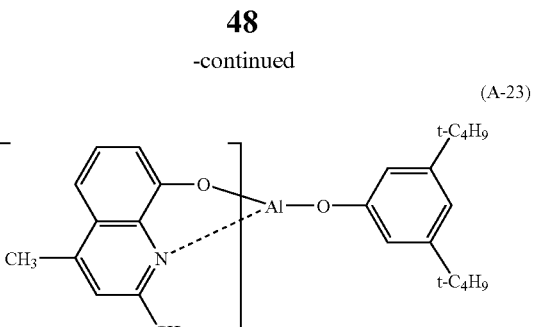
(A-24) 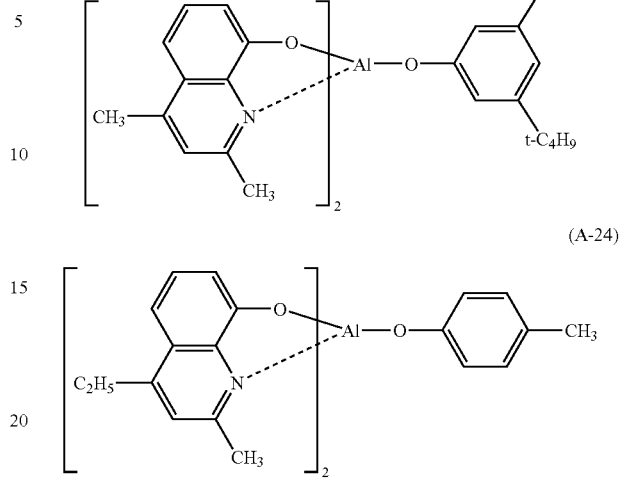
(A-25) 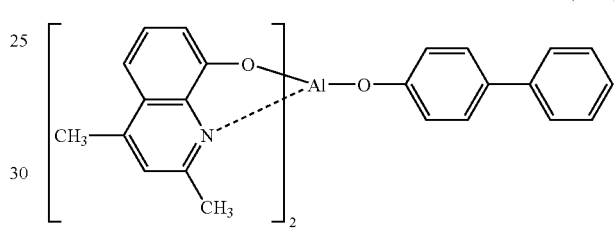
(A-26) 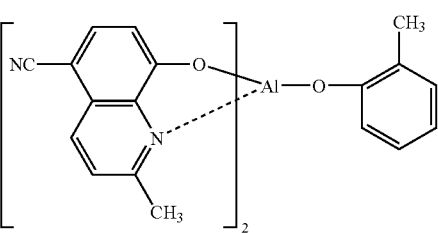
(A-27) 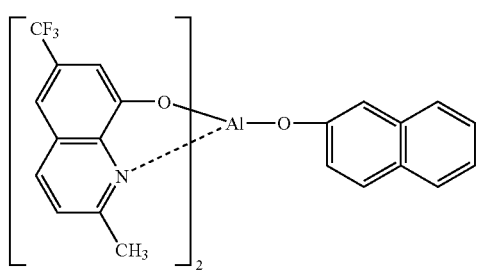
(A-28) 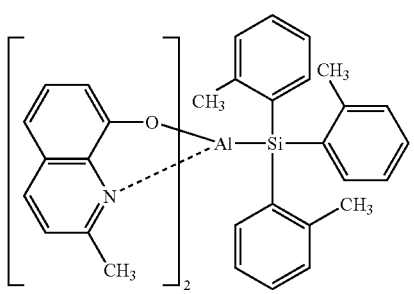

(A-29) 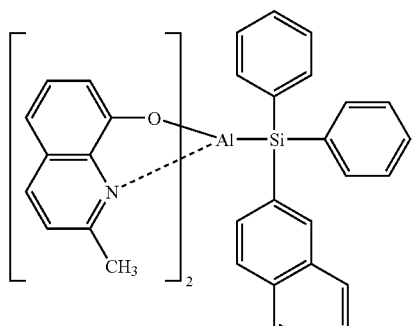

(A-30) 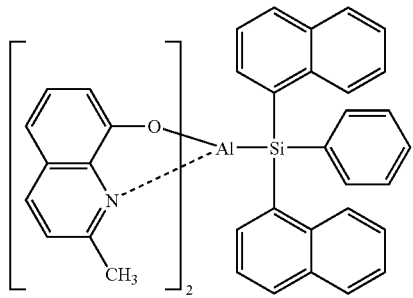

(A-31) 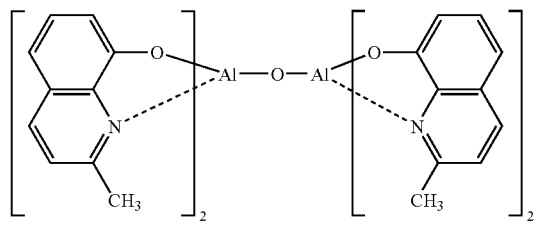

(A-32) 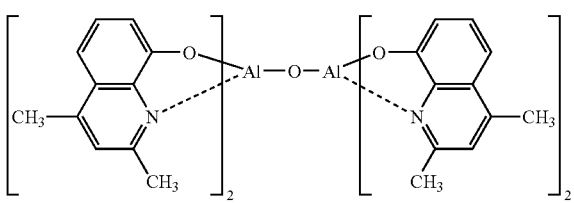

(A-33) 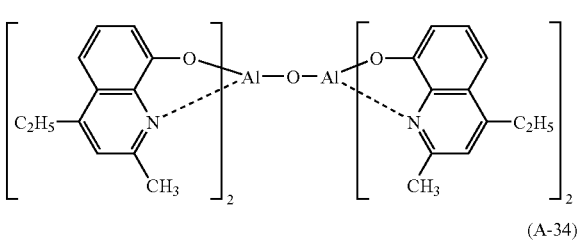

(A-34) 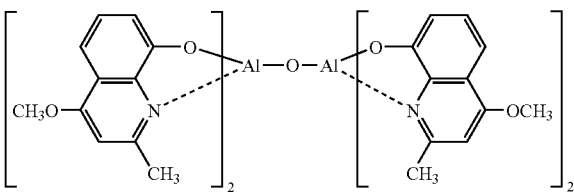

(A-35) 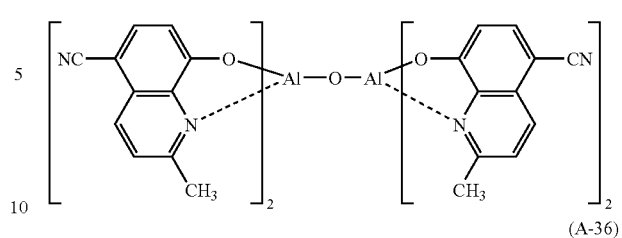

(A-36) 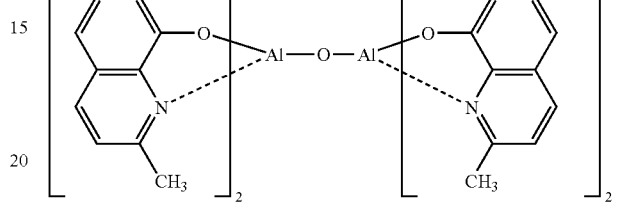

A nitrogen-containing five-membered cyclic derivative is also preferable for the nitrogen atom-containing derivative as an essential component of the electron-injecting layer. Examples of the nitrogen-containing five-membered ring include an imidazole ring, triazole ring, tetrazole ring, oxadiazole ring, thiadiazole ring, oxatriazole ring, and thiatriazole ring. Examples of the nitrogen-containing five-membered cyclic derivative include a benzimidazole ring, benzotriazole ring, pyrimidinoimidazole ring, pyridinoimidazole ring, and pyridazinoimidazole ring, and particularly preferably one represented by the following general formula (B).

(B) 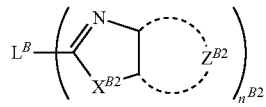

In the general formula (B), $L^B$ represents a linking group having a valence of two or greater, examples of which include a carbon atom, silicon atom, nitrogen atom, boron atom, oxygen atom, sulfur atom, a metal such as barium, and beryllium, an aromatic hydrocarbon group, and a aromatic heterocyclic group. Of those atoms, and groups, a carbon atom, nitrogen atom, silicon atom, boron atom, oxygen atom, sulfur atom, aryl group, and aromatic heterocyclic group are preferable, and a carbon atom, silicon atom, aryl group, and aromatic heterocyclic group are more preferable.

The aryl group and the aromatic heterocyclic group represented by $L^B$ may have a substituent. As the substituent, an alkyl group, alkenyl group, alkynyl group, aryl group, amino group, alkoxyl group, aryloxyl group, acyl group, alkoxycarbonyl group, aryloxycarbonyl group, acyloxyl group, acylamino group, alkoxycarbonylamino group, aryloxycarbonylamino group, sulfonylamino group, sulfamoyl group, carbamoyl group, alkylthio group, arylthio group, sulfonyl group, halogen atom, cyano group, and aromatic heterocyclic group are preferable. An alkyl group, aryl group, alkoxyl group, aryloxyl group, halogen atom, cyano group, and aromatic heterocyclic group are more preferable. An alkyl group, aryl group, alkoxyl group, aryloxyl group, and aromatic heterocyclic group are still more preferable, and an alkyl group, aryl group, alkoxyl group, and aromatic heterocyclic group are particularly preferable.

Specific examples of the group represented by $L^B$ include the group shown in the following.

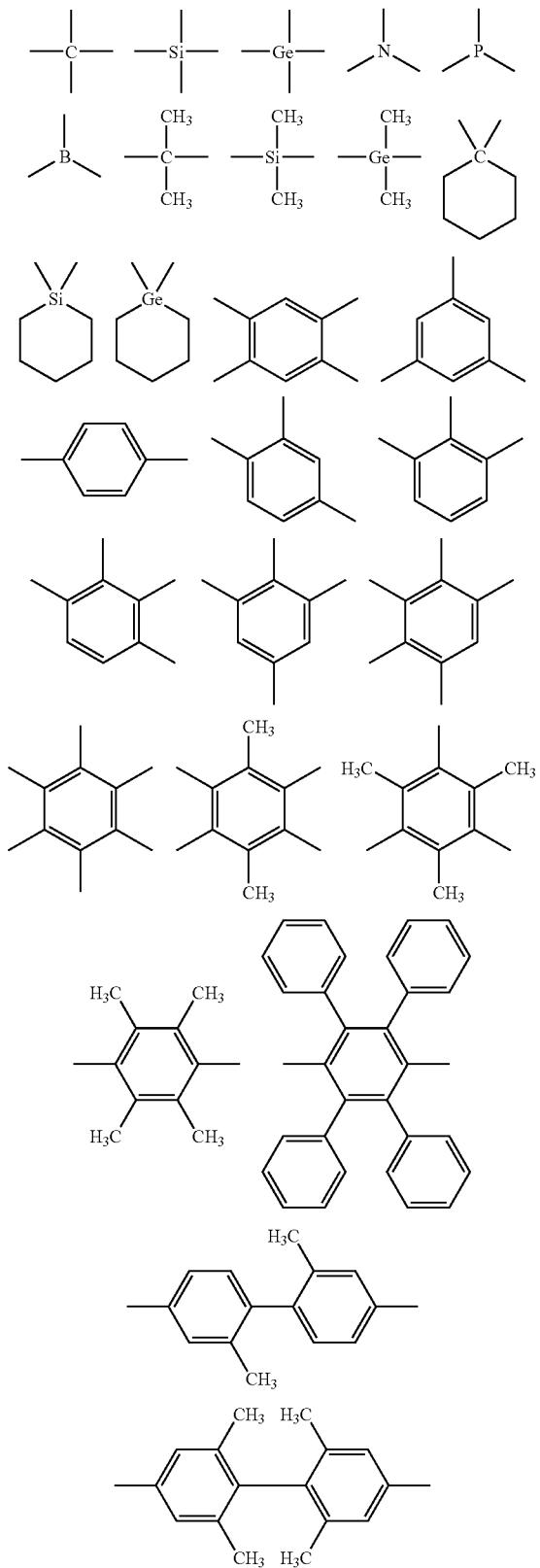

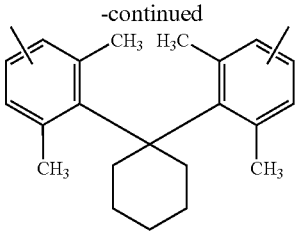

$X^{B2}$ in the general formula (B) represents —O—, —S— or =N—$R^{B2}$. $R^{B2}$ represents a hydrogen atom, an aliphatic hydrocarbon group, an aryl group, or a heterocyclic group.

The aliphatic hydrocarbon group represented by $R^{B2}$ is a linear, branched or cyclic alkyl group (an alkyl group preferably having 1 to 20 carbon atoms, more preferably having 1 to 12 carbon atoms, and particularly preferably having 1 to 8 carbon atoms, such as a methyl group, ethyl group, iso-propyl group, tert-butyl group, n-octyl group, n-decyl group, n-hexadecyl group, cyclopropyl group, cyclopentyl group, and cyclohexyl group), an alkenyl group (an alkenyl group preferably having 2 to 20 carbon atoms, more preferably having 2 to 12 carbon atoms, and particularly preferably having 2 to 8 carbon atoms, such as a vinyl group, allyl group, 2-butenyl group, and 3-pentenyl group), or an alkynyl group (an alkynyl group preferably having 2 to 20 carbon atoms, more preferably having 2 to 12 carbon atoms, and particularly preferably having 2 to 8 carbon atoms, such as a propargyl group, and 3-pentynyl group). An alkyl group is preferable of those groups.

The aryl group represented by $R^{B2}$ is a group having a single ring or a condensed ring, which is an aryl group preferably having 6 to 30 carbon atoms, more preferably having 6 to 20 carbon atoms, and particularly preferably having 6 to 12 carbon atoms, such as a phenyl group, 2-methylphenyl group, 3-methylphenyl group, 4-methylphenyl group, 2-methoxyphenyl group, 3-trifluoromethylphenyl group, pentafluorophenyl group, 1-naphthyl group, and 2-naphthyl group.

The heterocyclic group represented by $R^{B2}$ has a single ring or a condensed ring, preferably has 1 to 20 carbon atoms, more preferably having 1 to 12 carbon atoms, and most preferably having 2 to 10 carbon atoms, and is preferably an aromatic heterocyclic group having at least one of a nitrogen atom, oxygen atom, sulfur atom, and selenium atom. Examples of the heterocyclic group include a group derived from pyrrolidine, piperidine, piperazine, morpholine, thiophene, selenophene, furan, pyrrol, imidazole, pyrazole, pyridine, pyrazine, pyridazine, pyrimidine, triazole, triazine, indole, indazole, purine, thiazoline, thiazole, thiadiazole, oxazoline, oxazole, oxadiazole, quinoline, isoquinoline, phthalazine, naphthylidine, quinoxaline, quinazoline, cinnoline, puteridine, acridine, phenanthroline, phenazine, tetrazole, benzoimidazole, benzoxazole, benzothiazole, benzotriazole, tetrazaindene, carbazole, and azepine. A group derived from furan, thiophene, pyridine, pyrazine, pyrimidine, pyridazine, triazine, quinoline, phthalazine, naphthylidine, quinoxaline, and quinazoline are preferable, and the group derived from quinoline is more preferable.

The aliphatic hydrocarbon group, the aryl group, and the heterocyclic group which are represented by $R^{B2}$ may have a substituent. Examples of the substituent include the substituent described as the examples of the substituent to the group represented by $L^B$. Preferable examples of the substituent include the substituent described as the preferable examples of the substituent to the group represented by $L^B$.

It is preferable that $R^{B2}$ represents an aliphatic hydrocarbon group, an aryl group or a heterocyclic group. It is more preferable that $R^{B2}$ represents an aliphatic hydrocarbon group (preferably having 6 to 30 carbon atoms, more preferably having 6 to 20 carbon atoms, and still more preferably having 6 to 12 carbon atoms) or an aryl group. It is still more preferable that $R^{B2}$ represents an aliphatic hydrocarbon group (preferably having 1 to 20 carbon atoms, more preferably having 1 to 12 carbon atoms, and still more preferably having 2 to 10 carbon atoms).

It is preferable that $X^{B2}$ represents —O— or =N—$R^{B2}$ particularly preferably =N—$R^{B2}$.

$Z^{B2}$ represents a group of atoms necessary for forming an aromatic ring. The aromatic ring formed with the group of atoms represented by $Z^{B2}$ may be any of an aromatic hydrocarbon ring, and an aromatic heterocyclic ring. Examples of the aromatic ring include a benzene ring, pyridine ring, pyrazine ring, pyrimidine ring, pyridazine ring, triazine ring, pyrrol ring, furan ring, thiophene ring, selenophene ring, tellurophene ring, imidazole ring, thiazole ring, selenazole ring, tellurazole ring, thiadiazole ring, oxadiazole ring, and pyrazole ring. Of those rings, a benzene ring, pyridine ring, pyrazine ring, pyrimidine ring, and pyridazine ring are preferable, and a benzene ring, pyridine ring, and pyrazine ring are more preferable. A benzene ring and pyridine ring are still more preferable, and a pyridine ring is particularly preferable.

The aromatic ring formed with the group of atoms represented by $Z^{B2}$ may form a condensed ring with another ring, and may have a substituent. Examples of the substituent include the substituent described as the examples of the substituent to the group represented by $L^B$. As the substituent, an alkyl group, alkenyl group, alkynyl group, aryl group, amino group, alkoxyl group, aryloxyl group, acyl group, alkoxycarbonyl group, aryloxycarbonyl group, acyloxyl group, acylamino group, alkoxycarbonylamino group, aryloxycarbonylamino group, sulfonylamino group, sulfamoyl group, carbamoyl group, alkylthio group, arylthio group, sulfonyl group, halogen atom, cyano group, and heterocyclic group are preferable. An alkyl group, aryl group, alkoxyl group, aryloxyl group, halogen atom, cyano group, and heterocyclic group are more preferable. An alkyl group, aryl group, alkoxyl group, aryloxyl group, and aromatic heterocyclic group are still more preferable, and an alkyl group, aryl group, alkoxyl group, and aromatic heterocyclic group are particularly preferable.

$n^{B2}$ represents an integer of 1 to 4 and preferably 2 to 3.

Of the five-membered ring derivatives having nitrogen atom which are represented by the general formula (B) shown above, ring derivatives represented by the following general formula (B') are more preferable.

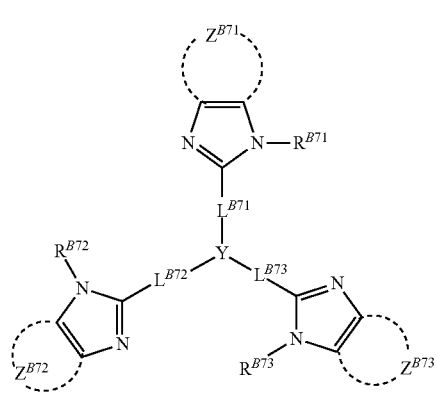

(B')

In the general formula (B'), $R^{B71}$, $R^{B72}$, and $R^{B73}$ each represent the same atom or group as those represented by $R^{B2}$ in the general formula (B). Preferable examples of the group represented by $R^{B71}$, $R^{B72}$, and $R^{B73}$ include the group described as the preferable examples of the groups represented by $R^{B2}$ in the general formula (B).

$Z^{B71}$, $Z^{B72}$, and $Z^{B73}$ each represent the same atom or group as those represented by $Z^{B2}$ in the general formula (B). Preferable examples of the group represented by $Z^{B71}$, $Z^{B72}$, and $Z^{Z73}$ include the group described as the preferable examples of the group represented by $Z^{B2}$ in the general formula (B).

$L^{B71}$, $L^{B72}$, and $L^{B73}$ each represent a linking group, examples of which include the linking group described as the examples of the divalent linking group represented by $L^B$ in the general formula (B). It is preferable that the linking group is a single bond, a divalent aromatic hydrocarbon ring group, a divalent aromatic heterocyclic group or a combination of these groups, and more preferably a single bond. The linking group represented by $L^{B71}$, $L^{B72}$, and $L^{B73}$ may have a substituent. Examples of the substituent include the substituents described as the examples of the substituent to the group represented by $L^B$ in the general formula (B). Preferable examples of the substituent include the substituent described as the preferable examples of the substituent to the group represented by $L^B$ in the general formula (B).

Y represents nitrogen atom, 1,3,5-benzentriyl group or 2,4,6-triazintriyl group. 1,3,5-benzentriyl group may have a substituent at 2,4,6-positions. Examples of the substituent include an alkyl group, aromatic hydrocarbon cyclic group, and halogen atom.

Specific examples of the five-membered nitrogen-containing ring derivative represented by the general formula (B) and (B') are shown in the following. However, the five-membered nitrogen-containing ring derivative is not limited to the compounds shown as the examples.

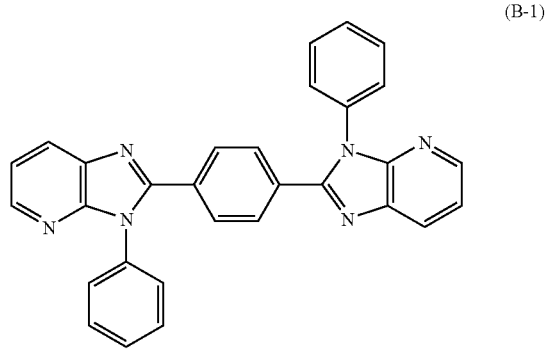

(B-1)

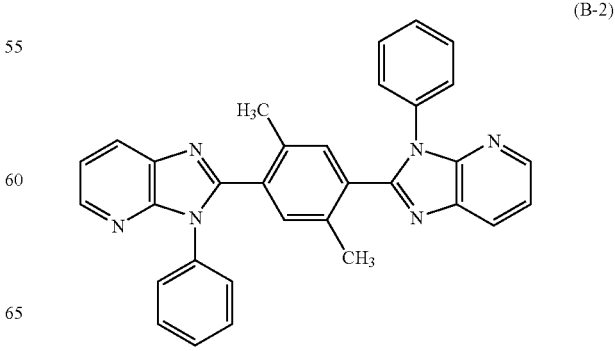

(B-2)

-continued
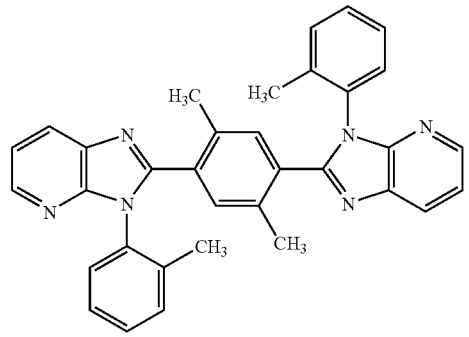
(B-3)
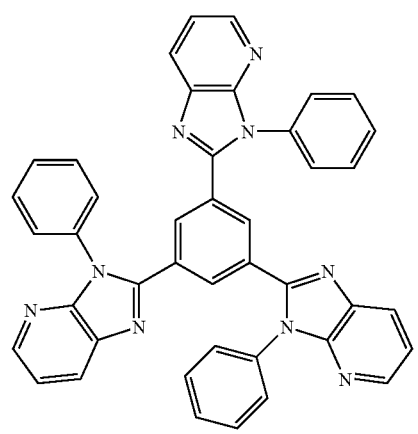
(B-4)
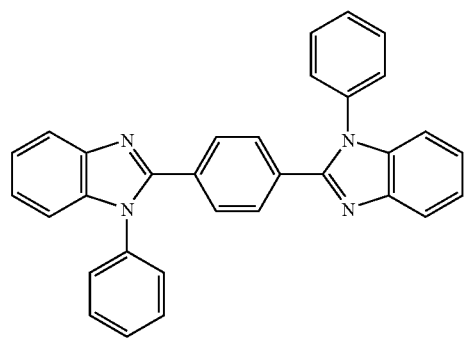
(B-5)
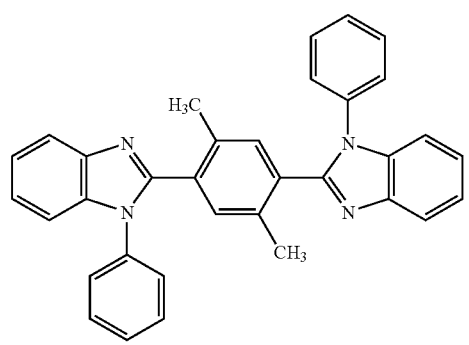
(B-6)
-continued
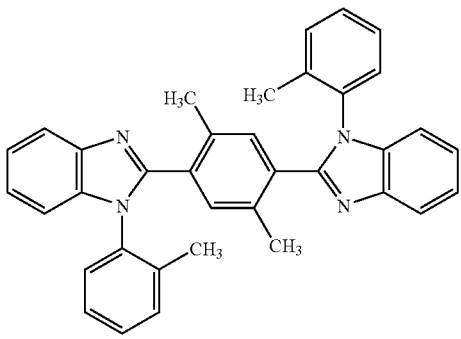
(B-7)
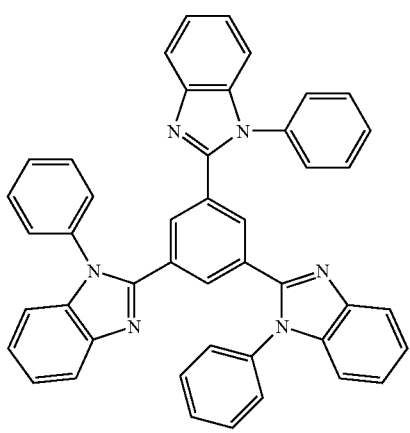
(B-8)
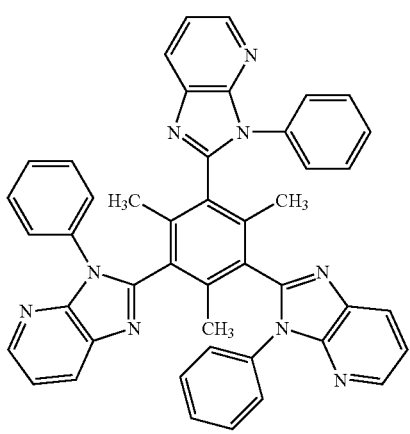
(B-9)
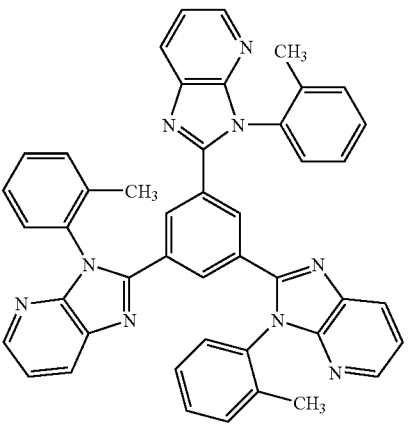
(B-10)

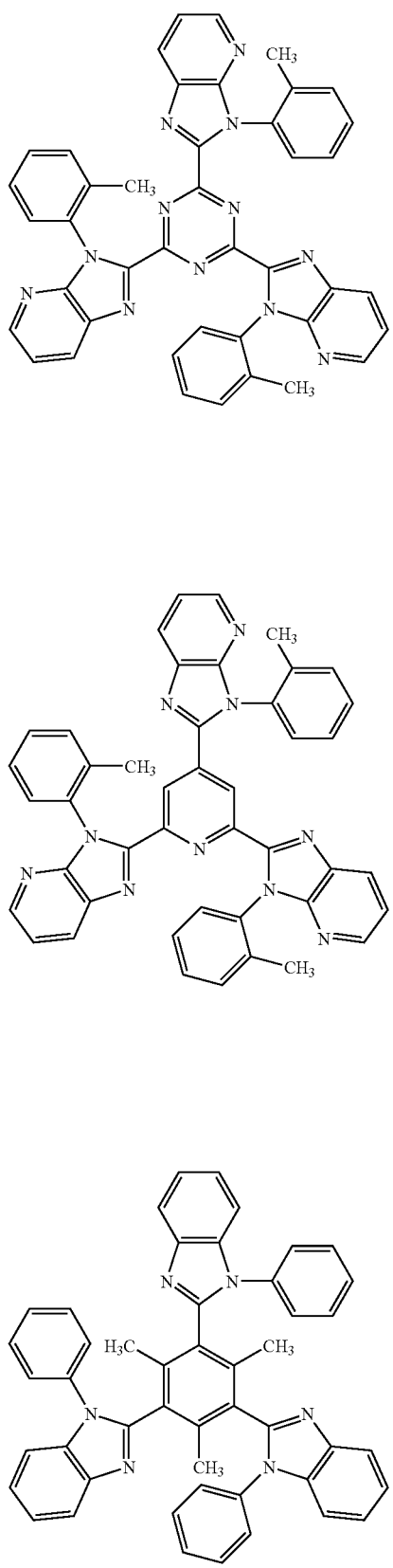

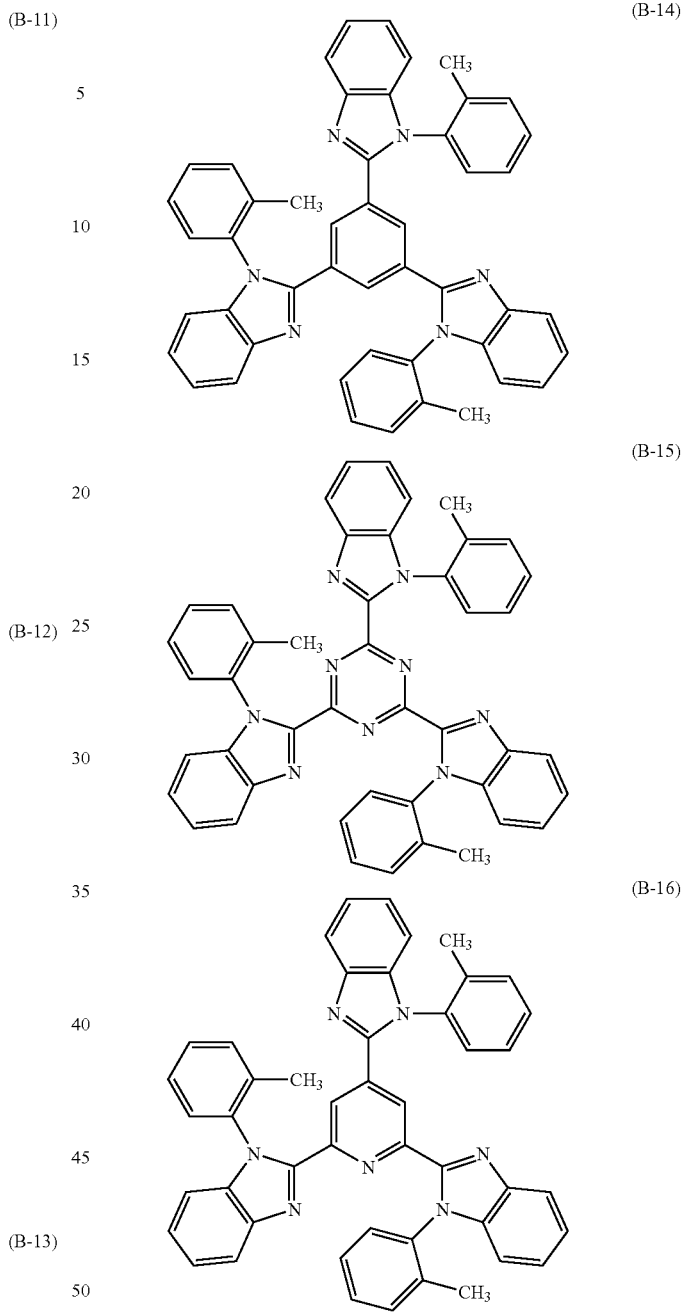

In addition to the nitrogen-containing ring derivative, an insulator or a semiconductor is preferably used as an inorganic compound serving as a component of the electron-injecting layer.

When the electron-injecting layer is constituted by an insulator or a semiconductor, a leak of electric current can be effectively prevented, and electron-injecting property can be improved.

It is preferable that at least one metal compound selected from the group consisting of alkali metal chalcogenides, alkaline earth metal chalcogenides, alkali metal halides, and alkaline earth metal halides is used as the insulating material.

It is preferable that the electron-injecting layer is constituted with the above alkali metal chalcogenide since the electron injecting property can be improved.

Specifically, preferable examples of the alkali metal chalcogenide include $Li_2O$, $LiO$, $Na_2S$, $Na_2Se$, and $NaO$. Preferable examples of the alkaline earth metal chalcogenide include $CaO$, $BaO$, $SrO$, $BeO$, $BaS$, and $CaSe$. Preferable examples of the alkali metal halide include $LiF$, $NaF$, $KF$, $LiCl$, $KCl$, and $NaCl$. Preferable examples of the alkaline earth metal halide include fluorides such as $CaF_2$, $BaF_2$, $SrF_2$, $MgF_2$, and $BeF_2$, and halides other than the fluorides.

Further, examples of the semiconductor include oxides, nitrides, and oxide nitrides containing at least one element selected from Ba, Ca, Sr, Yb, Al, Ga, In, Li, Na, Cd, Mg, Si, Ta, Sb, and Zn, which are used singly or in combination of two or more.

It is preferable that the inorganic compound constituting the electron-injecting layer is in the form of a fine crystalline or amorphous insulating thin film.

When the electron-injecting layer is constituted with the above insulating thin film, a more uniform thin film can be formed, and defective pixels such as dark spots can be decreased.

Examples of the inorganic compound include the alkali metal chalcogenides, the alkaline earth metal chalcogenides, the alkali metal halides, and the alkaline earth metal halides which are described above.

It is also preferable that the electron-injecting layer in the present invention contain the reducing dopant.

It is preferable that the organic EL device of the present invention have a hole-transporting layer between the light-emitting layer and the anode; and the hole-transporting layer comprises an arylamine derivative as an essential component.

A hole-transporting material to be incorporated into the hole-transporting layer has triplet energy of preferably 2.52 to 3.7 eV, or more preferably 2.8 to 3.7 eV.

The use of a hole-transporting material having triplet energy in such range can prevent the deactivation of the excitation energy of the light-emitting layer.

Any one of materials represented by the following general formulae (6) and (7) is preferable as the hole-transporting material:

(6)

wherein $Ar^7$ represents an aromatic group having 6 to 40 carbon atoms, $Ar^8$ and $Ar^9$ each represent a hydrogen atom or an aromatic group having 6 to 40 carbon atoms, and m represents an integer of 1 to 6;

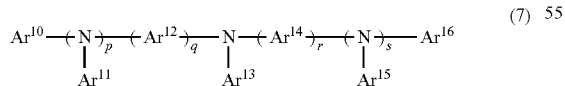

(7)

wherein $Ar^{10}$ and $Ar^{16}$ each represent an aromatic group having 6 to 40 carbon atoms, $Ar^{11}$ to $Ar^{15}$ each represent a hydrogen atom or an aromatic group having 6 to 40 carbon atoms, and condensation numbers p, q, r and s each represent 0 or 1.

In the general formulae (6) and (7), examples of a preferable aryl group having 5 to 40 ring atoms among the aromatic groups each having 6 to 40 carbon atoms include phenyl, naphthyl, anthranyl, phenanthryl, pyrenyl, colonyl, biphenyl, terphenyl, pyrrolyl, furanyl, thiophenyl, benzothiophenyl, oxadiazoryl, diphenylanthranyl, indolyl, carbazolyl, pyridyl, benzoquinolyl, fluoranthenyl, and acenaphthofluoranthenyl.

In addition, examples of a preferable arylene group having 5-40 ring atoms include phenylene, naphthylene, anthranylene, phenanthrylene, pyrenylene, colonylene, biphenylene, terphenylene, pyrrolylene, furanylene, thiophenylene, benzothiophenylene, oxadiazorylene, diphenylanthranylene, indolylene, carbazolylene, pyridylene, benzoquinolylene, fluoranthenylene, and acenaphthofluoranthenylene.

Further, the aromatic group having 6 to 40 carbon atoms may also be substituted by a substituent. Examples of a preferable substituent include an alkyl group having 1 to 6 carbon atoms such as an ethyl group, methyl group, i-propyl group, n-propyl group, s-butyl group, t-butyl group, pentyl group, hexyl group, cyclopentyl group, and cyclohexyl group; an alkoxy group having 1 to 6 carbon atoms such as an ethoxy group, methoxy group, i-propoxy group, n-propoxy group, s-butoxy group, t-butoxy group, pentoxy group, hexyloxy group, cyclopentoxy group, and cyclohexyloxy group; an aryl group having 5 to 40 ring atoms; an amino group substituted by an aryl group having 5 to 40 ring atoms; an ester group having an aryl group having 5 to 40 ring atoms; an ester group having an aryl group having 1 to 6 carbon atoms; a cyano group; a nitro group; and a halogen atom.

Furthermore, any one of materials represented by the following general formulae (8) to (10) is preferable as a hole-transporting material having triplet energy of 2.8 eV or more:

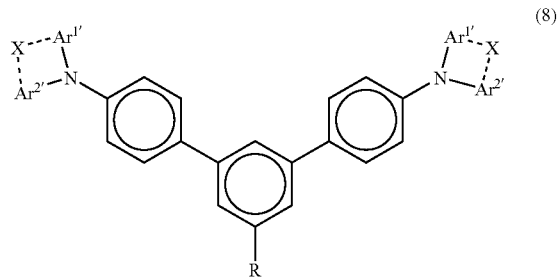

(8)

wherein $Ar^{1'}$ and $Ar^{2'}$ each represent an alkyl group having 1 to 6 carbon atoms, an alkoxy group, or an aryl group having 6 to 18 ring carbon atoms which may be substituted by a phenyl group, and R represents an alkyl group having 4 to 6 carbon atoms, an alkoxy group, or an aryl group having 6 to 18 ring carbon atoms. X represents a single bond, or a linking group expressed by —O— or —S—, and X may be present or absent:

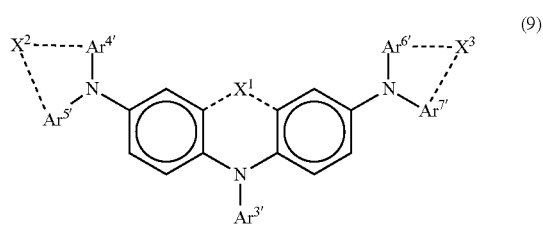

(9)

wherein $Ar^3$ represents an aryl group which has or does not have a substituent and which has 6 to 18 ring carbon atoms, $Ar^{4'}$ to $Ar^{7'}$ each represent an arylene group which has or does not have a substituent and which has 6 to 18 ring carbon atoms, $X^1$ represents a single bond, or a linking group expressed by —O—, —S—, —(CH$_2$)$_n$—, where n represents an integer of 1 to 6, or —C(CH$_3$)$_2$—, and those linking groups may be present or absent, and $X^2$ and $X^3$ each represent a single bond, or a linking group represented by —O—, —S—, —(CH$_2$)$_n$—, where n represents an integer of 1 to 6, or —C(CH$_3$)$_2$—, and they may be identical to or different from each other.

Specific examples of the respective groups and substituents represented by $Ar^{1'}$ to $Ar^{7'}$, R, X, and $X^1$ to $X^3$ in the general formulae (8) and (9) include: a carbazolyl group, an arylcarbazolyl group having 18 to 60 carbon atoms, an azacarbazolyl group, an arylazacarbazolyl group having 18 to 60 carbon atoms, an acridinyl group, a phenoxadinyl group, or a dibenzoazepinyl group each of which may be substituted; a substituted or unsubstituted aryl group having 6 to 60 carbon atoms, or a substituted or unsubstituted heterocyclic group having 3 to 60 carbon atoms; a divalent or trivalent, substituted or unsubstituted aromatic hydrocarbon group having 6 to 60 carbon atoms or substituted or unsubstituted heterocyclic group having 3 to 60 carbon atoms; and a substituted or unsubstituted benzene residue, a substituted or unsubstituted thiophene residue, a substituted or unsubstituted triazole residue, a substituted or unsubstituted fluorene residue, or a substituted or unsubstituted spirobifluorene residue.

(10)

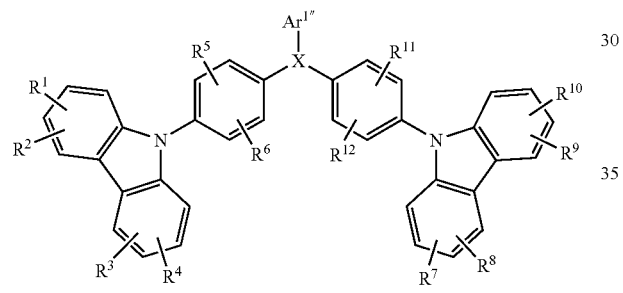

wherein $R^1$ to $R^{12}$ each independently represent a hydrogen atom, a halogen atom, an alkyl group, an aralkyl group, an alkenyl group, a cyano group, an amino group, an acyl group, an alkoxycarbonyl group, a carboxyl group, an alkoxy group, an alkylamino group, an aralkylamino group, a haloalkyl group, a hydroxyl group, an aryloxy group, an aromatic hydrocarbon ring group which may have a substituent, or an aromatic heterocyclic group which may have a substituent, and a couple of $R^1$ and $R^2$, a couple of $R^3$ and $R^4$, a couple of $R^5$ and $R^6$, a couple of $R^7$ and $R^8$, a couple of $R^9$ and $R^{10}$ or a couple of $R^{11}$ and $R^{12}$ may bond with those adjacent substituent each other to form a ring.

X represents any one of the following trivalent linking groups:

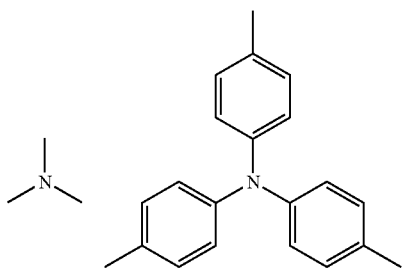

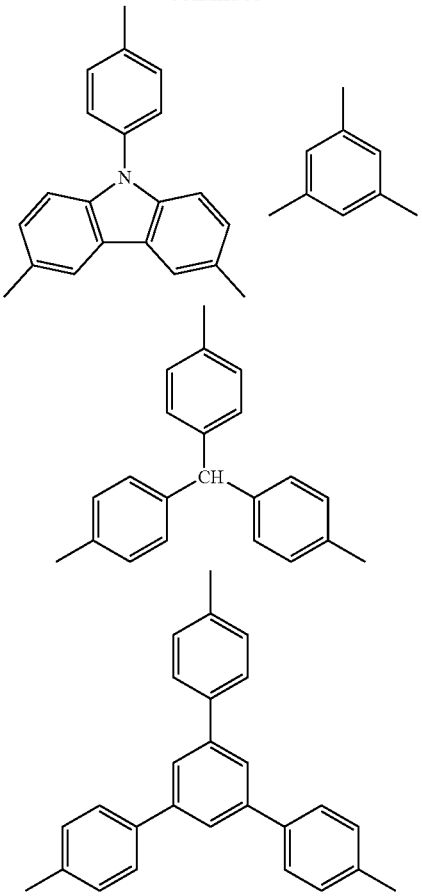

$Ar^{1'''}$ represents an aromatic hydrocarbon ring group which may have a substituent, an aromatic heterocyclic group which may have a substituent or a following general formula (11):

(11)

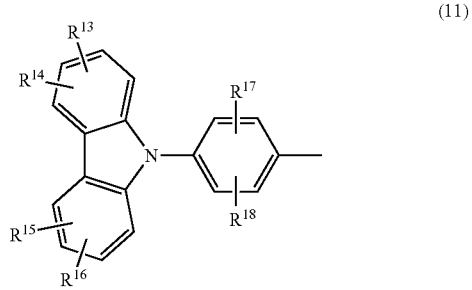

wherein $R^{13}$ to $R^{18}$ each independently represent a hydrogen atom, a halogen atom, an alkyl group, an aralkyl group, an alkenyl group, a cyano group, an amino group which may have a substituent, an acyl group, an alkoxycarbonyl group, a carboxyl group, an alkoxy group, an alkylamino group, an aralkylamino group, a haloalkyl group, a hydroxyl group, an aryloxy group, an aromatic hydrocarbon group which may have a substituent, or an aromatic heterocyclic group which may have a substituent, and a couple of $R^{13}$ and $R^{14}$, a couple of $R^{15}$ and $R^{16}$ or a couple of $R^{17}$ and $R^{18}$ may bond with the adjacent substituent each other to form a ring.

Specific examples of the respective groups and substituents represented by $Ar^{1'''}$ and $R^1$ to $R^{18}$ in the general formula (10)

include a carbazolyl group, an arylcarbazolyl group having 18 to 60 carbon atoms, an azacarbazolyl group, an arylazacarbazolyl group having 18 to 60 carbon atoms, an acridinyl group, a phenoxadinyl group, or a dibenzoazepinyl group each of which may be substituted; a substituted or unsubstituted aryl group having 6 to 60 carbon atoms, or a substituted or unsubstituted heterocyclic group having 3 to 60 carbon atoms; a divalent or trivalent, substituted or unsubstituted aromatic hydrocarbon group having 6 to 60 carbon atoms or substituted or unsubstituted heterocyclic group having 3 to 60 carbon atoms; and a substituted or unsubstituted benzene residue, a substituted or unsubstituted thiophene residue, a substituted or unsubstituted triazole residue, a substituted or unsubstituted fluorene residue, or a substituted or unsubstituted spirobifluorene residue.

In the present invention, the anode of the organic EL device serves to inject a hole into the hole-transporting layer or the light-emitting layer, and is effective when it has a work function of 4.5 eV or more.

Examples of the material which may be applied to the anode of the present invention include indium tin oxide alloys (ITO), tin oxides (NESA), gold, silver, platinum and copper.

Further, as the cathode, a material having a small work function is preferable so that electrons can be injected into the electron-injecting layer or the light-emitting layer.

The material of the cathode is not particularly limited. Examples of the material of the cathode which may be used include indium, aluminum, magnesium, magnesium-indium alloys, magnesium-aluminum alloys, aluminum-lithium alloys, aluminum-scandium-lithium alloys and magnesium-silver alloys.

The process for forming the layers in the organic EL device of the present invention is not particularly limited.

A conventional process such as a vacuum vapor deposition process or a spin coating process can be used.

The organic thin film layer comprising a compound represented by the following general formula (1) to be used in the organic EL device of the present invention can be formed in accordance with a vacuum vapor deposition process, a molecular beam epitaxy process (MBE process), or a conventional coating process such as a dipping process using a solution prepared by dissolving the compound into a solvent, a spin coating process, a casting process, a bar coating process, or a roller coating process.

The thickness of each layer in the organic thin film layer in the organic EL device of the present invention is not particularly limited. In general, an excessively thin layer tends to have defects such as pin holes, and an excessively thick layer requires a high applied voltage, which results in decreasing the efficiency. Therefore, a thickness within the range of several nanometers to 1 μm is preferable.

EXAMPLES

Next, the present invention will be described in more detail by using synthesis examples and examples. However, the present invention is not limited to these examples.

Synthesis Example 1

Synthesis of Compound (A-7')

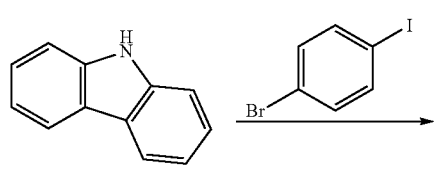

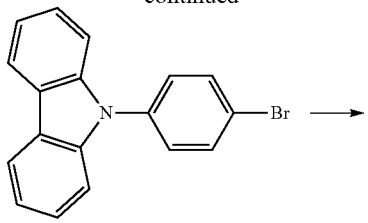

(IM-1)

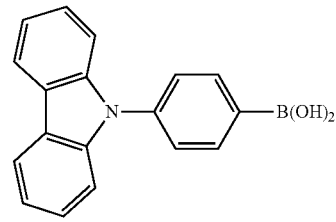

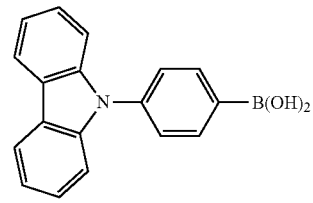

(IM-1)

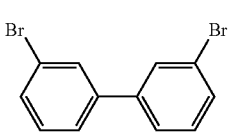

3,3'-dibromobiphenyl

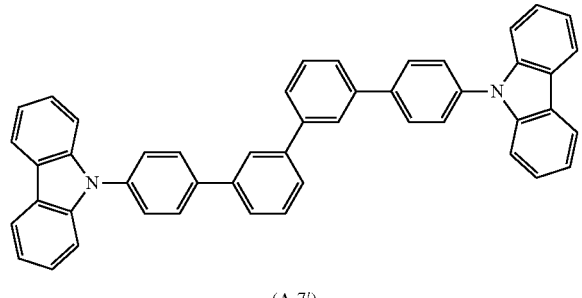

(A-7')

(1) Synthesis of Intermediate (IM-1)

25.4 g (90 mmol) of 4-bromoiodobenzene, 10.0 g (60 mmol) of carbazole, 0.1 g (0.5 mmol) of copper iodide, and 26.7 g (126 mmol) of potassium phosphate were suspended into 70 ml of 1,4-dioxane. Then, 0.7 ml (6 mmol) of trans-1,2-cyclohexanediamine was added to the suspension, and the whole was refluxed and heated in an argon atmosphere for 14 hours.

After the temperature of the reaction solution had been cooled to room temperature, methylene chloride and water were added to the solution to separate the solution into two layers. After that, an organic layer was sequentially washed with a 5% aqueous solution of hydrochloric acid and water, and was then dried with anhydrous sodium sulfate.

An organic solvent was distilled off under reduced pressure. After that, 50 ml of ethanol were added to the resultant, and the precipitated crystal was filtered and sequentially washed with ethanol and normal hexane. Thus, 17.8 g of p-bromophenylcarbazole were obtained (92% yield).

8.0 g (25 mmol) of p-bromophenylcarbazole were dissolved into a mixed solution of 50 ml of toluene and 50 ml of ether. Then, 21 ml (32 mmol) of a solution of normal butyllithium hexane (1.6 M) were added to the resultant in an argon atmosphere at −40° C., and the whole was stirred for 1 hour from −40° C. to 0° C.

Next, the temperature of the reaction solution was cooled to −70° C. Then, a solution prepared by diluting 17 ml (74 mmol) of triisopropyl borate with 25 ml of ether was dropped to the solution, and the whole was stirred at −70° C. for 1 hour. After that, the temperature of the resultant was increased to room temperature, and the resultant was stirred for 6 hours.

After the reaction solution had been left overnight, 70 ml of 5% hydrochloric acid were additionally dropped to the reaction solution, and the whole was stirred at room temperature for 45 minutes.

After the reaction solution had been separated into two layers, an organic layer was washed with a saturated salt solution and dried with anhydrous sodium sulfate.

An organic solvent was distilled off under reduced pressure. After that, the precipitated crystal was filtered and washed with a mixed solvent of toluene and normal hexane. Thus, 4.0 g of Intermediate (IM-1) were obtained (56% yield).

(2) Synthesis of Compound (A-7')

2.0 g (6.4 mmol) of 3,3'-dibromobiphenyl, 3.7 g (12.8 mmol) of Intermediate (IM-1), 300 mg (0.25 mmol) of tetrakistriphenylphosphinepalladium (0), 60 ml of dimethoxyethane (DME), and an aqueous solution of sodium carbonate [prepared by dissolving 4.0 g (38 mmol) of sodium carbonate into 35 ml of water] were loaded into a 200-ml flask under an argon atmosphere, and the whole was stirred at 78° C. for 18 hours.

After that, the temperature of the resultant was cooled to room temperature. Then, the precipitated crystal was filtered out and washed with water, methanol, and hexane. Thus, 4.0 g of a coarse crystal were obtained.

After having been purified with a silica gel column, the resultant was recrystallized with toluene. Thus, 1.2 g of a pale yellow crystal was obtained.

Next, the resultant was subjected to sublimation purification at 400° C. and 3.0×10⁻⁴ Pa. Thus, 820 mg (1.3 mmol, 20% yield) of a purified crystal (A-7') were obtained. A measurement of a field desorption mass spectrum (FD-MS) is shown below.

FD-MS: calcd for $C_{48}H_{32}N_2$=636, found, m/z=636 (100).

In addition, the result of HPLC (column: ODS-3V, mobile-phase: acetonitrile/tetrahydrofuran=85/15, detection UV wavelength: 254 nm, temperature: 40° C.) analysis showed that the resultant had a purity of 99.5%.

Foregoing, it was confirmed that the resultant crystal was a target substance.

Synthesis Example 2

Synthesis of Compound (A-16')

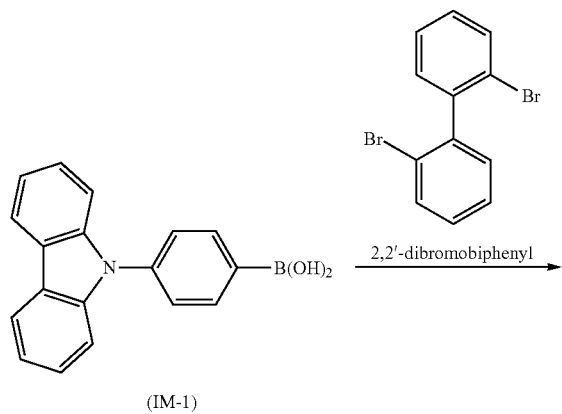

(IM-1)

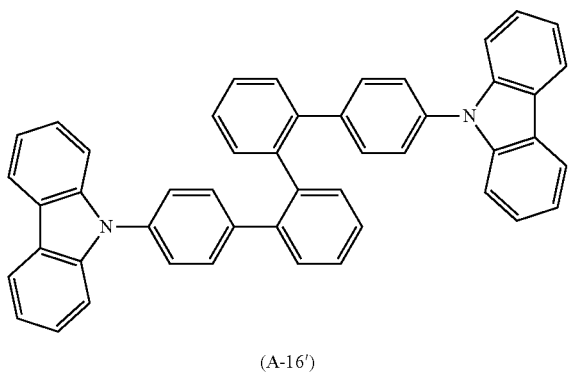

(A-16')

5.0 g (16.3 mmol) of 2,2'-dibromobiphenyl, 10.1 g (35.3 mmol) of Intermediate (IM-1), 740 mg (0.64 mmol) of tetrakistriphenylphosphinepalladium (0), 150 ml of dimethoxyethane (DME), and an aqueous solution of sodium carbonate [prepared by dissolving 10.2 g (96 mmol) of sodium carbonate into 120 ml of water] were loaded into a 500-ml flask under an argon atmosphere, and the whole was stirred at 78° C. for 15 hours.

After that, the temperature of the resultant was cooled to room temperature, and the precipitated crystal was filtered out.

The precipitated crystal was sequentially washed with water, methanol, and hexane, and was then recrystallized three times by using toluene. Thus, 6.9 g (10.8 mmol, 68% yield) of Compound (A-16') were obtained. A measurement of the FD-MS is shown below.

FD-MS: calcd for $C_{48}H_{32}N_2$=636, found, m/z=636 (100).

In addition, the result of HPLC (column: ODS-3V, mobile phase: acetonitrile/tetrahydrofuran=85/15, detection UV wavelength: 254 nm, temperature: 40° C.) analysis showed that the resultant had a purity of 99.9%.

Foregoing, it was confirmed that the resultant crystal was a target substance.

Synthesis Example 3

Synthesis of Compound (B-3')

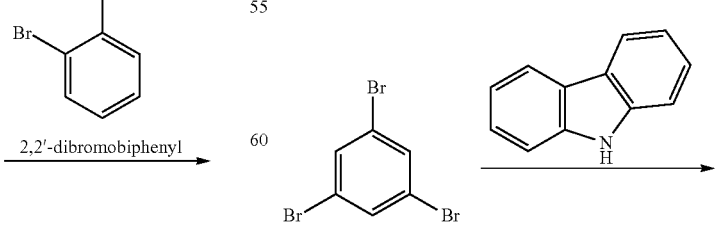

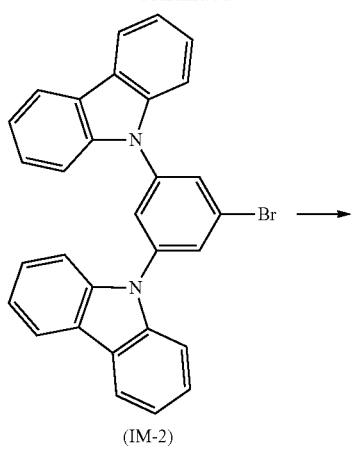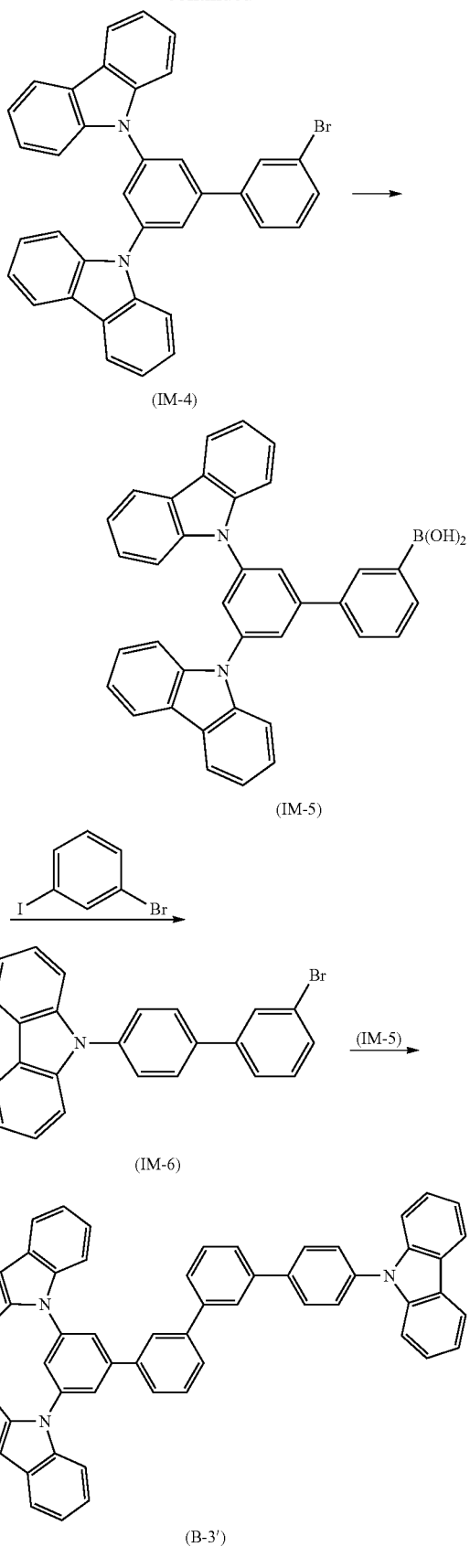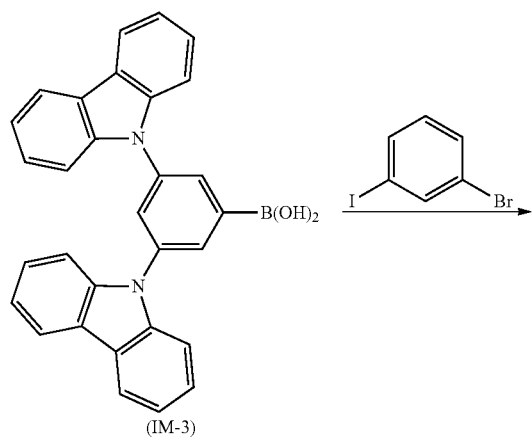

(1) Synthesis of Intermediate (IM-2)

70 g (0.22 mol) of 1,3,5-tribromobenzene, 73.6 g (0.44 mol) of carbazole, 4.2 g (22 mmol) of copper iodide, 187 g (0.88 mol) of potassium phosphate, 25 g (0.22 mol) of trans-1,2-cyclohexanediamine, and 700 ml of 1,4-dioxane were loaded into a 2-liter three-necked flask under an argon atmosphere, and the whole was stirred at 104° C. for 16 hours.

After that, the temperature of the resultant was cooled to room temperature, 600 ml of water were added to the resultant, and the whole was extracted with methylene chloride. After that, an organic layer was washed with water, dried with anhydrous magnesium sulfate, filtered out, and concentrated under reduced pressure until it was brought into a slurry state.

The resultant solid was filtered, and the filtrate was additionally concentrated under reduced pressure.

The residue was dissolved into 300 ml of toluene, and the whole was purified with a silica gel column. Thus, 22 g (45 mmol, 20% yield) of Intermediate (IM-2) were obtained. A measurement of the FD-MS is shown below.

FD-MS: calcd for $C_{30}H_{19}BrN_2$=487, found, m/z=488 (100), 486 (95).

(2) Synthesis of Intermediate (IM-3)

9.0 g (18 mmol) of Intermediate (IM-2) described above, 100 ml of dehydrated toluene, and 100 ml of dehydrated diethyl ether were loaded into a 300-ml three-necked flask under an argon atmosphere, and the temperature of the resultant was cooled to −10° C. while the resultant was stirred.

14.8 ml (23 mmol) of normal butyllithium (1.6 M hexane solution) were dropped to the resultant over 10 minutes.

After the resultant had been additionally stirred for 2 hours, a solution prepared by diluting 10.4 g (56 mmol) of triisopropyl borate with 25 ml of ether was dropped to the resultant over 20 minutes, and the whole was stirred at room temperature for 8 hours.

After that, the temperature of the resultant was cooled to 0° C., and dilute hydrochloric acid prepared by diluting 4 ml of concentrated hydrochloric acid with 100 ml of water was added to the resultant to make the resultant acidic.

Next, the resultant was sequentially washed with 100 ml of water and a saturated salt solution, and an organic layer was dried with anhydrous magnesium sulfate.

After the solution has been filtered, the solution was concentrated under reduced pressure, and the resultant viscous solid was dissolved into 30 ml of tetrahydrofuran (THF). Then, 100 ml of hexane were added to the solution, and the precipitated crystal was filtered under reduced pressure.

Furthermore, the filtrate was concentrated, and the resultant viscous substance was dissolved into THF. Then, hexane was added to the solution, and the whole was subjected to a similar operation. Thus, a total of 5.9 g (13 mmol, 71% yield) of Intermediate (IM-3) were obtained. A measurement of the FD-MS is shown below.

FD-MS: calcd for $C_{30}H_{21}BN_2O_2$=452, found, m/z=452 (100).

(3) Synthesis of Intermediate (IM-4)

5.0 g (18 mmol) of 1-bromo-3-iodobenzene, 8.1 g (18 mmol) of Intermediate (IM-3), 414 mg (0.36 mmol) of tetrakistriphenylphosphinepalladium (0) [Pd(PPh₃)₄], 100 ml of dimethoxyethane, and 58 g (54 mmol) of a 10-wt % aqueous solution of sodium carbonate were loaded into a 300-ml three-necked flask under an argon atmosphere, and the whole was stirred at 80° C. for 10 hours.

After the completion of the reaction, the temperature of the resultant was cooled to room temperature, and 100 ml of toluene were added to the resultant. An organic layer was sequentially washed with water and a saturated salt solution, dried with anhydrous magnesium sulfate, filtered, and concentrated under reduced pressure. Thus, a yellowish brown solid was obtained.

The resultant was purified with a silica gel column. Thus, 9.2 g (16 mmol, 88% yield) of Intermediate (IM-4) were obtained. A measurement of the FD-MS is shown below.

FD-MS: calcd for $C_{37}H_{27}BrN_2$=579, found, m/z=580 (100), 578 (90).

(4) Synthesis of Intermediate (IM-5)

6.0 g (10 mmol) of Intermediate (IM-4), 70 ml of dehydrated toluene, and 70 ml of dehydrated diethyl ether were loaded into a 300-ml three-necked flask under an argon atmosphere, and the temperature of the resultant was cooled to −10° C. while the resultant was stirred.

7.5 ml (12 mmol) of normal butyllithium (1.6 M hexane solution) were dropped to the resultant over 10 minutes.

After the resultant had been additionally stirred for 2 hours, a solution prepared by diluting 5.6 g (30 mmol) of triisopropyl borate with 20 ml of ether was dropped to the resultant over 10 minutes, and the whole was stirred at room temperature for 6 hours.

After that, the temperature of the resultant was cooled to 0° C., and dilute hydrochloric acid prepared by diluting 4 ml of concentrated hydrochloric acid with 100 ml of water was added to the resultant to make the resultant acidic.

Next, the resultant was sequentially washed with 70 ml of water and a saturated salt solution, and an organic layer was dried with anhydrous magnesium sulfate.

After the solution has been filtered, the solution was concentrated under reduced pressure, and the resultant viscous solid was dissolved into 20 ml of THF. Then, 70 ml of hexane were added to the solution, and the precipitated crystal was filtered under reduced pressure.

Furthermore, the filtrate was concentrated, and the resultant viscous substance was dissolved into THF. Then, hexane was added to the solution, and the whole was subjected to a similar operation. Thus, a total of 4.1 g (7.5 mmol, 75% yield) of Intermediate (IM-5) were obtained. A measurement of the FD-MS is shown below.

FD-MS: calcd for $C_{37}H_{29}BN_2O_2$=544, found, m/z=544 (100).

(5) Synthesis of Intermediate (IM-6)

5.0 g (18 mmol) of 1-bromo-3-iodobenzene, 5.2 g (18 mmol) of Intermediate (IM-1), 414 mg (0.36 mmol) of tetrakistriphenylphosphinepalladium (0) [Pd(PPh₃)₄], 100 ml of dimethoxyethane, and 58 g (54 mmol) of a 10-wt % aqueous solution of sodium carbonate were loaded into a 300-ml three-necked flask under an argon atmosphere, and the whole was stirred at 80° C. for 12 hours.

After the completion of the reaction, the temperature of the resultant was cooled to room temperature, and 100 ml of toluene were added to the resultant. An organic layer was sequentially washed with water and a saturated salt solution, dried with anhydrous magnesium sulfate, filtered, and concentrated under reduced pressure. Thus, a yellowish brown solid was obtained.

The resultant was purified with a silica gel column. Thus, 5.1 g (13 mmol, 72% yield) of Intermediate (IM-4) were obtained. A measurement of the FD-MS is shown below.

FD-MS: calcd for $C_{24}H_{16}BrN$=398, found, m/z=399 (100), 397 (93).

(6) Synthesis of Compound (B-3')

2.5 g (6.3 mmol) of Intermediate (IM-6) described above, 3.7 g (6.9 mmool) of Intermediate (IM-5), 145 mg (0.13 mmol) of tetrakistriphenylphosphinepalladium (0) [Pd(PPh₃)₄], 50 ml of dimethoxyethane, and an aqueous solution of sodium carbonate [prepared by dissolving 2 g (19 mmol) of sodium carbonate into 10 ml of water] were loaded into a 100-ml flask under an argon atmosphere at room temperature, and the whole was stirred at 78° C. for 15 hours.

After the completion of the reaction, the temperature of the resultant was cooled to room temperature, and the precipitated crystal was filtered out.

The resultant precipitated crystal was washed with water, methanol, and hexane. Thus, 3.7 g of a crystal were obtained.

Next, the resultant was recrystallized three times by using toluene. Thus, 2.8 g (3.5 mmol, 55% yield) of Compound (B-3') were obtained. A measurement of the FD-MS is shown below.

FD-MS: calcd for $C_{60}H_{39}N_3$=801, found, m/z=801 (100).

In addition, the result of HPLC (column: ODS-3V, mobile phase: acetonitrile/tetrahydrofuran=85/15, detection UV wavelength: 254 nm, temperature: 40° C.) analysis showed that the resultant had a purity of 99.5%.

Foregoing, it was confirmed that the resultant crystal was a target substance.

Synthesis Example 4

Synthesis of Compound (B-28')

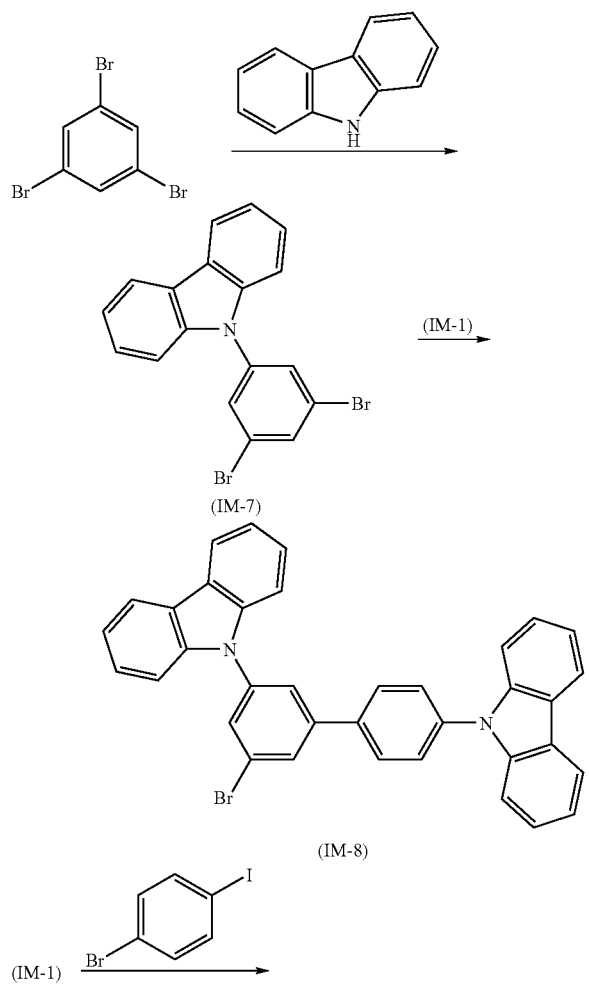

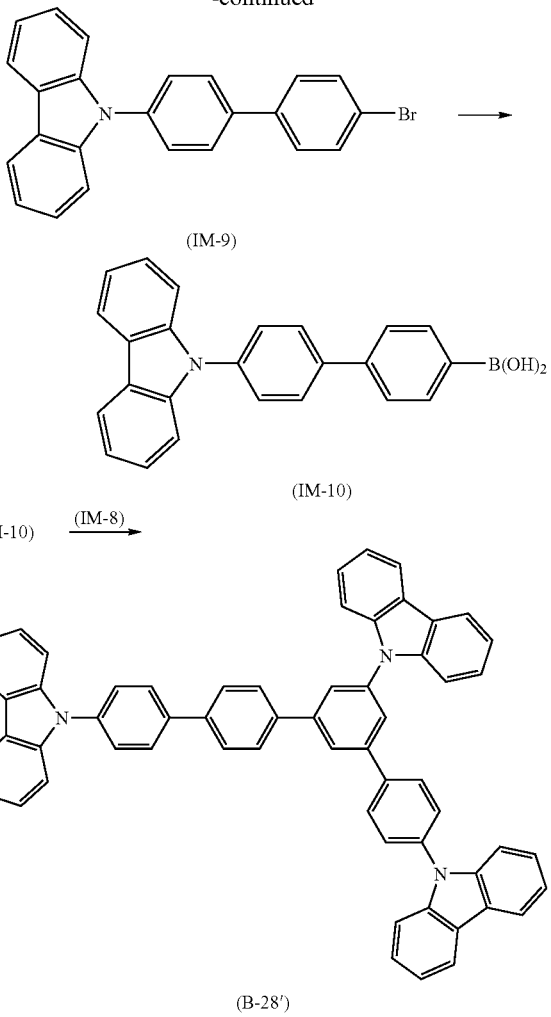

(1) Synthesis of Intermediate (IM-7)

30 g (94 mol) of 1,3,5-tribromobenzene, 8.8 g (60 mmol) of carbazole, 0.6 g (3 mmol) of copper iodide, 25.5 g (120 mol) of potassium phosphate, 3.4 g (30 mol) of trans-1,2-cyclohexanediamine, and 200 ml of 1,4-dioxane were loaded into a 500-ml three-necked flask under an argon atmosphere, and the whole was refluxed and heated for 16 hours while the resultant stirred at 105° C.

After that, the temperature of the resultant was cooled to room temperature, 150 ml of water were added to the resultant, and the whole was extracted with methylene chloride. After that, an organic layer was washed with water, dried with anhydrous magnesium sulfate, filtered out, and concentrated under reduced pressure until it was brought into a slurry state.

The resultant solid was filtered, and the filtrate was additionally concentrated under reduced pressure.

The residue was dissolved into toluene, and the whole was purified with a silica gel column. Thus, 17 g (42 mmol, 71% yield) of Intermediate (IM-7) were obtained. A measurement of the FD-MS is shown below.

FD-MS: calcd for $C_{18}H_{11}Br_2N$=401, found, m/z=401 (M$^+$, 100).

(2) Synthesis of Intermediate (IM-8)

5.0 g (12.5 mmol) of Intermediate (IM-7) described above, 3.9 g (13.7 mmol) of Intermediate (IM-1), 300 mg (0.25 mmol) of tetrakistriphenylphosphinepalladium (0), 60 ml of dimethoxyethane (DME), and an aqueous solution of sodium carbonate [prepared by dissolving 4.0 g (38 mmol) of sodium carbonate into 35 ml of water] were loaded into a 300-ml flask under a stream of argon, and the whole was stirred at 78° C. for 14 hours.

After that, the temperature of the resultant was cooled to room temperature. Then, the precipitated crystal was filtered out and washed with water, methanol, and hexane. Thus, 6.1 g of a coarse crystal were obtained.

Next, the resultant was purified with a silica gel column, and was then recrystallized by using toluene. Thus, 5.2 g (9.2 mmol, 74% yield) of Intermediate (IM-8) were obtained. A measurement of the FD-MS is shown below.

FD-MS: calcd for $C_{36}H_{23}BrN_2$=562, found, m/z=562 (M$^+$, 100).

(3) Synthesis of Intermediate (IM-9)

5.5 g (19 mmol) of 4-iodobrombenzene, 5.6 g (19 mmol) of Intermediate (IM-1), 450 mg (0.39 mmol) of tetrakistriphenylphosphinepalladium (0), 120 ml of dimethoxyethane (DME), and an aqueous solution of sodium carbonate prepared by dissolving 6.2 g (58 mmol) of sodium carbonate into 30 ml of water were loaded into a 300-ml flask in a stream of argon, and the whole was stirred at 78° C. for 16 hours.

After that, the temperature of the resultant was cooled to room temperature. Then, the precipitated crystal was filtered out and washed with water, methanol, and hexane. Thus, 6.8 g of a coarse crystal were obtained.

Next, the resultant was recrystallized by using toluene. Thus, 6.7 g (17 mmol, 89% yield) of Intermediate (IM-9) were obtained. A measurement of the FD-MS is shown below.

FD-MS: calcd for $C_{24}H_{16}BrN_2$=397, found, m/z=397 (M$^+$, 100).

(4) Synthesis of Intermediate (IM-10)

6.2 g (16 mmol) of Intermediate (IM-9) and 200 ml of dehydrated THF were loaded into a 500-ml flask under a stream of argon, and the temperature of the resultant was cooled to −70° C. Then, 12 ml of normal butyllithium (1.6 M hexane solution) were dropped to the resultant, and the whole was stirred at −65° C. for 1.5 hours.

After that, 8.7 g (46 mmol) of triisopropyl ether borate were dropped to the resultant. Then, the temperature of the resultant was gradually returned to room temperature, and the resultant was stirred for 8 hours.

The temperature of the flask was cooled to 0° C., 50 ml of concentrated hydrochloric acid and 125 mg of tetrabutyl ammonium bromide were added to the flask, and the whole was stirred at room temperature for an additional 5 hours.

The precipitated crystal was filtered, washed with water and hexane, and recrystallized with toluene. Thus, 3.4 g (9.4 mmol) of Intermediate (IM-10) were obtained.

(5) Synthesis of Compound (B-28')

3.2 g (8.8 mmol) of Intermediate (IM-10) described above, 4.9 g (8.8 mmol) of Intermediate (IM-8), 203 mg (0.18 mmol) of tetrakistriphenylphosphinepalladium (0), 80 ml of dimethoxyethane (DME), and an aqueous solution of sodium carbonate [prepared by dissolving 2.9 g (27 mmol) of sodium carbonate into 10 ml of water] were loaded into a 300-ml flask under a stream of argon, and the whole was stirred at 78° C. for 15 hours.

After that, the temperature of the resultant was cooled to room temperature, and the precipitated crystal was filtered out, the resultant precipitated crystal was washed with water, methanol, and hexane. Thus, 4.8 g of a coarse crystal were obtained.

Next, the resultant was recrystallized by using toluene. Thus, 2.5 g (3.1 mmol, 35% yield) of Compound (B-28') were obtained. A measurement of the FD-MS is shown below.

FD-MS: calcd for $C_{60}H_{39}N_3$=801, found, m/z=801 (100).

In addition, the result of HPLC (column: ODS-3V, mobile phase: acetonitrile/tetrahydrofuran=85/15, detection UV wavelength: 254 nm, temperature: 40° C.) analysis showed that the resultant had a purity of 99.3%.

Foregoing, it was confirmed that the resultant crystal was a target substance.

Synthesis Example 5

Synthesis of Compound (B-40')

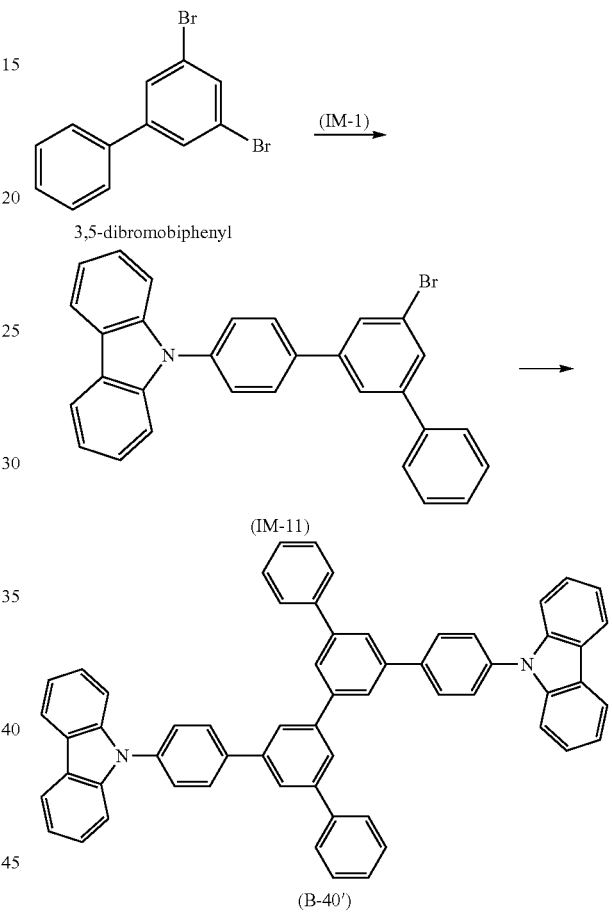

(1) Synthesis of Intermediate (IM-11)

3.5 g (11.2 mmol) of 3,5-dibromobiphenyl, 3.2 g (11.2 mmol) of Intermediate (IM-1), 260 mg (0.22 mmol) of tetrakistriphenylphosphinepalladium (0), 60 ml of dimethoxyethane (DME), and an aqueous solution of sodium carbonate [prepared by dissolving 3.6 g (34 mmol) of sodium carbonate into 40 ml of water] were loaded into a 200-ml flask under a stream of argon, and the whole was stirred at 78° C. for 15 hours.

After that, the temperature of the resultant was cooled to room temperature. Then, the precipitated crystal was filtered out and washed with ethyl acetate. After that, the resultant was dissolved into toluene, washed with water and a saturated salt solution. An organic layer was dried with anhydrous magnesium sulfate, and the solvent was distilled off. The remainder was purified with a silica gel column. Thus, 2.9 g (6.1 mmol, 54% yield) of a viscous substance (IM-11) were obtained. A measurement of the FD-MS is shown below.

FD-MS: calcd for $C_{30}H_{20}BrN$=475, found, m/z=475 (100).

(2) Synthesis of Compound (B-40')

2.4 g (5.0 mmol) of Intermediate (IM-11), 580 mg (0.37 mmol) of 2,2-bipyridyl, 1.1 g (10 mmol) of 1,5-cyclooctadiene, 1.0 g (0.37 mmol) of dicyclooctadienyl nickel, and 120 ml of dehydrated DMF were loaded into a 300-ml flask under a stream of argon, and the whole was stirred at 60° C. for 14 hours.

After the completion of the reaction, 120 ml of water was added to the resultant. Then, the precipitated crystal was filtered out, washed with water, methanol, and hexane, and recrystallized with toluene. Thus, 1.8 g (2.3 mmol, 46% yield) of Compound (B-40') were obtained. A measurement of the FD-MS is shown below.

FD-MS: calcd for $C_{60}H_{40}N_2$=788, found, m/z=788 (100)

In addition, the result of HPLC (column: ODS-3V, mobile phase: acetonitrile/tetrahydrofuran=85/15, detection UV wavelength: 254 nm, temperature: 40° C.) analysis showed that the resultant had a purity of 99.8%.

Foregoing, it was confirmed that the resultant crystal was a target substance.

Synthesis Example 6 [Synthesis of Compound (C-3')]

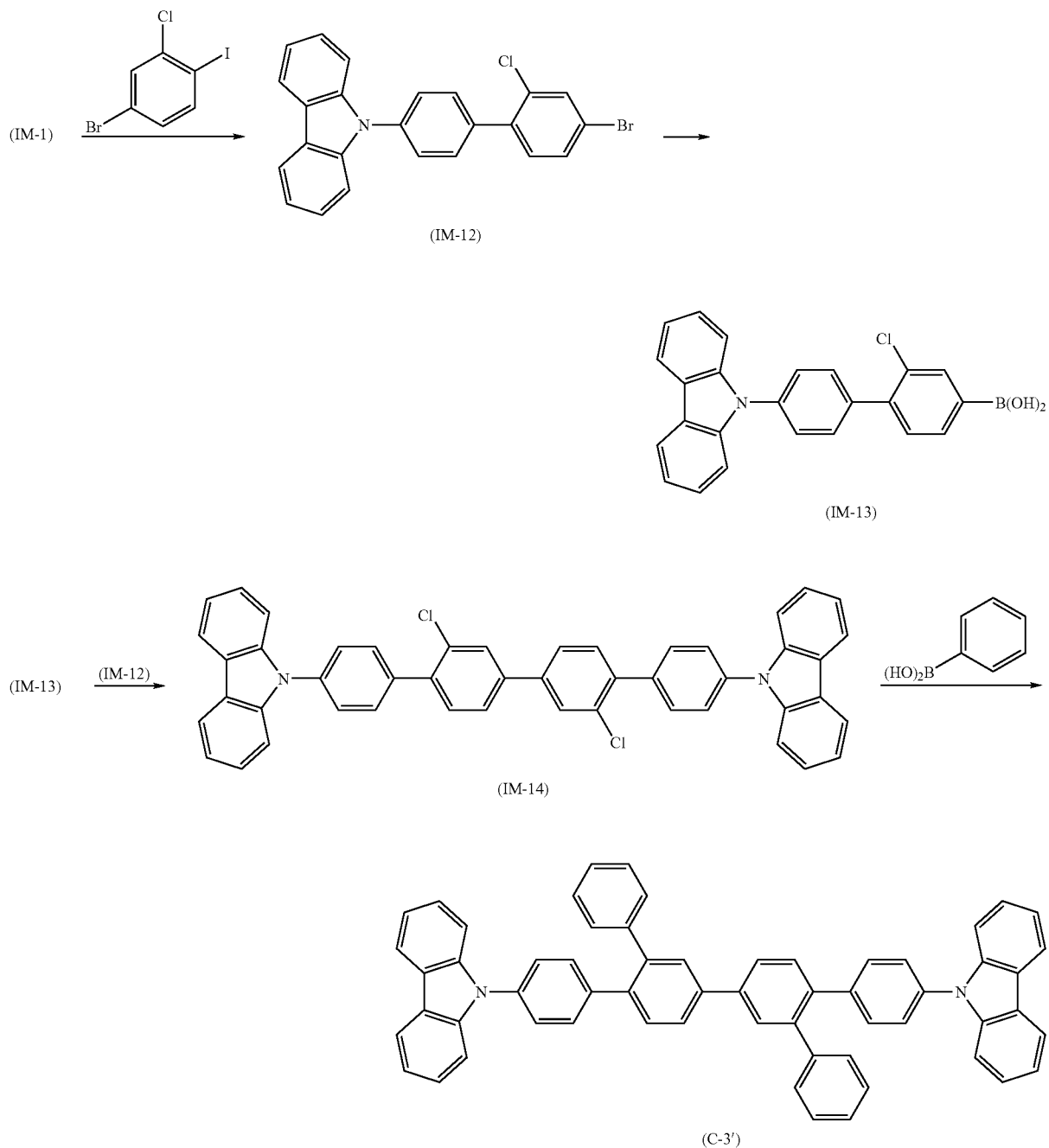

(1) Synthesis of Intermediate (IM-12)

19.4 g (61 mmol) of 3-chloro-4-iodobenzene, 17.6 g (61 mmol) of Intermediate (IM-1), 1.4 g (1.2 mmol) of tetrakistriphenylphosphinepalladium (0), 444 ml of dimethoxyethane (DME), and an aqueous solution of sodium carbonate [prepared by dissolving 19.4 g (183 mmol) of sodium carbonate into 92 ml of water] were loaded into a 1-L flask under a stream of argon at room temperature, and the whole was stirred at 78° C. for 15 hours.

After that, the temperature of the resultant was cooled to room temperature. Then, the precipitated crystal was filtered out, washed with water, methanol, and hexane, treated with activated carbon, and recrystallized from toluene. Thus, 12.2 g (28 mmol), 46% yield) of Intermediate (IM-12) were obtained. A measurement of the FD-MS is shown below.

FD-MS: calcd for $C_{24}H_{15}BrClN=431$, found, m/z=431 (100).

(2) Synthesis of Intermediate (IM-13)

6 g (14 mmol) of Intermediate (IM-12), 60 ml of dehydrated toluene, and 60 ml of dehydrated ether were loaded into a 300-ml flask under an argon atmosphere, and the temperature of the resultant was cooled to −40° C. Then, 9.4 ml (15 mmol) of normal butyllithium (1.6 M hexane solution) were dropped to the resultant over 10 minutes while the resultant was stirred.

After the resultant had been additionally stirred for 2 hours, a solution prepared by diluting 8 g (42 mmol) of triisopropyl borate with 20 ml of ether was dropped to the resultant over 10 minutes, and the whole was stirred at room temperature for 6 hours.

After that, the temperature of the resultant was cooled to 0° C., and hydrochloric acid prepared by diluting 45 ml of concentrated hydrochloric acid with 20 ml of water was added to the resultant, and the whole was stirred for an additional 4 hours.

The resultant was extracted with toluene, and a solution was sequentially washed with 70 ml of water and a saturated salt solution by using a separating funnel. Then, an organic layer was dried with anhydrous magnesium sulfate.

After the solution having been filtered, the solution was concentrated under reduced pressure, and the resultant viscous solid was dissolved into 20 ml of THF. Then, 70 ml of hexane were added to the solution, and the precipitated crystal was filtered under reduced pressure. Thus, 4.1 g (10 mmol), 71% yield) of Intermediate (IM-13) were obtained. A measurement of the FD-MS is shown below.

FD-MS: calcd for $C_{24}H_{17}BClNO_2=397$, found, m/z=397 (100).

(3) Synthesis of Intermediate (IM-14)

4.0 g (10 mmol) of Intermediate (IM-13), 4.3 g (10 mmol) of Intermediate (IM-12), 230 mg (0.2 mmol) of tetrakistriphenylphosphinepalladium (0), 120 ml of dimethoxyethane (DME), and an aqueous solution of sodium carbonate [prepared by dissolving 3.18 g (30 mmol) of sodium carbonate into 18 ml of water] were loaded into a 300-ml flask under an argon atmosphere, and the whole was stirred at 78° C. for 15 hours.

After that, the temperature of the resultant was cooled to room temperature. Then, the precipitated crystal was filtered out, washed with water, methanol, and hexane, and then recrystallized from toluene. Thus, 4.9 g (7.0 mmol), 70% yield) of Intermediate (IM-14) were obtained. A measurement of the FD-MS is shown below.

FD-MS: calcd for $C_{48}H_{30}BrCl_2N_2=704$, found, m/z=704 (100).

(4) Synthesis of Compound (C-3')

4.8 g (6.8 mmol) of Intermediate (IM-14), phenylboric acid (41 mmol), 650 mg (1.0 mmol) of $Ni(PPh_3)_2Cl_2$, 580 mg (2.0 mmol) of triphenylphosphine, 21.6 g (102 mmol) of $K_3PO_4 \cdot nH_2O$, and 100 ml of dehydrated toluene were loaded into a 300-ml flask under an argon atmosphere, and the whole was stirred at 100° C. for 24 hours.

The reaction liquid was filtered, the filtrate was subjected to a column, and the concentrate was recrystallized from ethylacetate and toluene. Thus, 2.2 g (2.8 mmol, 41% yield) of Compound (C-3') were obtained. A measurement of the FD-MS is shown below.

FD-MS: calcd for $C_{60}H_{40}N_2=788$, found, m/z=788 (100).

In addition, the result of HPLC (column: ODS-3V, mobile phase: acetonitrile/tetrahydrofuran=85/15, detection UV wavelength: 254 nm, temperature: 40° C.) analysis showed that the resultant had a purity of 99.5%.

Foregoing, it was confirmed that the resultant crystal was a target substance.

Example 1

A glass substrate equipped with an ITO transparent electrode measuring 25 mm wide by 75 mm long by 0.7 mm thick was subjected to ultrasonic cleaning in isopropyl alcohol for 5 minutes. After that, the substrate was subjected to UV ozone cleaning for 30 minutes.

The glass substrate equipped with the transparent electrode after the washing was mounted on a substrate holder of a vacuum deposition device. First, a copper phthalocyanine film (hereinafter abbreviated as the "CuPc film") having a thickness of 10 nm was formed on the surface where the transparent electrode was formed in such a manner that the film would cover the transparent electrode. The CuPc film functions as a hole-injecting layer. After the formation of the CuPc film, a 4,4'-bis[N-(1-naphthyl)-N-phenylamino]biphenyl film (hereinafter abbreviated as the "α-NPD film") having a thickness of 30 nm was subsequently formed on the film. The α-NPD film functions as a hole-transporting layer. Furthermore, Compound (A-7') described above having a thickness of 30 nm was deposited as a host material from the vapor onto the α-NPD film, whereby a light-emitting layer was formed. At the same time, tris(2-phenylpyridine)Ir (hereinafter abbreviated as "Ir(ppy)$_3$") was added as a phosphorescent Ir metal complex dopant.

The concentration of Ir(ppy)$_3$ in the light-emitting layer was 5 wt %.

The film functions as a light-emitting layer.

(1,1'-bisphenyl)-4-olato)bis(2-methyl-8-quinolinolato) aluminum (hereinafter abbreviated as the "BAlq film") having a thickness of 10 nm was formed on the film.

The BAlq film functions as a hole-blocking layer.

Furthermore, an aluminum complex of 8-hydroxyquinoline (hereinafter abbreviated as the "Alq film") having a thickness of 40 nm was formed on the film.

The Alq film functions as an electron-injecting layer.

After that, LiF as a halogenated alkali metal was deposited from the vapor to have a thickness of 0.2 nm, and then aluminum was deposited from the vapor to have a thickness of 150 nm.

The Al/LiF functions as a cathode.

Thus, an organic EL device was fabricated.

The device was subjected to a test feeding an electric current. As a result, green light having a luminance of 101 cd/m$^2$ was emitted at a voltage of 5.8 V and a current density of 0.23 mA/cm$^2$. Chromaticity coordinates were (0.29, 0.64), and a current efficiency of light emission was 43.2 cd/A.

In addition, the device was driven at a constant electric current and at an initial luminance of 5,000 cd/m². The time required for the initial luminance to reduce in half to a luminance of 2,500 cd/m² (half lifetime) was 1,126 hours.

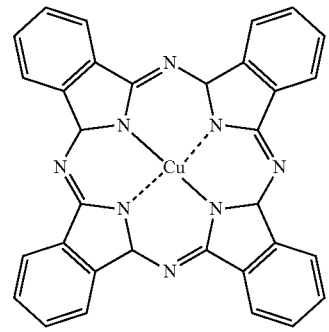

CuPc

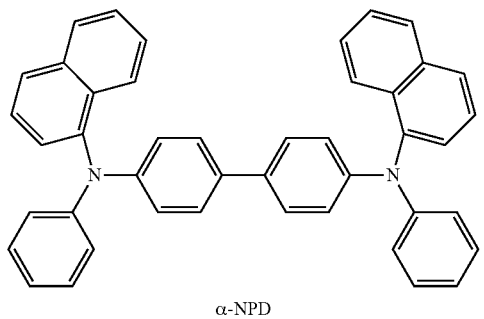

α-NPD

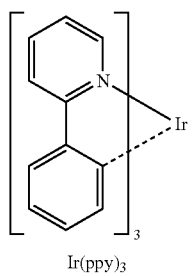

Ir(ppy)₃

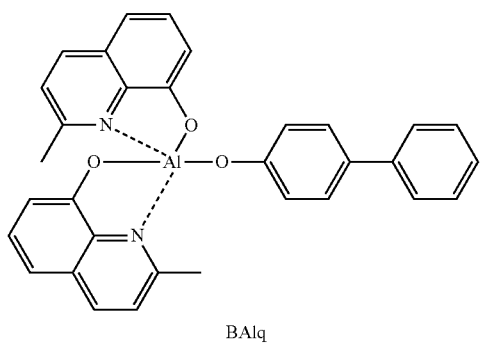

BAlq

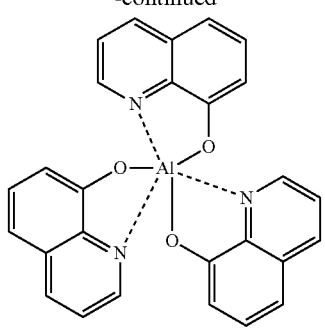

Alq

Examples 2 to 6

Organic EL devices were each fabricated in the same manner as in Example 1 except that any one of the compounds described in Table 1 was used instead of Compound (A-7') as a host material for a light-emitting layer.

A voltage, a current density, a luminance, a current efficiency of light emission, chromaticity, and a half lifetime were each measured in the same manner as in Example 1. Table 1 shows the results.

Comparative Example 1

An organic EL device was fabricated in the same manner as in Example 1 except that a known compound (CBP) described below was used instead of Compound (A-7') as a host material for a light-emitting layer.

A voltage, a current density, a luminance, a current efficiency of light emission, chromaticity, and a half lifetime were each measured in the same manner as in Example 1. Table 1 shows the results.

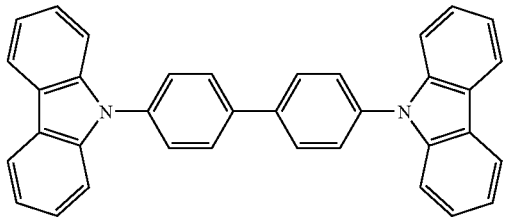

Compound (CBP)

Comparative Example 2

An organic EL device was fabricated in the same manner as in Example 1 except that a known compound (CTP) shown below was used instead of Compound (A-7') as a host material for a light-emitting layer.

A voltage, a current density, a luminance, a current efficiency of light emission, chromaticity, and a half lifetime were each measured in the same manner as in Example 1. Table 1 shows the results.

TABLE 1

Compound (CTP)

[Structure of Compound CTP]

| | Host material of light-emitting layer | Voltage (V) | Current density (mA/cm²) | Luminance (cd/m²) | Current efficiency (cd/A) | Chromaticity coordinate (x, y) | Half lifetime (hours) |
|---|---|---|---|---|---|---|---|
| Example 1 | A-7' | 5.8 | 0.23 | 101 | 43.2 | (0.29, 0.64) | 1126 |
| Example 2 | A-16' | 5.6 | 0.25 | 99 | 39.7 | (0.32, 0.61) | 657 |
| Example 3 | B-3' | 5.5 | 0.23 | 104 | 46.3 | (0.32, 0.61) | 1073 |
| Example 4 | B-28' | 5.4 | 0.24 | 105 | 43.5 | (0.29, 0.64) | 912 |
| Example 5 | B-40' | 5.5 | 0.23 | 101 | 44.7 | (0.30, 0.64) | 1086 |
| Example 6 | C-3' | 5.8 | 0.26 | 100 | 38.9 | (0.31, 0.61) | 719 |
| Comparative example 1 | CBT | 5.4 | 0.31 | 101 | 32.6 | (0.32, 0.61) | 305 |
| Comparative example 2 | CTP | 6.1 | 0.78 | 104 | 13.4 | (0.33, 0.61) | 62 |

The results of Table 1 revealed that an organic EL device using the material for an organic EL device of the present invention was able to emit green light having a high current efficiency and a long lifetime.

Example 7

A glass substrate equipped with an ITO transparent electrode measuring 25 mm wide by 75 mm long by 0.7 mm thick was subjected to ultrasonic cleaning in isopropyl alcohol for 5 minutes. After that, the substrate was subjected to UV ozone cleaning for 30 minutes.

The glass substrate equipped with the transparent electrode after the washing was mounted on a substrate holder of a vacuum deposition device. First, the CuPc film having a thickness of 10 nm was formed on the surface where the transparent electrode was formed in such a manner that the film would cover the transparent electrode. The CuPc film functions as a hole-injecting layer. After the formation of the CuPc film, a 1,1'-bis[4-N,N-di(paratolyl)aminophenyl]cyclohexane film (hereinafter abbreviated as the "TPAC") having a thickness of 30 nm was formed on the film subsequently. The TPAC film functions as a hole-transporting layer. Furthermore, Compound (B-3') having a thickness of 30 nm was deposited from the vapor onto the TPAC film, whereby a light-emitting layer was formed. At the same time, bis[(4,6-difluorophenyl)-pyridinate Ir (hereinafter abbreviated as "FIrpic") was added as a phosphorescent Ir metal complex dopant.

The concentration of FIrpic in the light-emitting layer was 7 wt %.

The film functions as a light-emitting layer.

The Alq film described above having a thickness of 30 nm was formed on the film.

The Alq film functions as an electron-injecting layer.

After that, LiF as a halogenated alkali metal was deposited from the vapor to have a thickness of 0.2 nm, and then aluminum was deposited from the vapor to have a thickness of 150 nm.

The Al/LiF functions as a cathode.

Thus, an organic EL device was fabricated.

The device was subjected to a test feeding an electric current. As a result, blue light having a luminance of 101 cd/m² was emitted at a voltage of 7.8 V and a current density of 0.47 mA/cm². Chromaticity coordinates were (0.29, 0.64), and a current efficiency of light emission was 21.6 cd/A.

In addition, the device was driven at a constant electric current and an initial luminance of 500 cd/m². The time required for the initial luminance to reduce in half to a luminance of 250 cd/m² (half lifetime) was 71 hours.

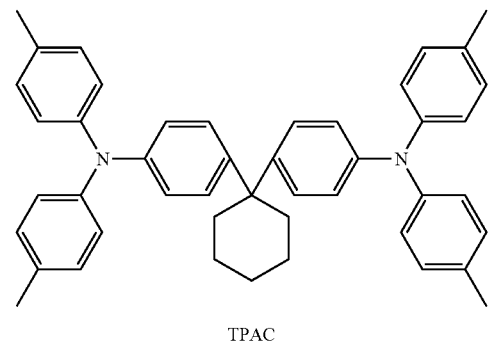

TPAC

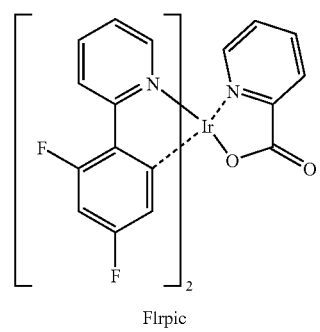

FIrpic

Example 8

In Example 1, an organic EL device was fabricated in the same manner as in Example 1 except that Compound (B-40) was used instead of Compound (B-3') in a light-emitting layer.

A voltage, a current density, a luminance, a current efficiency of light emission, chromaticity, and a half lifetime were each measured in the same manner as in Example 1. Table 2 shows the results

Comparative Example 3

An organic EL device was fabricated in the same manner as in Example 1 except that a known compound (CBP) described above was used instead of Compound (A-7') as a host material for a light-emitting layer.

A voltage, a current density, a luminance, a current efficiency of light emission, chromaticity, and a half lifetime were each measured in the same manner as in Example 1. Table 2 shows the results.

Comparative Example 4

An organic EL device was fabricated in the same manner as in Example 1 except that a known compound (CBP) shown below was used instead of Compound (A-7') as a host material for a light-emitting layer.

voltage, a current density, a luminance, a current efficiency of light emission, chromaticity, and a half lifetime were each measured in the same manner as in Example 1. Table 2 shows the results.

Compound (CBP)

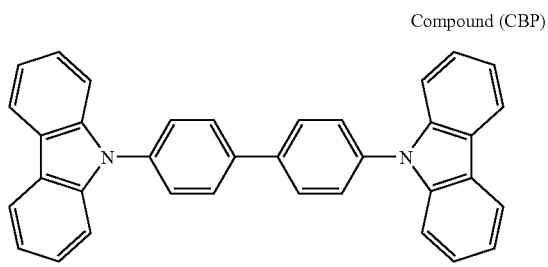

Comparative Example 5

An organic EL device was fabricated in the same manner as in Example 1 except that a known compound (CTP) described above was used instead of Compound (A-7') as a host material for a light-emitting layer.

A voltage, a current density, a luminance, a current efficiency of light emission, chromaticity, and a half lifetime were each measured in the same manner as in Example 1. Table 2 shows the results.

TABLE 2

| | Host material of light-emitting layer | Voltage (V) | Current density (mA/cm$^2$) | Luminance (cd/m$^2$) | Current efficiency (cd/A) | Chromaticity coordinate (x, y) | Half lifetime (hours) |
|---|---|---|---|---|---|---|---|
| Example 7 | B-3' | 7.8 | 0.47 | 101 | 21.6 | (0.17, 0.37) | 71 |
| Example 8 | B-40' | 7.5 | 0.44 | 103 | 23.6 | (0.16, 0.37) | 63 |
| Comparative example 3 | CPB | 7.8 | 1.70 | 98 | 5.8 | (0.16, 0.37) | 19 |
| Comparative example 4 | CzTT | 8.3 | 0.86 | 101 | 11.8 | (0.16, 0.37) | 9 |
| Comparative example 5 | CTP | 12.4 | 10.9 | 87 | 0.8 | (0.16, 0.37) | 2 |

The results of Table 2 revealed that an organic EL device using the material for an organic EL device of the present invention was able to emit blue light having a high current efficiency of light emission and a long lifetime.

The invention claimed is:

1. A material comprising a compound represented by the following general formula (1):

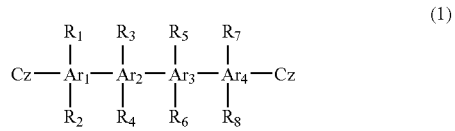

wherein

Ar$_1$ to Ar$_4$ each represent a p-phenylene or m-phenylene;

R$_1$ to R$_8$ each independently represent a hydrogen atom, a phenyl group, or a group represented by Cz below;

Cz represents a group expressed by the following general formula (2a):

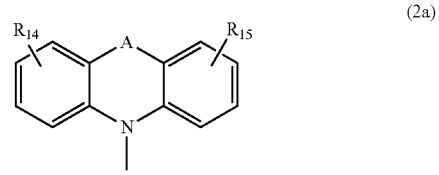

wherein

A represents a single bond and

R$_{14}$ to R$_{15}$ each independently represent a hydrogen atom, a substituted or unsubstituted alkyl group having 1 to 40 carbon atoms, a substituted or unsubstituted heterocyclic group having 3 to 40 ring atoms, a substituted or unsubstituted alkoxy group having 1 to 40 carbon atoms, a substituted or unsubstituted aromatic hydrocarbon group having 6 to 40 ring carbon atoms, a substituted or unsubstituted aryloxy group having 6 to 40 carbon atoms, a substituted or unsubstituted aralkyl group having 7 to 40 carbon atoms, a substituted or unsubstituted alkenyl group having 2 to 40 carbon atoms, a substituted or unsubstituted alkylamino group having 1 to 40 carbon atoms, a substituted or unsubstituted arylamino group having 6 to 40 carbon atoms, or a substituted or unsubstituted aralkylamino group having 7 to 40 carbon atoms;

provided that, when all of $Ar_1$ to $Ar_4$ each represent p-phenylene in the general formula (1), at least one of $R_1$ to $R_8$ represents a substituted or unsubstituted aromatic hydrocarbon group having 6 to 40 ring carbon atoms, or the above group represented by Cz.

2. The material of claim 1, wherein $Ar_2$ and $Ar_3$ each represent m-phenylene, and $Ar_1$ and $Ar_4$ each represent p-phenylene in the general formula (1).

3. The material of claim 1, wherein $Ar_1$ and $Ar_4$ each represent m-phenylene, and $Ar_2$ and $Ar_3$ each represent p-phenylene in the general formula (1).

4. The material of claim 1, wherein at least one of $Ar_1$ to $Ar_4$ each represents m-phenylene.

5. The material of claim 1, wherein $R_{14}$ and $R_{15}$ each represent a hydrogen atom.

6. The material of claim 1, wherein $Ar_1$ and $Ar_4$ each represent m-phenylene, and $R_1$ or $R_7$ represents a phenyl group, or the group represented by Cz in the general formula (1).

7. The material according to claim 1 or 6, wherein the group represented by Cz in the general formula (1) comprises a substituted carbazolyl group.

8. The material of claim 1 or 6, wherein the material comprising the compound represented by the general formula (1) is a host material for an organic electroluminescence device.

9. An organic EL device comprising an organic thin film layer comprising one or more sub-layers comprising at least a light-emitting sub-layer being sandwiched between a cathode and an anode, wherein at least one sub-layer of the organic thin film layer comprises the material according to any one of claim 1 or 6.

10. The organic electroluminescence device of claim 9, wherein a reducing dopant is added to an interfacial region between the cathode and the organic thin film layer.

11. The organic electroluminescence device according to claim 9, further comprising an electron-injecting sub-layer between the light-emitting sub-layer and the cathode, wherein the electron-injecting sub-layer has a nitrogen atom comprising derivative as an essential component.

12. The organic electroluminescence device of claim 9, wherein the light-emitting sub-layer comprises the material as a host material.

13. The organic electroluminescence device of claim 12, wherein the light-emitting sub-layer comprises one or more host material(s) and one or more phosphorescent metal complex(es).

* * * * *